United States Patent
Yoshida

(10) Patent No.: US 12,551,935 B2
(45) Date of Patent: Feb. 17, 2026

(54) SUBSTRATE PROCESSING METHOD, SUBSTRATE PROCESSING APPARATUS, AND PROCESSING LIQUID

(71) Applicant: SCREEN Holdings Co., Ltd., Kyoto (JP)

(72) Inventor: Yukifumi Yoshida, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 488 days.

(21) Appl. No.: 18/006,580

(22) PCT Filed: Jun. 29, 2021

(86) PCT No.: PCT/JP2021/024588
§ 371 (c)(1),
(2) Date: Jan. 24, 2023

(87) PCT Pub. No.: WO2022/024638
PCT Pub. Date: Feb. 3, 2022

(65) Prior Publication Data
US 2023/0271230 A1    Aug. 31, 2023

(30) Foreign Application Priority Data
Jul. 27, 2020 (JP) .................. 2020-126875

(51) Int. Cl.
*B08B 7/00* (2006.01)
(52) U.S. Cl.
CPC ................. *B08B 7/0014* (2013.01)
(58) Field of Classification Search
CPC .... B08B 7/0014; H01L 21/304; H01L 21/306
See application file for complete search history.

(56) References Cited

U.S. PATENT DOCUMENTS 3,773,544 A * 11/1973 Newton ............... B05D 7/16
428/629
5,876,497 A    3/1999 Atoji .................... 117/85
(Continued)

FOREIGN PATENT DOCUMENTS

JP    2004-273940 A    9/2004
JP    2007-059876 A    3/2007
(Continued)

OTHER PUBLICATIONS

Morita et al., JP-2015165526-A, Machine Translation. (Year: 2025).*
(Continued)

*Primary Examiner* — Duy Vu N Deo
*Assistant Examiner* — Christopher Remavege
(74) *Attorney, Agent, or Firm* — OSTROLENK FABER LLP

(57) ABSTRACT

A substrate processing method includes a processing film forming step in which a processing liquid is supplied to a front surface of a substrate and the processing liquid on the front surface of the substrate is solidified or cured to form a processing film on the front surface of the substrate, an etching facilitating step in which the processing film is subjected to etching function developing processing, thereby facilitating etching at a surface layer portion of the substrate by the processing film, and an etching reducing step in which the processing film is subjected to etching function eliminating processing, thereby reducing the etching at the surface layer portion of the substrate by the processing film in a state that the processing film is kept on the substrate.

15 Claims, 25 Drawing Sheets

(56) References Cited

U.S. PATENT DOCUMENTS

| | | | | |
|---|---|---|---|---|
| 9,953,826 | B2* | 4/2018 | Kaneko | H01L 21/02052 |
| 10,043,652 | B2* | 8/2018 | Kaneko | H01L 21/67051 |
| 10,139,732 | B2* | 11/2018 | Kawakami | G03F 7/11 |
| 10,734,255 | B2* | 8/2020 | Sekiguchi | H01L 21/67028 |
| 2007/0048911 | A1 | 3/2007 | Oh et al. | |
| 2009/0093107 | A1 | 4/2009 | Lee et al. | 438/584 |
| 2011/0111599 | A1 | 5/2011 | Lennon et al. | 438/703 |
| 2012/0260949 | A1 | 10/2012 | Sekiguchi et al. | 134/22.19 |
| 2013/0092657 | A1 | 4/2013 | Gillies et al. | |
| 2014/0060573 | A1* | 3/2014 | Yoshida | H01L 21/67051 134/105 |

FOREIGN PATENT DOCUMENTS

| | | | |
|---|---|---|---|
| JP | 2013-008897 A | 1/2013 | |
| JP | 2013-534944 A | 9/2013 | |
| JP | 2015165526 A * | 9/2015 | H10F 77/703 |
| JP | 2022-023730 A | 2/2022 | |
| KR | 10-0225699 B1 | 10/1999 | |
| KR | 10-2009-0061354 A | 6/2009 | |
| TW | 200947555 A1 | 11/2009 | |
| TW | 201547040 A | 12/2015 | |

OTHER PUBLICATIONS

International Search Report mailed Sep. 7, 2021 in corresponding PCT International Application No. PCT/JP2021/024588.

International Preliminary Report on Patentability (Chapter I) mailed Feb. 9, 2023 with a Notification from the International Bureau (Form PCT/IB/326) in corresponding PCT International Application No. PCT/JP2021/024588 in Japanese.

English translation of the International Preliminary Report on Patentability (Chapter I) mailed Feb. 9, 2023 with a Notification from the International Bureau (Form PCT/IB/338) in corresponding PCT International Application No. PCT/JP2021/024588 in English.

* cited by examiner

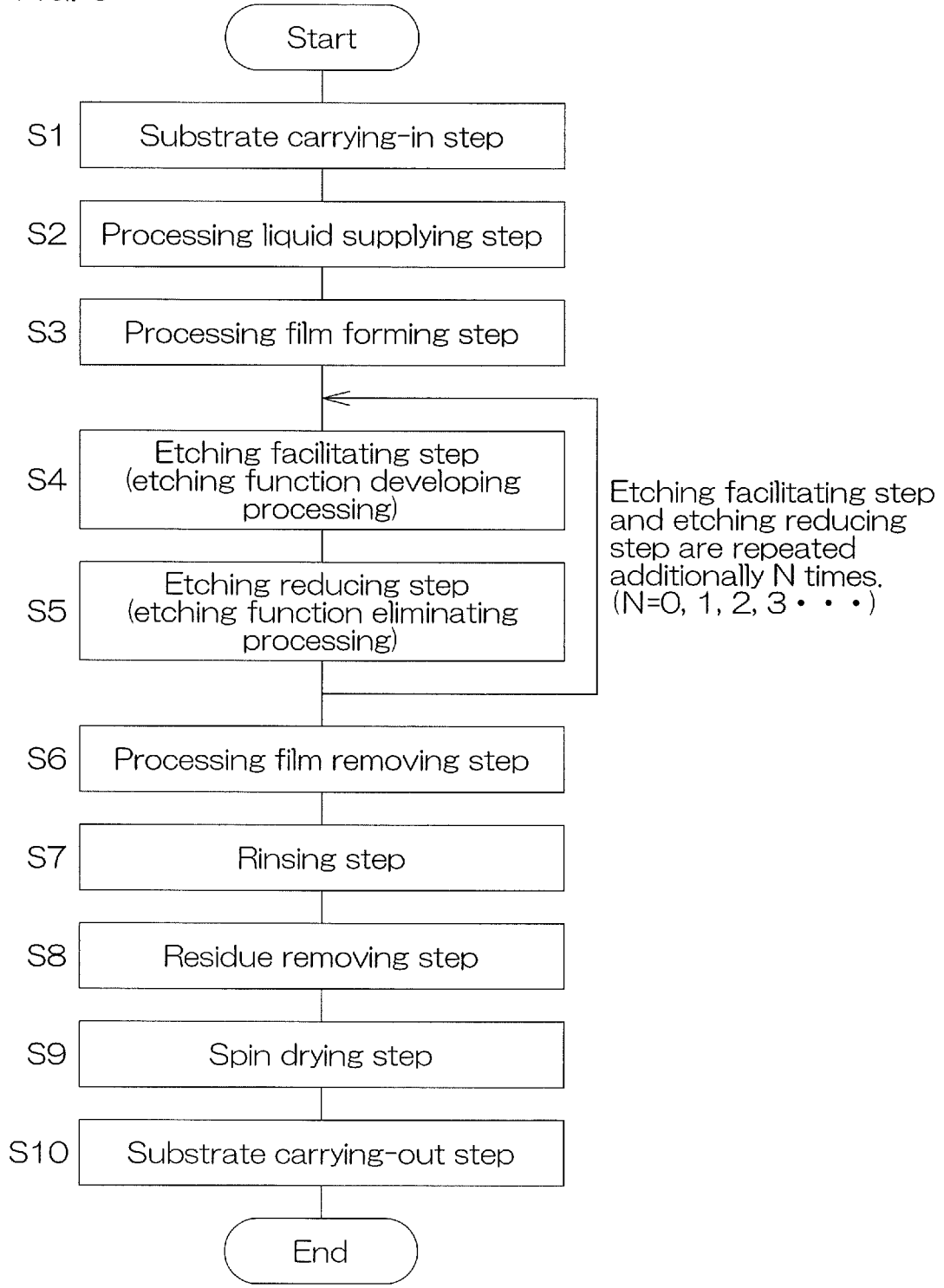

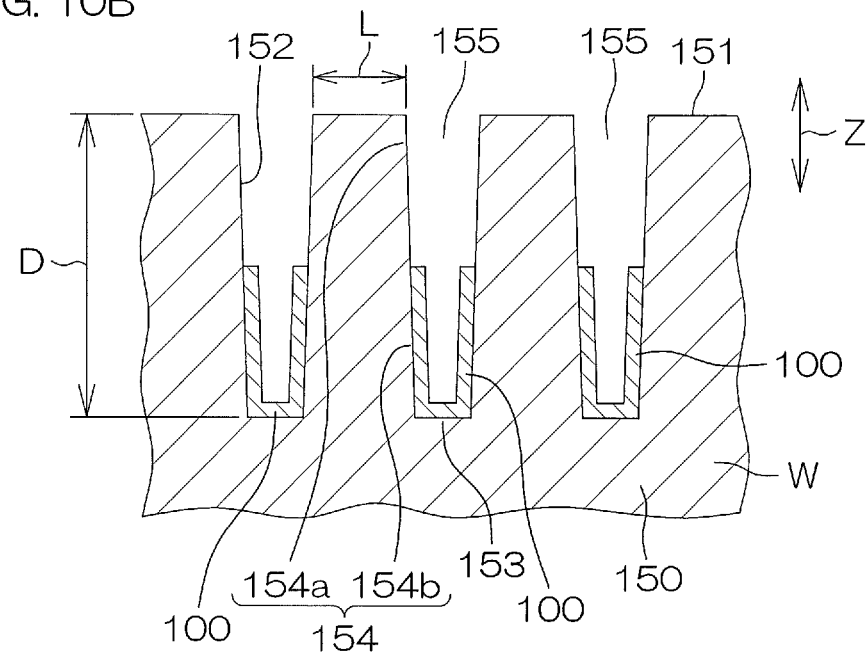
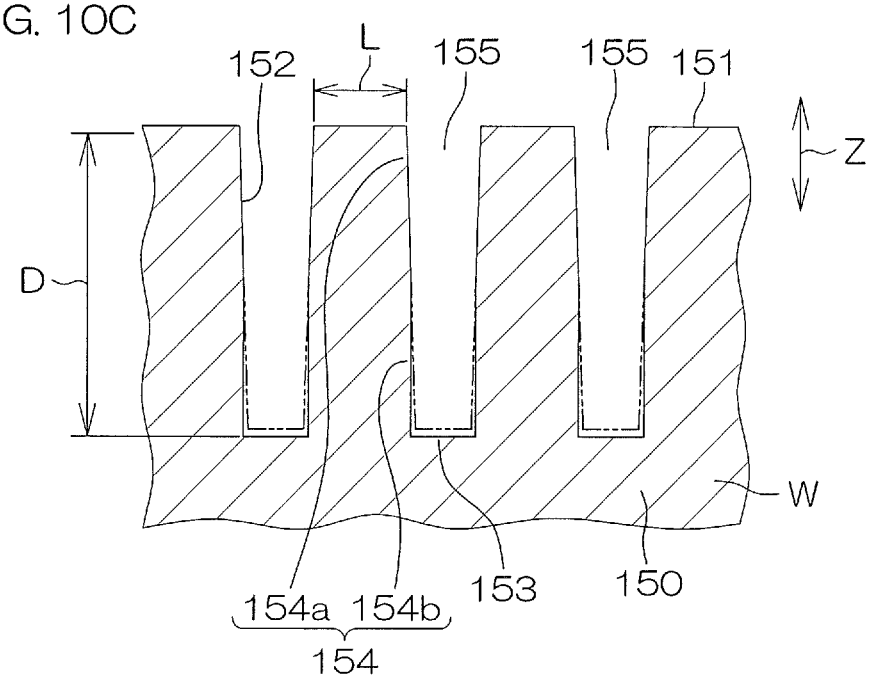

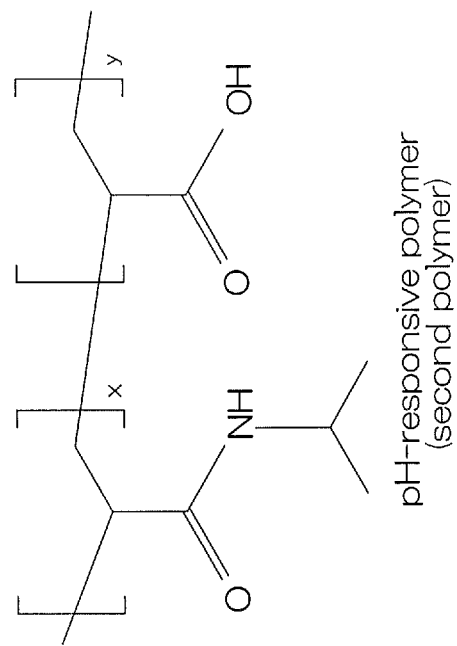
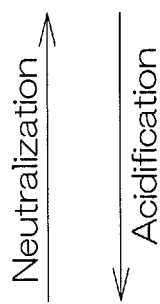
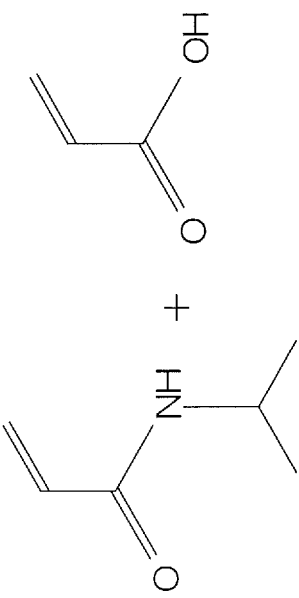
FIG. 15

SUBSTRATE PROCESSING METHOD, SUBSTRATE PROCESSING APPARATUS, AND PROCESSING LIQUID

CROSS-REFERENCE TO RELATED APPLICATIONS

The present application is a 35 U.S.C. §§ 371 national stage application of International Application No. PCT/JP2021/024588 filed Jun. 29, 2021, which claims priority to Japanese Patent Application No. 2020-126875, filed Jul. 27, 2020, the contents of which are incorporated herein by reference.

TECHNICAL FIELD

The present invention relates to a substrate processing method, a substrate processing apparatus, and a processing liquid which is used in these. Examples of substrates to be processed include substrates such as semiconductor wafers, substrates for optical disks, substrates for magnetic disks, substrates for magneto-optical disks, substrates for photomasks, ceramic substrates, substrates for solar cells, and substrates for FPDs (flat panel displays) such as liquid crystal display devices, plasma display panels, and organic EL (electroluminescence) display devices, etc.

BACKGROUND ART

Hydrofluoric acid is used as an etching liquid for etching a front surface of a substrate (refer to Patent Literature 1 mentioned below). After the substrate is processed by the etching liquid, the front surface of the substrate is rinsed with a rinse liquid such as DIW.

PATENT LITERATURE

Patent Literature 1: United States Patent Application Publication No. 2012/260949

SUMMARY OF INVENTION

Technical Problem

In the substrate processing described in Patent Literature 1, etching of the substrate depends on the progress of a liquid flow. In detail, etching is started by starting supply of the etching liquid to the substrate, and the etching liquid is removed from the substrate by the rinse liquid, by which the etching is stopped. Therefore, even after start of the supply of the rinse liquid, the etching is not stopped until the etching liquid is removed from the substrate. Therefore, the timing in which the etching stops is not clear, which may result in a failure in accurate etching at a surface layer portion of the substrate.

Thus, an object of the present invention is to provide a substrate processing method, a substrate processing apparatus, and a processing liquid which are capable of improving controllability of etching at a surface layer portion of a substrate.

Solution to Problem

A preferred embodiment of the present invention provides a substrate processing method including a processing film forming step in which a processing liquid is supplied to a front surface of a substrate and the processing liquid on the front surface of the substrate is solidified or cured, thereby forming a processing film on the front surface of the substrate, an etching facilitating step in which the processing film is subjected to etching function developing processing to facilitate etching at a surface layer portion of the substrate by the processing film, and an etching reducing step in which the processing film is subjected to etching function eliminating processing to reduce the etching at the surface layer portion of the substrate by the processing film in a state that the processing film is kept on the substrate.

According to this method, the etching at the surface layer portion of the substrate by the processing film is not started at the time of formation of the processing film, but is facilitated in response to the etching function developing processing applied to the processing film. Then, it is not necessary that the processing film is removed to reduce the etching, and in response to the etching function eliminating processing applied to the processing film in a state that the processing film is kept on the substrate, etching is reduced. Thereby, according to the processing applied to the processing film, it is possible to switch between a state in which the etching is facilitated and that in which the etching is reduced. It is, therefore, possible to easily control the timing of facilitating the etching and the timing of reducing the etching. Consequently, it is possible to improve controllability of the etching at the surface layer portion of the substrate.

To facilitate the etching means both that the etching is started from a state in which the etching is completely stopped and that in which the etching has already started is increased in speed. Similarly, to reduce the etching means both that in which the etching is in progress is completely stopped and that in which the etching in progress is decreased in speed.

In a preferred embodiment of the present invention, the etching function developing processing includes heating strengthening processing of strengthening heating applied to the processing film. The etching function eliminating processing includes heating weakening processing of weakening the heating applied to the processing film.

According to this method, etching is facilitated by strengthening the heating of the processing film. On the other hand, etching is reduced by weakening the heating applied to the processing film. Since the facilitation and reduction of etching are in response to active processing that changes the strength of the heating, it is easy to control the timing of facilitating the etching and the timing of reducing the etching. Consequently, it is possible to improve controllability of the etching at the surface layer portion of the substrate.

In a preferred embodiment of the present invention, the etching function developing processing includes pH-adjusting processing in which a pH-adjusting liquid is supplied to the processing film on the substrate, thereby adjusting the pH in the processing film so as to be acidic or basic. Then, the etching function eliminating processing includes neutralization processing in which a neutralizing liquid is supplied to the processing film on the substrate, thereby bringing the pH in the processing film closer to neutral than the pH in the processing film after the pH-adjusting processing.

According to this method, the pH-adjusting liquid is supplied to the processing film, thereby adjusting the pH in a liquid component contained in the processing film so as to be acidic or basic to facilitate the etching. On the other hand, the neutralizing liquid is supplied to the processing film, bringing the pH in the liquid component contained in the processing film close to neutral to reduce the etching. Since the etching facilitation and reduction are in response to active processing of changing the pH, it is easy to control the timing of facilitating the etching and the timing of reducing the etching. Consequently, it is possible to improve controllability of the etching at the surface layer portion of the substrate.

In a preferred embodiment of the present invention, in the processing film forming step, the processing film is formed which contains a function developing component to develop an etching function by the etching function developing processing. Therefore, etching is made at the surface layer portion of the substrate by the processing film having the function developing component in an adjusted amount thereof, which makes it possible to control the amount of etching at the surface layer portion of the substrate.

In a preferred embodiment of the present invention, the function developing component is a polymer which releases protons in the processing film by the etching function developing processing and receives protons from the processing film by the etching function eliminating processing. The etching facilitating step includes a step in which the protons are released from the polymer by the etching function developing processing, thereby facilitating etching at the surface layer portion of the substrate. Then, the etching reducing step includes a step in which the protons are imparted to the polymer by the etching function eliminating processing, thereby reducing the etching at the surface layer portion of the substrate.

The etching at the surface layer portion of the substrate is facilitated by the protons released by the polymer, and the etching at the surface layer portion of the substrate is reduced by the protons received by the polymer.

Therefore, where there is provided such an arrangement that a polymer releases protons by the etching function developing processing and also the polymer receives the protons by the etching function eliminating processing, it is possible to control the facilitation and reduction of the etching of the surface layer portion of the substrate by changing the processing applied to the processing film. Examples of the above-described polymer include a copolymer of N-isopropylacrylamide, N,N'-methylenebisacrylamide, and acrylic acid.

In a preferred embodiment of the present invention, the function developing component is a polymer which has plural types of constituent units and contains an organic acid as one type of the constituent unit. The etching facilitating step includes a step in which the polymer is decomposed by the etching function developing processing to form plural types of monomers including an organic acid of a monomer, thereby facilitating etching at the surface layer portion of the substrate. Then, the etching reducing step includes a step in which the plural types of monomers in the processing film are polymerized by the etching function eliminating processing to form the polymer, thereby reducing the etching at the surface layer portion of the substrate.

Since an organic acid of a monomer is higher in acidity than an organic acid as a constituent unit of a polymer, etching can be made at the surface layer portion of the substrate. Therefore, where there is provided such an arrangement that a polymer is decomposed by the etching function developing processing to form plural types of monomers and also the plural types of monomers in the processing film are polymerized by the etching function eliminating processing to form the polymer, it is possible to control the facilitation and reduction of the etching of the surface layer portion of the substrate by changing the processing applied to the processing film. Examples of the above-described polymer include a copolymer of N-isopropylacrylamide and acrylic acid that has acrylic acid as an organic acid.

In a preferred embodiment of the present invention, etching processing in which the etching facilitating step and the etching reducing step are given as one cycle is executed in a plural number of cycles. Therefore, it is possible to accurately control the etching amount at the surface layer portion of the substrate by the number of cycles of the etching processing that is executed.

In a preferred embodiment of the present invention, the substrate processing method further includes a processing film removing step in which a removing liquid is supplied to the front surface of the processing film, thereby removing the processing film from the front surface of the substrate. The processing film is removed by the removing liquid, which makes it possible to clean the front surface of the substrate.

In a preferred embodiment of the present invention, the processing film removing step includes a dissolution removing step in which the processing film is dissolved in the removing liquid, thereby removing the processing film from the front surface of the substrate. According to this method, it is possible to quickly remove the processing film from the front surface of the substrate by dissolving the processing film in the removing liquid.

In a preferred embodiment of the present invention, the processing film removing step includes a peeling/removing step in which the processing film is peeled from the front surface of the substrate by the removing liquid, thereby removing the processing film from the front surface of the substrate.

According to this method, the processing film is not removed from the front surface of the substrate by being dissolved in the peeling liquid but peeled from the front surface of the substrate and removed. Therefore, where objects to be removed such as particles adhere to the front surface of the substrate, the processing film is peeled from the front surface of the substrate in a state that the objects to be removed are held. As a result, it is possible to detach and remove the objects from the front surface of the substrate.

In a preferred embodiment of the present invention, in the processing film forming step, the processing film is formed which has a low solubility component in a solid state and a high solubility component in a solid state which is higher in solubility with respect to the removing liquid than the low solubility component. Then, the peeling/removing step includes a step in which the high solubility component is selectively dissolved in the removing liquid, with the low solubility component kept in a solid state, thereby peeling the processing film from the front surface of the substrate.

According to this method, the high solubility component in a solid state in the processing film is selectively dissolved by the removing liquid. "The high solubility component in a solid state is selectively dissolved" does not mean that only the high solubility component in a solid state is dissolved. "The high solubility component in a solid state is selectively dissolved" means that although the low solubility component in a solid state is also slightly dissolved, the high solubility component in a solid state is mostly dissolved.

The high solubility component in a solid state is selectively dissolved to form a gap in the processing film, and the removing liquid reaches a contact interface between the processing film and the substrate through the gap. On the other hand, the low solubility component in the processing film is kept in a solid state. Consequently, where the objects to be removed are present on the front surface of the substrate, with the objects held by the low solubility component in a solid state, the removing liquid is allowed to act on a contact interface between the low solubility component in a solid state and the substrate. As a result, it is possible to quickly remove the processing film from the front surface of the substrate and efficiently remove the objects from the front surface of the substrate together with the processing film.

In a preferred embodiment of the present invention, etching is made at the surface layer portion of the substrate to form etching residue which is held by the processing film. Then, the processing film removing step includes a step in which the etching residue is removed together with the processing film in a state that the etching residue is held in the processing film.

According to this method, the etching residue generated by the etching of the surface layer portion of the substrate is removed from the front surface of the substrate together with the processing film in the processing film removing step. Therefore, there is no need to separately perform processing to remove the etching residue after removal of the processing film.

In a preferred embodiment of the present invention, a trench in a circular shape in a plan view which depresses the front surface of the substrate is formed in the substrate. The trench has a bottom wall and a side wall which is connected to the bottom wall and extends in a depth direction of the trench. The side wall has a bottom wall side portion which is connected to the bottom wall and an opening side portion which demarcates an opening of the trench. Then, the processing film forming step includes a step of forming the processing film that covers the bottom wall side portion of the side wall and the bottom wall.

According to this method, the processing film is formed which does not cover the opening side portion of the side wall but covers the bottom wall and the bottom wall side portion of the side wall. Therefore, etching can be made at the surface layer portion of the substrate only in the vicinity of the bottom wall inside the trench. Consequently, the trench can be increased in width only in the vicinity of the bottom wall inside the trench. By thus controlling a region in which the processing film is formed, it is possible to control a region of the front surface of the substrate which is etched.

Another preferred embodiment of the present invention provides a substrate processing apparatus including a processing liquid supplying unit which supplies a processing liquid to a front surface of a substrate, a processing film forming unit by which the processing liquid on the front surface of the substrate is solidified or cured to form a processing film on the front surface of the substrate, a processing film heating unit which heats the processing film, a heating adjusting unit which adjusts the extent of heating of the processing film by the processing film heating unit, and a controller which controls the processing liquid supplying unit, the processing film forming unit, the processing film heating unit, and the heating adjusting unit.

The controller is programmed so as to execute a processing film forming step in which a processing liquid is supplied from the processing liquid supplying unit to the front surface of the substrate, and the processing liquid on the front surface of the substrate is solidified or cured by the processing film forming unit to form a processing film on the front surface of the substrate, an etching facilitating step in which heating of the processing film by the processing film heating unit is strengthened by the heating adjusting unit, thereby facilitating etching at the surface layer portion of the substrate by the processing film, and an etching reducing step in which heating of the processing film by the processing film heating unit is weakened by the heating adjusting unit, thereby reducing the etching at the surface layer portion of the substrate in a state that the processing film is kept on the substrate.

According to this apparatus, the etching at the surface layer portion of the substrate by the processing film is not facilitated at the time of formation of the processing film and is facilitated by strengthening heating applied to the processing film. Then, it is not necessary to remove the processing film for reducing the etching, and the etching is reduced by weakening heating applied to the processing film in a state that the processing film is kept on the substrate. That is, depending on the strength of the heating applied to the processing film, it is possible to switch between a state in which the etching proceeds and that in which the etching is reduced. Therefore, it is easy to control the timing of facilitating the etching and the timing of reducing the etching. Consequently, it is possible to improve controllability of the etching at the surface layer portion of the substrate.

Still another preferred embodiment of the present invention provides a substrate processing apparatus including a processing liquid supplying unit which supplies a processing liquid to a front surface of a substrate, a processing film forming unit by which the processing liquid on the front surface of the substrate is solidified or cured to form a processing film on the front surface of the substrate, a pH-adjusting liquid supplying unit which supplies to the front surface of the substrate a pH-adjusting liquid to adjust the pH in the processing film so as to be acidic or basic, a neutralizing liquid supplying unit which supplies to the front surface of the substrate a neutralizing liquid to bring the pH in the processing film close to neutral, and a controller which controls the processing liquid supplying unit, the processing film forming unit, the pH-adjusting liquid supplying unit, and the neutralizing liquid supplying unit.

The controller is programmed so as to execute a processing film forming step in which a processing liquid is supplied from the processing liquid supplying unit to the front surface of the substrate, and the processing liquid on the front surface of the substrate is solidified or cured by the processing film forming unit to form the processing film on the front surface of the substrate, an etching facilitating step in which the pH-adjusting liquid is supplied from the pH-adjusting liquid supplying unit to the front surface of the substrate to adjust the pH in the processing film so as to be acidic or basic, thereby facilitating the etching at a surface layer portion of the substrate by the processing film, and an etching reducing step in which the neutralizing liquid is supplied from the neutralizing liquid supplying unit to the front surface of the substrate to bring the pH in the processing film closer to neutral than the pH in the processing film which has been adjusted by the pH-adjusting liquid, thereby reducing the etching at the surface layer portion of the substrate in a state that the processing film is kept on the substrate.

According to this apparatus, the etching at the surface layer portion of the substrate by the processing film is not facilitated at the time of formation of the processing film and is facilitated by adjusting the pH in the processing film so as to be acidic or basic by the pH-adjusting liquid. Then, it is not necessary to remove the processing film for reducing the etching, but the pH in the processing film is brought close to neutral by the neutralizing liquid to reduce the etching. That is, according to a change in the pH in the processing film, it is possible to switch between a state in which the etching proceeds and that in which the etching is reduced. Therefore, it is easy to control the timing of facilitating the etching and the timing of reducing the etching. Consequently, it is possible to improve controllability of the etching at the surface layer portion of the substrate.

Yet still another preferred embodiment of the present invention provides a processing liquid which is solidified or cured to form a processing film on a front surface of a substrate. The processing liquid contains a polymer for which etching at a surface layer portion of the substrate by the processing film is facilitated by etching function developing processing, and the etching at the surface layer portion of the substrate by the processing film is reduced by etching function eliminating processing.

According to this arrangement, the etching at the surface layer portion of the substrate by the processing film is not started at the time of formation of the processing film, but is facilitated in response to the etching function developing processing applied to the processing film. Then, it is not necessary to remove the processing film for reducing the etching, and in response to the etching function eliminating processing applied to the processing film in a state that the processing film is kept on the substrate, etching is reduced. Thereby, according to the processing applied to the processing film, it is possible to switch between a state in which the etching is facilitated and that in which the etching is reduced. Therefore, it is easy to control the timing of facilitating the etching and the timing of reducing the etching. Consequently, it is possible to improve controllability of the etching at the surface layer portion of the substrate.

The aforementioned as well as yet other objects, features, and effects of the present invention will be made clear by the following description of the preferred embodiments, with reference to the accompanying drawings.

BRIEF DESCRIPTION OF DRAWINGS

FIG. 6 is a flowchart for describing an example of substrate processing by the substrate processing apparatus.

FIG. 10B is a schematic view for describing conditions of the surface layer portion of the substrate near the trench of the substrate after the processing film forming step (Step S3).

FIG. 10C is a schematic view for describing conditions of the surface layer portion of the substrate near the trench of the substrate after the processing film removing step (Step S6).

FIG. 15 is a schematic view for describing an example of a pH-responsive polymer.

DESCRIPTION OF EMBODIMENTS

First Preferred Embodiment

Figure 1:
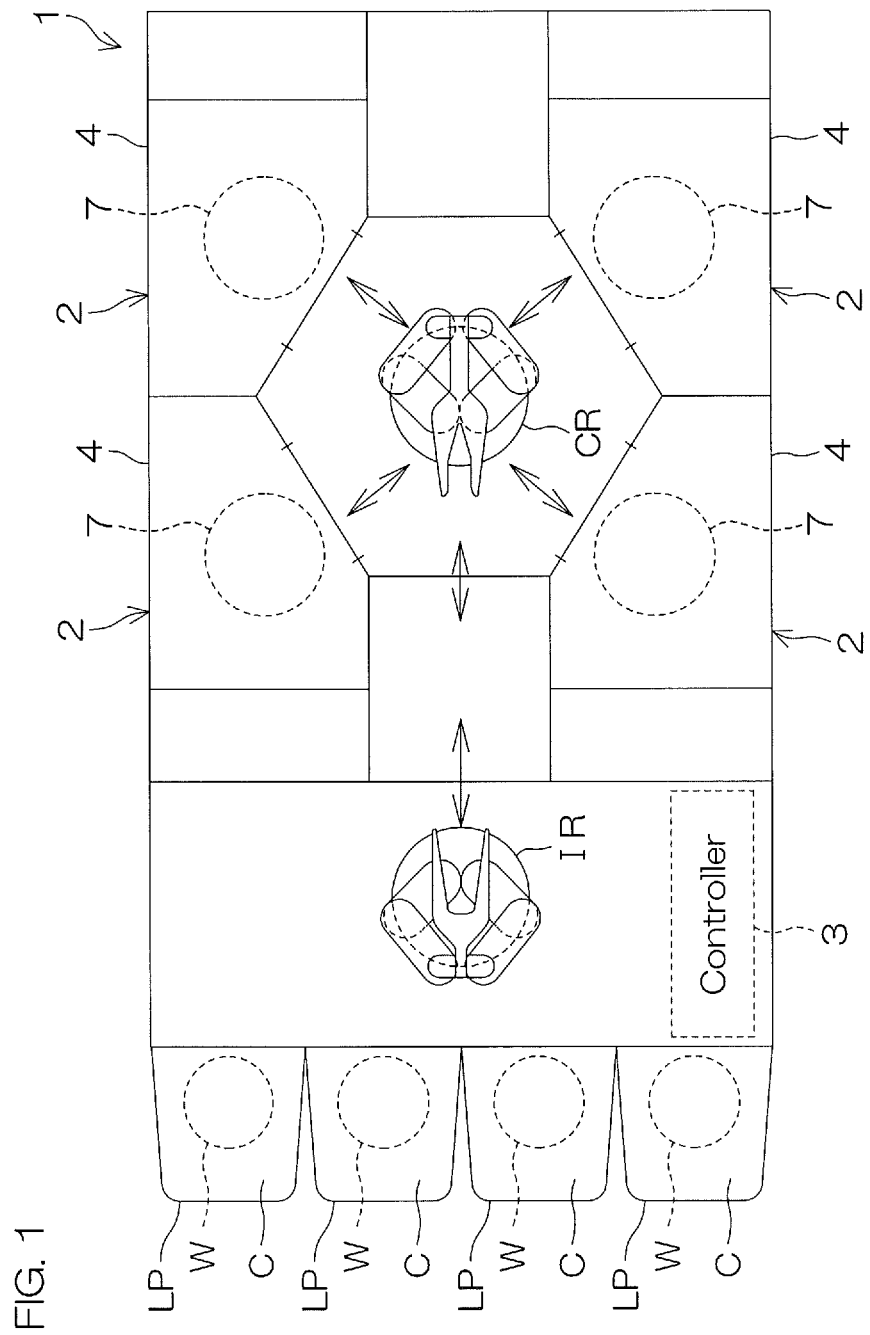
FIG. 1 is a schematic plan view which shows a layout of a substrate processing apparatus according to a first preferred embodiment of the present invention.

FIG. 1 is a schematic plan view which shows a layout of a substrate processing apparatus 1 according to a preferred embodiment of the present invention.

The substrate processing apparatus 1 is a single substrate processing type apparatus that processes a substrate W such as a silicon wafer one at a time. In the preferred embodiment, the substrate W is a disk-shaped substrate. Such a substrate that a component which can be etched is exposed on a front surface may be used as the substrate W. As the substrate W, a substrate is favorably used in which any one among $SiO_2$ (silicon oxide), TiN (titanium nitride), Cu (copper) and Ru (ruthenium) is exposed on a front surface. Only one type of the above-described substances may be exposed on the front surface of the substrate W or the plural types of above-described substances may be exposed. A substance that can be etched other than the above-described substances may be exposed on the front surface of the substrate W.

The substrate processing apparatus 1 includes a plurality of processing units 2 to process the substrate W with fluids, load ports LP on which carriers C are placed that house the plurality of substrates W to be processed by the processing unit 2, transfer robots IR and CR that transfer the substrates W between the load port LP and the processing unit 2, and a controller 3 that controls the substrate processing apparatus 1.

The transfer robot IR transfers the substrate W between the carrier C and the transfer robot CR. The transfer robot CR transfers the substrate W between the transfer robot IR and the processing unit 2. The plurality of processing units 2 have, for example, the same arrangement. Although the details will be described later, the fluid supplied to the substrate W inside the processing unit 2 includes a processing liquid, a peeling/removing liquid, a dissolving/removing liquid, a rinse liquid (neutralizing liquid), a pH-adjusting liquid, a residue removing liquid, etc.

Each processing unit 2 includes a chamber 4 and a processing cup 7 disposed inside the chamber 4 and executes processing of the substrate W inside the processing cup 7. An inlet/outlet (not shown) to carry in the substrate W and to carry out the substrate W by the transfer robot CR is formed at the chamber 4. The chamber 4 is provided with a shutter unit (not shown) to open and to close the inlet/outlet.

Figure 2:
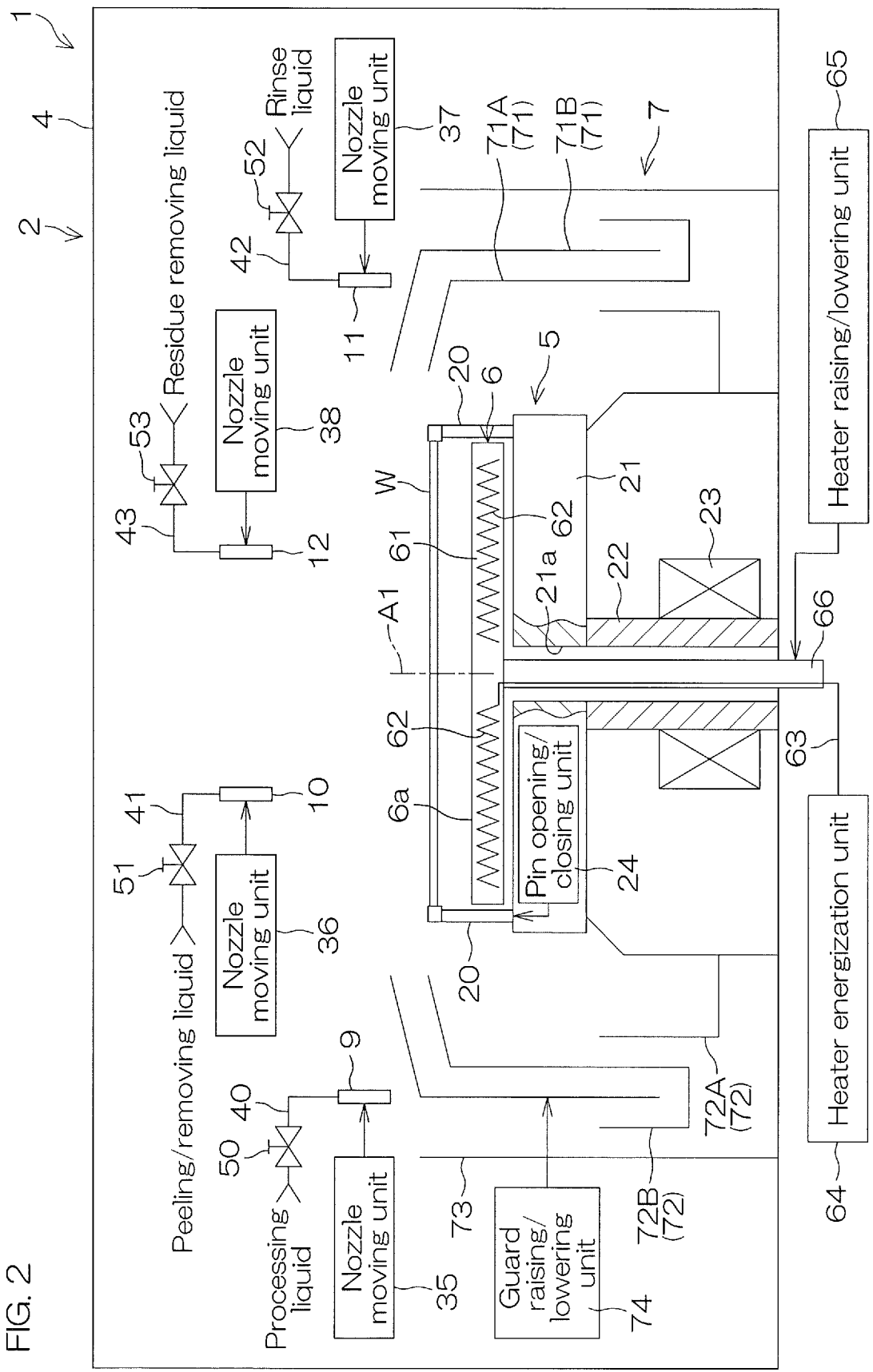
FIG. 2 is a schematic partial cross-sectional view which shows a general arrangement of a processing unit included in the substrate processing apparatus.

FIG. 2 is a schematic view for describing an arrangement example of the processing unit 2. The processing unit 2 includes a spin chuck 5, a heater unit 6, a processing cup 7, a first moving nozzle 9, a second moving nozzle 10, a third moving nozzle 11, and a fourth moving nozzle 12.

The spin chuck 5 is an example of a substrate holding/rotating unit which rotates the substrate W around a rotational axis A1 (vertical axis), while holding the substrate W horizontally. The rotational axis A1 is a vertical line which passes through a central portion of the substrate W. The spin chuck 5 includes a plurality of chuck pins 20, a spin base 21, a rotating shaft 22, and a spin motor 23.

The spin base 21 has a disk shape along a horizontal direction. On an upper surface of the spin base 21, the plurality of chuck pins 20 that grip a peripheral edge of the substrate W are disposed at intervals in a circumferential direction of the spin base 21.

The plurality of chuck pins 20 are opened and closed by a pin opening/closing unit 24. The plurality of chuck pins 20 are kept in a closed state by the pin opening/closing unit 24, thereby holding (clamping) the substrate W horizontally. The plurality of chuck pins 20 are kept in an open state by the pin opening/closing unit 24, thereby releasing the substrate W. The plurality of chuck pins 20 support the substrate W from below in the open state.

The spin base 21 and the plurality of chuck pins constitute a substrate holding unit to hold the substrate W horizontally. The substrate holding unit is also referred to as a substrate holder.

The rotating shaft 22 extends in a vertical direction along the rotational axis A1. An upper end portion of the rotating shaft 22 is coupled to a lower surface center of the spin base 21. The spin motor 23 applies a rotational force to the rotating shaft 22. The spin base 21 is rotated by the rotating shaft 22 being rotated by the spin motor 23. The substrate W is, thereby, rotated around the rotational axis A1. The spin motor 23 is an example of a substrate rotating unit that rotates the substrate W around the rotational axis A1.

The heater unit 6 is an example of a substrate heating unit which heats an entirety of the substrate W. The heater unit 6 has a form of a disk-shaped hot plate. The heater unit 6 is disposed between the upper surface of the spin base 21 and a lower surface of the substrate W. The heater unit 6 has a facing surface 6a that faces the lower surface of the substrate W from below.

The heater unit 6 includes a plate main body 61 and a heater 62. The plate main body 61 is slightly smaller than the substrate W in a plan view. An upper surface of the plate main body 61 constitutes a facing surface 6a. The heater 62 may be a resistor element built into the plate main body 61. The heater 62 is energized to heat the facing surface 6a. The facing surface 6a is heated, for example, to 195° C.

The processing unit 2 includes a heater energization unit 64 which supplies electricity to the heater 62 via a power supplying line 63 and a heater raising/lowering unit 65 which relatively raises and lowers the heater unit 6 with respect to the spin base 21. The heater energization unit 64 is, for example, a power supply. The heater raising/lowering unit 65 includes, for example, a ball screw mechanism (not shown) and an electric motor (not shown) which supplies a driving force thereto. The heater raising/lowering unit 65 is also referred to as a heater lifter.

A raising/lowering shaft 66 which extends along the rotational axis A1 in a vertical direction is coupled to a lower surface of the heater unit 6. The raising/lowering shaft 66 penetrates through the hollow rotating shaft 22 and a through hole 21a which is formed at a central portion of the spin base 21. The power supplying line 63 is passed through an interior of the raising/lowering shaft 66.

The heater raising/lowering unit 65 raises and lowers the heater unit 6 via the raising/lowering shaft 66. The heater unit 6 can be positioned at a lower position and an upper position by being raised and lowered by the heater raising/lowering unit 65. The heater raising/lowering unit 65 is capable of disposing the heater unit 6 not only at the lower position and at the upper position but also at any position between the lower position and the upper position.

When raised, the heater unit 6 is able to receive the substrate W from the plurality of chuck pins 20 in the open state. The heater unit 6 is disposed at a position in contact with the lower surface of the substrate W or at a position proximate to the lower surface of the substrate W by the heater raising/lowering unit 65, thereby able to heat the substrate W.

The processing cup 7 includes a plurality of guards 71 that receive a liquid splashing outward from the substrate W held by the spin chuck 5, a plurality of cups 72 that receive a liquid guided downward by the plurality of guards 71, and a circular-cylindrical outer wall member 73 that surrounds the plurality of guards 71 and the plurality of cups 72.

In this preferred embodiment, an example is shown in which two guards 71 (first guard 71A and second guard 71B) and two cups 72 (first cup 72A and second cup 72B) are provided.

The first cup 72A and the second cup 72B each have a form of an annular groove which is opened upward.

The first guard 71A is disposed so as to surround the spin base 21. The second guard 71B is disposed so as to surround the spin base 21 further outside than the first guard 71A.

The first guard 71A and the second guard 71B each have a substantially circular cylindrical shape. An upper end portion of each of the guards 71 is inclined inward so as to move toward the spin base 21.

The first cup 72A receives a liquid guided downward by the first guard 71A. The second cup 72B is formed integrally with the first guard 71A and receives a liquid guided downward by the second guard 71B.

The processing unit 2 includes a guard raising/lowering unit 74 which raises and lowers the first guard 71A and the second guard 71B independently in a vertical direction. The guard raising/lowering unit 74 raises and lowers the first guard 71A between the lower position and the upper position. The guard raising/lowering unit 74 raises and lowers the second guard 71B between the lower position and the upper position.

When the first guard 71A and the second guard 71B are both positioned at the upper position, a liquid splashing from the substrate W is received by the first guard 71A. When the first guard 71A is positioned at the lower position and the second guard 71B is positioned at the upper position, a liquid splashing from the substrate W is received by the second guard 71B. When the first guard 71A and the second guard 71B are both positioned at the lower position, the transfer robot CR is able to gain access to the spin chuck 5 to carr in and to carry out the substrate W.

The guard raising/lowering unit 74 includes, for example, a first ball screw mechanism (not shown) that is coupled to the first guard 71A, a first motor (not shown) that applies a driving force to the first ball screw mechanism, a second ball screw mechanism (not shown) that is coupled to the second guard 71B, and a second motor (not shown) that applies a driving force to the second ball screw mechanism. The guard raising/lowering unit 74 is also referred to as a guard lifter.

The first moving nozzle 9 is an example of a processing liquid nozzle (processing liquid supplying unit) that supplies (discharges) the processing liquid to an upper surface (surface on the upper side) of the substrate W held by the spin chuck 5.

The first moving nozzle 9 is moved by a first nozzle moving unit 35 in a horizontal direction and in a vertical direction. The first moving nozzle 9 can move between a center position and a home position (retreat position) in the horizontal direction. When positioned at the center position, the first moving nozzle 9 faces a central region of the upper surface of the substrate W.

When positioned at the home position, the first moving nozzle 9 does not face the upper surface of the substrate W and is positioned outside the processing cup 7 in a plan view. By moving in the vertical direction, the first moving nozzle 9 is able to move close to the upper surface of the substrate W and retreat upward from the upper surface of the substrate W.

The first nozzle moving unit 35 may include an arm (not shown) which is coupled to the first moving nozzle 9 and extends horizontally, a pivoting shaft (not shown) which is coupled to the arm and extends along the vertical direction, and a pivoting shaft driving unit (not shown) which raises, lowers, and pivots the pivoting shaft.

The pivoting shaft driving unit swings the arm by pivoting the pivoting shaft around a vertical pivoting axis. Further, the pivoting shaft driving unit raises and lowers the pivoting shaft along the vertical direction and thereby raises and lowers the arm. In response to the arm which is swung, raised, or lowered, the first moving nozzle 9 moves in the horizontal direction and in the vertical direction.

The first moving nozzle 9 is connected to a processing liquid piping 40 which guides the processing liquid into the first moving nozzle 9. When a processing liquid valve 50 interposed in the processing liquid piping is opened, the processing liquid is discharged continuously downward from the first moving nozzle 9. When the first moving nozzle 9 is positioned at a central position and the processing liquid valve 50 is opened, the processing liquid is supplied to the central region of the upper surface of the substrate W.

The processing liquid contains a solute and a solvent. The processing liquid is solidified or cured by at least partial volatilization (evaporation) of the solvent contained in the processing liquid. The processing liquid is solidified or cured on the substrate W to form a solid-state processing film. When the processing liquid is solidified or cured, the processing film captures therein objects to be removed present on the substrate W and holds them. The objects to be removed are, for example, foreign matter such as particles adhering to the front surface of the substrate W.

Here, "solidified" means that a solute is hardened by the force, etc., acting between molecules and atoms, for example, along with volatilization of a solvent. "Cured" means that a solute is hardened by chemical changes, for example, polymerization, cross linkage, etc. Consequently, "solidified or cured" means that a solute is "hardened" due to various factors.

Further, it is not necessary that the processing film is constituted of a solid component alone. If a certain shape is kept as a whole, the processing film may be in a semi-solid state that is constituted of both a solid component and a liquid component. That is, the solvent does not have to be completely removed from the processing liquid but the solvent may remain in the processing film.

The processing liquid contains, as the solute, a function developing component, a low solubility component, and a high solubility component.

The function developing component is a component which develops (strengthens) an etching function by a predetermined etching function developing processing and loses (weakens) the etching function by the predetermined etching function eliminating processing. In the first preferred embodiment, the function developing component is a temperature-responsive polymer. The temperature-responsive polymer has such a property that it develops (strengthens) an etching function by strengthening heating and loses (weakens) the etching function by weakening the heating. That is, the etching function developing processing is heating strengthening processing to strengthen the heating applied to the processing film, and the etching function eliminating processing is heating weakening processing to weaken the heating applied to the processing film. To weaken the heating may be by stopping the heating or may be by cooling. The temperature-responsive polymer may be a copolymer which has plural types of constituent units.

Figure 3:
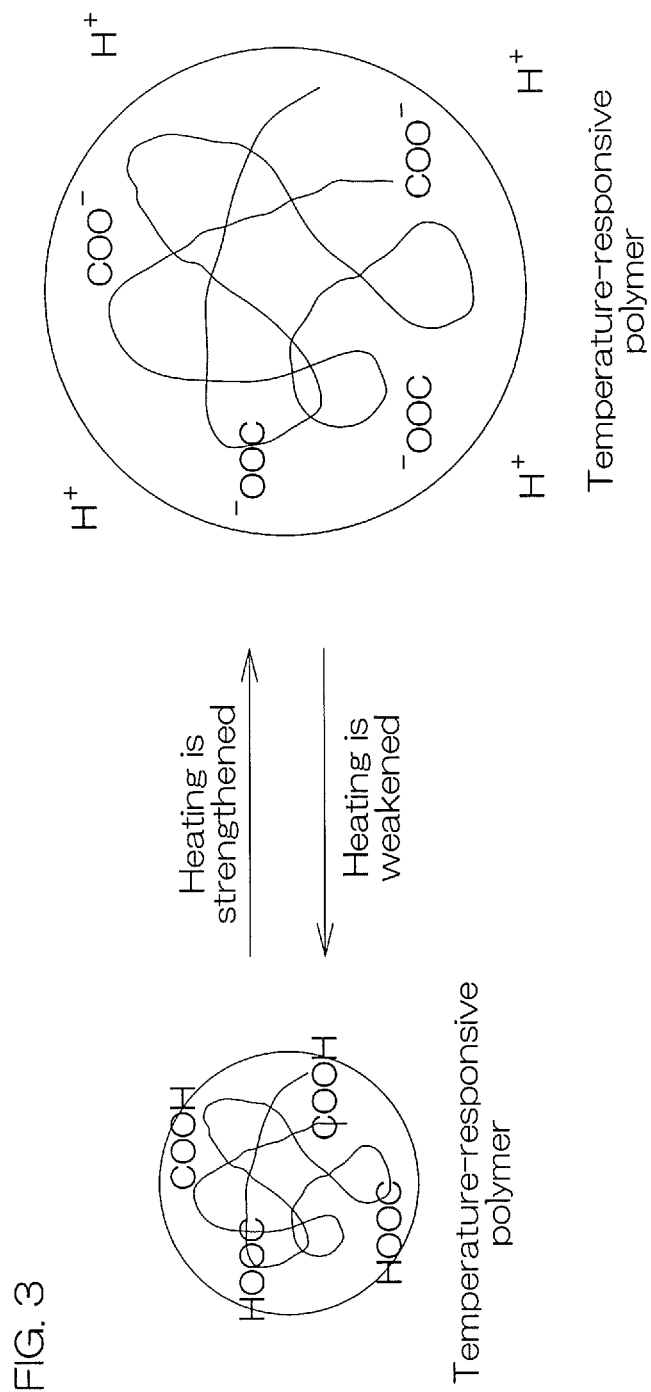
FIG. 3 is a schematic view for describing a mechanism of developing an etching function of a temperature-responsive polymer.

FIG. 3 is a schematic view for describing a mechanism of developing the etching function of the temperature-responsive polymer. The temperature-responsive polymer has in the molecule a functional group capable of releasing protons such as a carboxyl group.

In order that the temperature-responsive polymer releases protons, the processing film is preferably not formed of a solid component alone but is in a semi-solid state (gel state) in which a liquid component is mixed with a solid component, and the liquid component is preferably water.

The temperature-responsive polymer releases protons ($H^+$) to the liquid component in the processing film by the heating strengthening processing, thereby developing the etching function. The temperature-responsive polymer receives the protons from the liquid component in the processing film by the heating weakening processing, thereby losing the etching function.

For example, the temperature-responsive polymer is increased in temperature to 40° C. or higher by the heating strengthening processing, by which the temperature-responsive polymer releases protons to facilitate etching. The temperature-responsive polymer is decreased in temperature to less than 40° C. by the heating weakening processing, by which the temperature-responsive polymer receives the protons to reduce the etching.

To facilitate the etching means both that the etching is started from a state in which the etching is completely stopped and that in which the etching has already started is increased in speed. Similarly, to reduce the etching means both that in which the etching in progress is completely stopped and that in which the etching in progress is decreased in speed.

Figure 4:
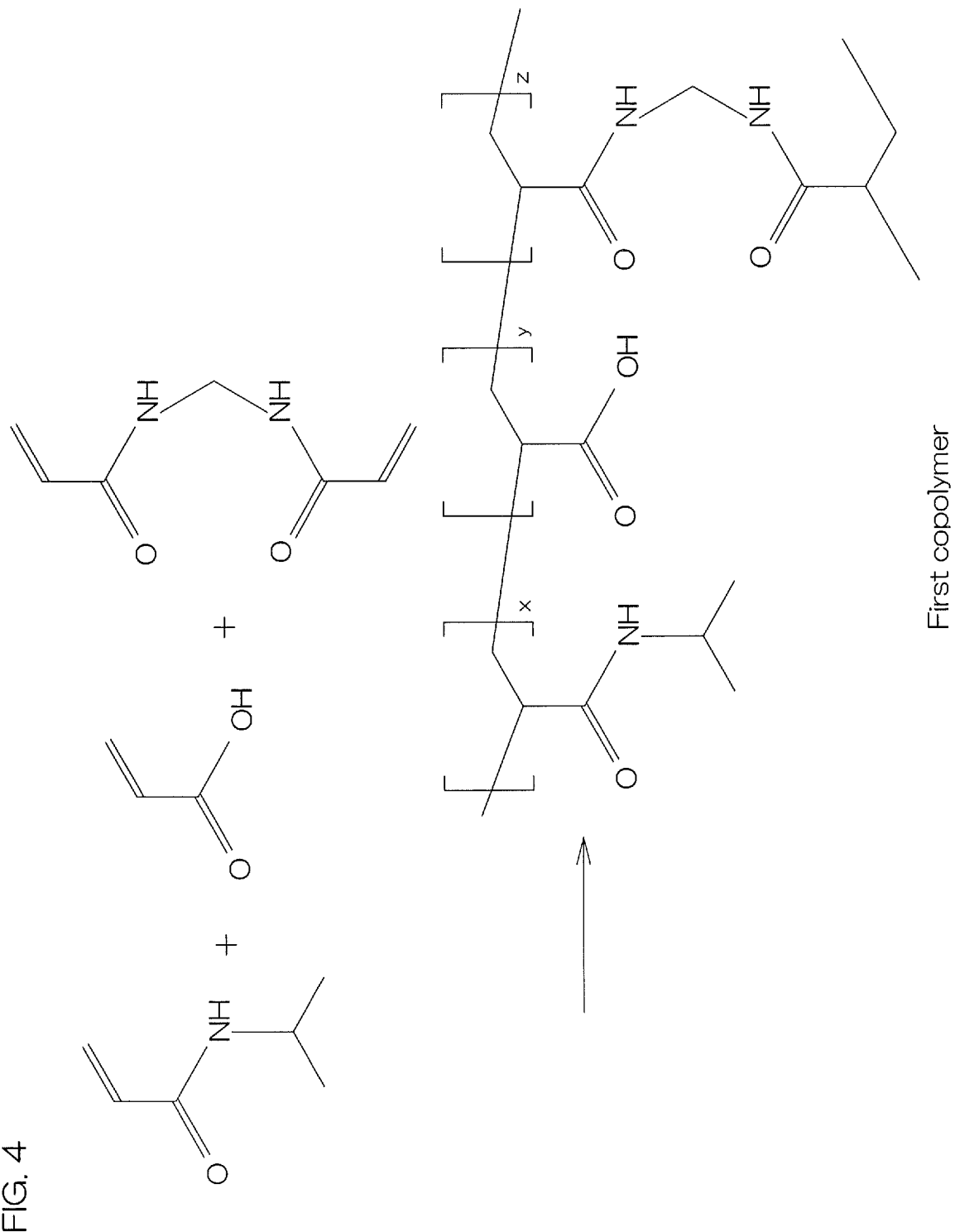
FIG. 4 is a schematic view for describing an example of the temperature-responsive polymer.

FIG. 4 is a schematic view for describing a method for synthesizing the temperature-responsive polymer. As the temperature-responsive polymer, a copolymer (first copolymer) of N-isopropylacrylamide, acrylic acid and N,N'-methylenebisacrylamide may be used. N-isopropylacrylamide, acrylic acid, and N,N'-methylenebisacrylamide are constituent units which constitute the first copolymer. The first copolymer is a hydrogel which contains water as a liquid component. Acrylic acid is an organic acid which is contained in the first copolymer as one type of the constituent unit.

The first copolymer is, for example, formed by allowing N-isopropylacrylamide, N,N'-methylenebisacrylamide, and acrylic acid to react at a normal temperature in the presence of APS (ammonium persulphate) and TMEDA (tetramethylethylene diamine). N,N'-methylenebisacrylamide functions as a cross-linking agent.

As the high solubility component which is contained as a solute in the processing liquid, a substance that is relatively high in solubility with respect to the peeling/removing liquid which will be described later may be used. The high solubility component is, for example, 2,2-bis(4-hydroxyphenyl)propane. The high solubility component is not limited to 2,2-bis(4-hydroxyphenyl)propane. The details of the high solubility component will be described later.

As the low solubility component which is contained as a solute in the processing liquid, a substance that is lower in solubility with respect to the peeling/removing liquid to be described later than the high solubility component may be used. The low solubility component is, for example, novolak.

The solvent contained in the processing liquid may be a liquid which dissolves the function developing component, the low solubility component, and the high solubility component. The solvent contained in the processing liquid is preferably a liquid having compatibility (miscibility) with the peeling/removing liquid. Compatibility is a property that two types of liquids are dissolved and mixed with each other. Examples of the solvent contained in the processing liquid include alcohols such as isopropanol (IPA).

The processing film is constituted mainly of the function developing component (function developing solid) in a solid state, the low solubility component (low solubility solid) in a solid state, and the high solubility component (high solubility solid) in a solid state. The solid state is not limited to a state which is constituted of a solid component alone but includes a gel state which contains a liquid component. The solvent, the low solubility component, and the high solubility component which are contained in the processing liquid will be described later in detail.

Again, with reference to FIG. 2, the second moving nozzle 10 is an example of a peeling/removing liquid nozzle (peeling/removing liquid supplying unit) which supplies (discharge) continuously the peeling/removing liquid such as an ammonia solution to the upper surface of the substrate W held by the spin chuck 5. The peeling/removing liquid is a liquid to peel the processing film formed on the substrate W from the upper surface of the substrate W.

The second moving nozzle 10 is moved by a second nozzle moving unit 36 in a horizontal direction and in a vertical direction. The second moving nozzle 10 can move between a center position and a home position (retreat position) in the horizontal direction.

When positioned at the center position, the second moving nozzle 10 faces the central region of the upper surface of the substrate W. When positioned at the home position, the second moving nozzle 10 does not face the upper surface of the substrate W and is positioned outside the processing cup 7 in a plan view. By moving in the vertical direction, the second moving nozzle 10 is able to move close to the upper surface of the substrate W or retreat upward from the upper surface of the substrate W.

The second nozzle moving unit 36 has the same arrangement as the first nozzle moving unit 35. That is, the second nozzle moving unit 36 may include an arm (not shown) which is coupled to the second moving nozzle 10 and extends horizontally, a pivoting shaft (not shown) which is coupled to the arm and extends along the vertical direction, and a pivoting shaft driving unit (not shown) which raises, lowers, and pivots the pivoting shaft.

The second moving nozzle 10 is connected to a peeling/removing liquid piping 41 to guide the peeling/removing liquid to the second moving nozzle 10. When a peeling/removing liquid valve 51 interposed in the peeling/removing liquid piping 41 is opened, the peeling/removing liquid is continuously discharged downward from a discharge port of the second moving nozzle 10. When the second moving nozzle 10 is positioned at the central position and the peeling/removing liquid valve 51 is opened, the peeling/removing liquid is supplied to the central region of the upper surface of the substrate W.

As the peeling/removing liquid discharged from the second moving nozzle 10, a liquid is used which is easier to dissolve the high solubility component than the low solubility component.

The peeling/removing liquid discharged from the second moving nozzle 10 is, for example, an alkaline aqueous solution (alkaline liquid) such as an ammonia solution. Specific examples of the alkaline aqueous solution include an ammonia solution, an SC1 solution (ammonia-hydrogen peroxide mixture), a TMAH (tetramethylammonium hydroxide) aqueous solution, a choline aqueous solution, and any combination of these.

The third moving nozzle 11 is an example of a rinse liquid nozzle (rinse liquid supplying unit) which supplies (discharges) continuously the rinse liquid such as pure water to the upper surface of the substrate W which is held by the spin chuck 5. The rinse liquid is a liquid which washes away a liquid adhering to the front surface of the substrate W.

The third moving nozzle 11 is moved in the horizontal direction and in the vertical direction by a third nozzle moving unit 37. The third moving nozzle 11 can move between a center position and a home position (retreat position) in the horizontal direction.

When positioned at the center position, the third moving nozzle 11 faces the central region of the upper surface of the substrate W. When positioned at the home position, the third moving nozzle 11 does not face the upper surface of the substrate W and is positioned outside the processing cup 7 in a plan view. By moving in the vertical direction, the third moving nozzle 11 is able to move close to the upper surface of the substrate W and retreat upward from the upper surface of the substrate W.

The third nozzle moving unit 37 has the same arrangement as the first nozzle moving unit 35. That is, the third nozzle moving unit 37 may include an arm (not shown) which is coupled to the third moving nozzle 11 and extends horizontally, a pivoting shaft (not shown) which is coupled to the arm and extends along the vertical direction, and a pivoting shaft driving unit (not shown) which raises, lowers, and pivots the pivoting shaft.

The third moving nozzle 11 is connected to a rinse liquid piping 42 for guiding the rinse liquid to the third moving nozzle 11. When a rinse liquid valve 52 interposed in the rinse liquid piping 42 is opened, the rinse liquid is continuously discharged downward from a discharge port of the third moving nozzle 11. When the third moving nozzle 11 is positioned at the central position and the rinse liquid valve 52 is opened, the rinse liquid is supplied to the central region of the upper surface of the substrate W.

Examples of the rinse liquid include pure water such as DIW, carbonated water, electrolyzed ion water, a hydrochloric acid aqueous solution of dilute concentration (of, for example, approximately 1 ppm to 100 ppm), an ammonia solution of dilute concentration (of, for example, approximately 1 ppm to 100 ppm), reduced water (hydrogen water), etc.

The fourth moving nozzle 12 is an example of a residue removing liquid nozzle (residue removing liquid supplying unit) which supplies (discharges) continuously the residue removing liquid such as an organic solvent to the upper surface of the substrate W which is held by the spin chuck 5.

The fourth moving nozzle 12 is moved in the horizontal direction and in the vertical direction by a fourth nozzle moving unit 38. The fourth moving nozzle 12 can move between a center position and a home position (retreat position) in the horizontal direction.

When positioned at the center position, the fourth moving nozzle 12 faces the central region of the upper surface of the substrate W. When positioned at the home position, the fourth moving nozzle 12 does not face the upper surface of the substrate W and is positioned outside the processing cup 7 in a plan view. By moving in the vertical direction, the fourth moving nozzle 12 is able to move close to the upper surface of the substrate W and retreat upward from the upper surface of the substrate W.

The fourth nozzle moving unit 38 has the same arrangement as the first nozzle moving unit 35. That is, the fourth nozzle moving unit 38 may include an arm (not shown) which is coupled to the fourth moving nozzle 12 and extends horizontally, a pivoting shaft (not shown) which is coupled to the arm and extends along the vertical direction, and a pivoting shaft driving unit (not shown) which raises, lowers, and pivots the pivoting shaft.

The fourth moving nozzle 12 is connected to a residue removing liquid piping 43 to guide the residue removing liquid to the fourth moving nozzle 12. When a residue removing liquid valve 53 interposed in the residue removing liquid piping 43 is opened, the residue removing liquid is continuously discharged downward from a discharge port of the fourth moving nozzle 12. When the fourth moving nozzle 12 is positioned at the central position and the residue removing liquid valve 53 is opened, the residue removing liquid is supplied to the central region of the upper surface of the substrate W.

The residue removing liquid is a liquid to wash away residue of the processing film which slightly remains on the substrate W after the peeling/removing liquid has been supplied to the substrate W and to remove them from the upper surface of the substrate W. Therefore, the residue removing liquid has compatibility with the peeling/removing liquid. The residue removing liquid dissolves and removes the residue of the processing film which remains on the upper surface of the substrate W after peeling and removal from the upper surface of the substrate W by the peeling/removing liquid. As the residue removing liquid, for example, an organic solvent may be used. The residue removing liquid is also referred to as a residue dissolving liquid.

The residue removing liquid is preferably a low surface tension liquid which is lower in surface tension than the rinse liquid. In the substrate processing to be described later, the upper surface of the substrate W is not dried by spinning off the rinse liquid on the substrate W, but after the rinse liquid on the substrate W has been replaced by the residue removing liquid, the residue removing liquid on the substrate W is spun off to dry the upper surface of the substrate W. Therefore, the residue removing liquid which is a low surface tension liquid is able to lower a surface tension which acts on the upper surface of the substrate W when the upper surface of the substrate W is dried.

Examples of the organic solvent which functions as the residue removing liquid and the low surface tension liquid include a liquid which contains at least one of IPA, HFE (hydrofluoroether), methanol, ethanol, acetone, PGEE (propylene glycol monoethyl ether) and Trans-1,2-dichloroethylene.

The organic solvent which functions as the residue removing liquid and the low surface tension liquid does not have to be constituted of a single component alone but may be a liquid that is mixed with other components. For example, it may be a mixture solution of IPA and DIW or a mixture solution of IPA and HFE.

Figure 5:
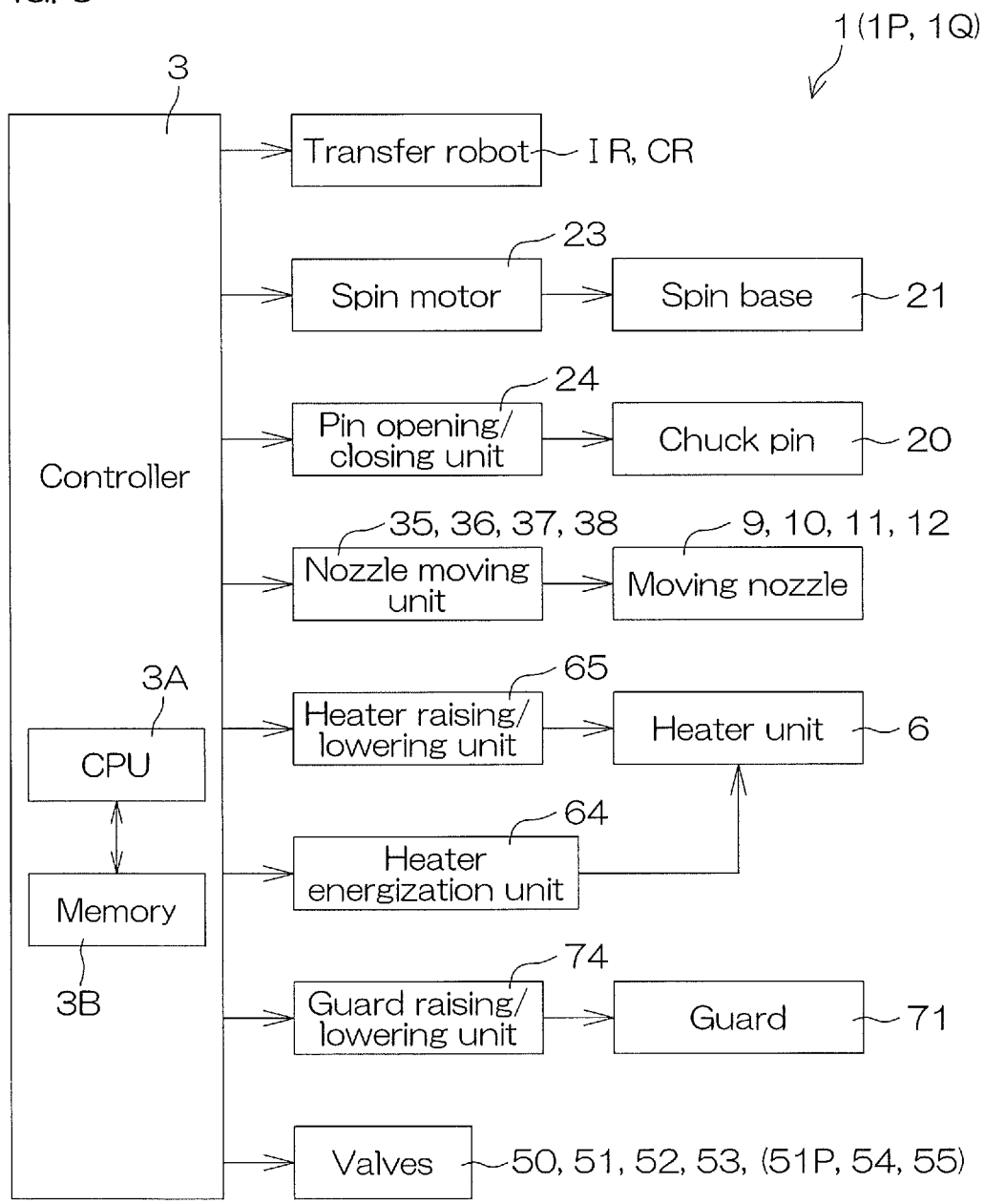
FIG. 5 is a block diagram which shows an electrical configuration of a main portion of the substrate processing apparatus.

FIG. 5 is a block diagram which shows an electrical configuration of the main portion of the substrate processing apparatus 1. The controller 3 is provided with a microcomputer and controls control objects installed in the substrate processing apparatus 1 according to a predetermined control program.

Specifically, the controller 3 includes a processor (CPU) 3A and a memory 3B in which control programs are stored. The controller 3 is arranged so as to execute various types of control for substrate processing in accordance with execution of the control programs by the processor 3A.

The controller 3 is programmed so as to control, in particular, the transfer robots IR, CR, the spin motor 23, the pin opening/closing unit 24, the first nozzle moving unit 35, the second nozzle moving unit 36, the third nozzle moving unit 37, the fourth nozzle moving unit 38, the heater energization unit 64, the heater raising/lowering unit 65, the guard raising/lowering unit 74, the processing liquid valve 50, the peeling/removing liquid valve 51, the rinse liquid valve 52, and the residue removing liquid valve 53. The valves are controlled by the controller 3 so as to control whether a processing fluid from a corresponding nozzle is discharged or not and at which flow rate of the processing fluid from the corresponding nozzle is discharged.

FIG. 6 is a flowchart for describing an example of the substrate processing by the substrate processing apparatus 1. FIG. 6 mainly shows the processing which is realized by execution of programs by the controller 3. FIG. 7A to FIG. 7I are each a schematic view for describing conditions of each step of the substrate processing.

In the substrate processing by the substrate processing apparatus 1, for example, as shown in FIG. 6, the substrate carrying-in step (Step S1), the processing liquid supplying step (Step S2), the processing film forming step (Step S3), the etching starting step (Step S4), the etching stopping step (Step S5), the processing film removing step (Step S6), the rinsing step (Step S7), the residue removing step (Step S8), the spin drying step (Step S9), and the substrate carrying-out step (Step S10) are executed in this order.

The etching processing in which the etching starting step (Step S4) and the etching stopping step (Step S5) are given as one cycle is executed by the number of N times (N=0, 1, 2, 3 . . . ). That is, the etching processing may be executed in one cycle only or may be executed in a plural number of cycles.

Hereinafter, FIG. 2 and FIG. 6 are mainly referred to. FIG. 7A to FIG. 7I are referred to, whenever necessary.

First, a substrate W which is not processed is carried in the processing unit 2 from the carrier C by the transfer robots IR, CR (refer to FIG. 1) and transferred to the spin chuck 5 (Step S1). Thereby, the substrate W is horizontally held by the spin chuck 5 (substrate holding step).

When the substrate W is carried in, the heater unit 6 is disposed at a non-heating position at which no heating is applied to the substrate W in a state that the heater 62 is energized. The non-heating position is, for example, a lower position. The non-heating position may be a position that is isolated from the substrate W to such an extent that a temperature of the substrate W will not rise.

The substrate W is held continuously by the spin chuck 5 until the spin drying step (Step S9) ends. The guard raising/lowering unit 74 adjusts a height position of the first guard 71A and that of the second guard 71B so that at least one of the guards 71 is positioned at the upper position from the start of the substrate holding step to the end of the spin drying step (Step S9). In a state that the substrate W is held by the spin chuck 5, the spin motor 23 rotates the spin base 21. Thereby, rotation of the substrate W that is held horizontally is started (substrate rotating step).

Next, after the transfer robot CR is retreated to the outside of the processing unit 2, the processing liquid supplying step (Step S2) is executed which supplies the processing liquid to the upper surface of the substrate W. Specifically, the first nozzle moving unit 35 moves the first moving nozzle 9 to a processing position. The processing position of the first moving nozzle 9 is, for example, the central position.

Figure 7A:
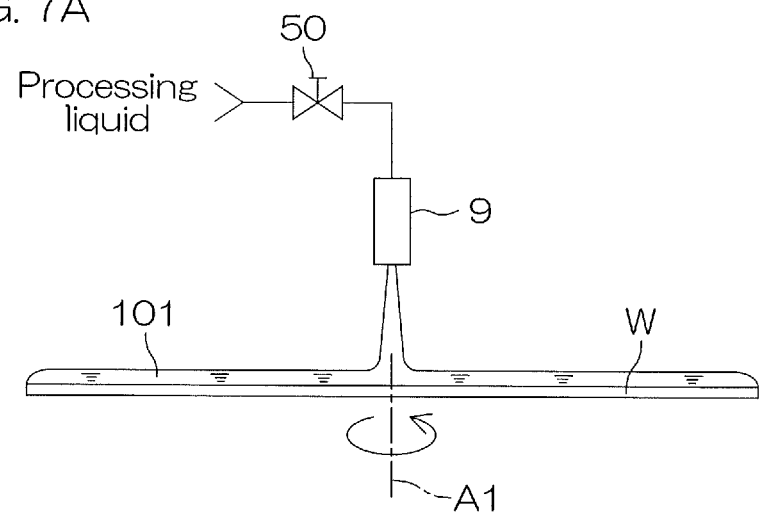
FIG. 7A is a schematic view for describing conditions of a processing liquid supplying step (Step S2) of the substrate processing.

In a state that the first moving nozzle 9 is positioned at the processing position, the processing liquid valve 50 is opened. Thereby, as shown in FIG. 7A, the processing liquid is supplied (discharged) from the first moving nozzle 9 to the central region of the upper surface of the substrate W in a rotating state (processing liquid supplying step, processing liquid discharging step). The processing liquid supplied to the upper surface of the substrate W spreads across the entire substrate W by a centrifugal force. Thereby, a liquid film 101 (processing liquid film) of the processing liquid is formed on the substrate W (processing liquid film forming step).

Supply of the processing liquid from the first moving nozzle 9 continues for a predetermined time of, for example, 2 to 4 seconds. In the processing liquid supplying step, the substrate W is rotated at a predetermined processing liquid rotational speed of, for example, 10 rpm to 1500 rpm.

Figure 7B:
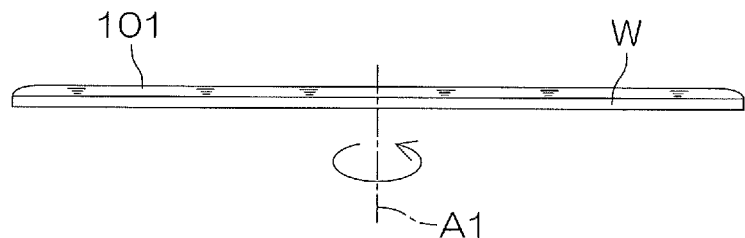
FIG. 7B is a schematic view for describing conditions of a processing film forming step (Step S3) of the substrate processing.
Figure 7C:
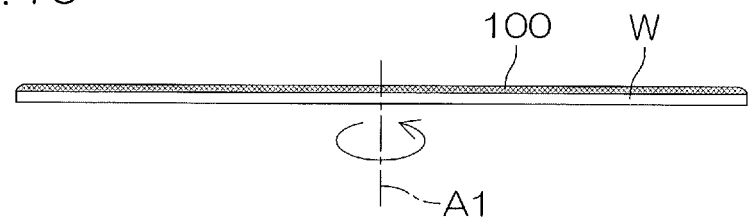
FIG. 7C is a schematic view for describing conditions of the processing film forming step (Step S3).

Next, the processing film forming step (Step S3) shown in FIG. 7B and FIG. 7C is executed. In the processing film forming step, the processing liquid on the substrate W is solidified or cured to form a processing film 100 (refer to FIG. 7C) on the upper surface of the substrate W.

In the processing film forming step, the liquid film 101 of the processing liquid on the substrate W is reduced in thickness (processing liquid film thinning step, processing liquid spin-off step). Specifically, the processing liquid valve 50 is closed. Thereby, as shown in FIG. 7B, supply of the processing liquid to the substrate W is stopped. Then, the first moving nozzle 9 is moved to the home position by the first nozzle moving unit 35.

As shown in FIG. 7B, in the processing liquid film thinning step, since the substrate W is rotated in a state that supply of the processing liquid to the upper surface of the substrate W is stopped, the processing liquid is partially removed from the upper surface of the substrate W. Thereby, the liquid film 101 on the substrate W is made appropriate in thickness.

A centrifugal force resulting from rotation of the substrate W not only removes the processing liquid from the upper surface of the substrate W but also acts on a gas in contact with the liquid film 101. By actions of the centrifugal force, an air flow in which the gas moves from the center side of the substrate W to the peripheral side thereof is formed. A solvent in a gaseous state in contact with the liquid film 101 is removed from an atmosphere in contact with the substrate W by this air flow. Therefore, evaporation (volatilization) of the solvent from the processing liquid on the substrate W is accelerated and, as shown in FIG. 7C, the processing film 100 is formed (solvent evaporating step). In the processing film forming step, the spin motor 23 functions as an evaporation unit (evaporation accelerating unit) for evaporating the solvent in the processing liquid. The spin motor 23 is an example of a processing film forming unit.

In the processing film forming step, the spin motor 23 changes the rotational speed of the substrate W to a predetermined processing film forming speed. The processing film forming speed is, for example, 300 rpm to 1500 rpm. The rotational speed of the substrate W may be kept at a fixed speed in a range of 300 rpm to 1500 rpm. The rotational speed may be changed in a range of 300 rpm to 1500 rpm whenever necessary in the middle of the processing film forming step. The processing film forming step is executed for a predetermined time of, for example, seconds.

Unlike the above-described substrate processing, in the processing film forming step, the processing liquid may not be removed by a centrifugal force and the processing film 100 may be formed only by evaporation of the solvent. In this case, it is possible to suppress the amount of the processing liquid to be consumed.

Next, the heating strengthening processing to strengthen the heating applied to the processing film 100 is performed, thereby executing the etching facilitating step (Step S4) which facilitates the etching at the surface layer portion of the substrate W.

Figure 7D:
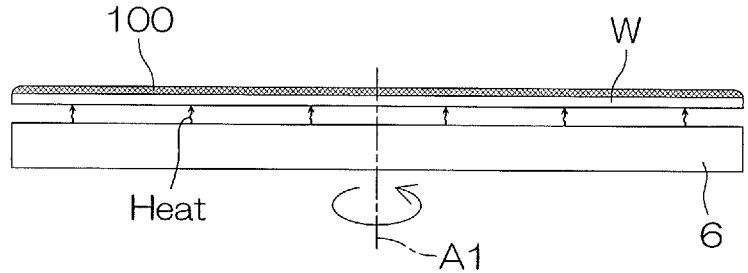
FIG. 7D is a schematic view for describing conditions of an etching facilitating step (Step S4) of the substrate processing.

Specifically, the heater raising/lowering unit 65 positions the heater unit 6 at a heating position. The heating position is, for example, an isolated heating at which the substrate W is heated at a positioned isolated from the lower surface of the substrate W. Thereby, as shown in FIG. 7D, the processing film 100 is heated via the substrate W by the heater unit 6 (processing film heating step). The heater unit 6 is an example of a processing film heating unit.

Heating of the processing film 100 is started, by which the temperature-responsive polymer develops the etching function to facilitate the etching at the upper surface of the substrate W which is covered with the processing film 100 (etching facilitating step). Specifically, the temperature-responsive polymer releases protons to a liquid component in the processing film 100, thereby facilitating the etching.

During the period when the concentration of protons in a liquid component in the processing film 100 is equal to or higher than a predetermined threshold value (pH is not more than a predetermined threshold value), the etching at the surface layer portion of the substrate W proceeds (etching step). The etching at the surface layer portion of the substrate W proceeds, for example, when the pH value is not more than 4.

Where the etching is completely stopped before the start of heating the processing film 100, the etching facilitating step is also referred to as an etching starting step.

Next, the heating weakening processing which weakens heating applied to the processing film 100 is executed, thereby executing the etching reducing step (Step S5) which reduces the etching at the surface layer portion of the substrate W.

Figure 7E:
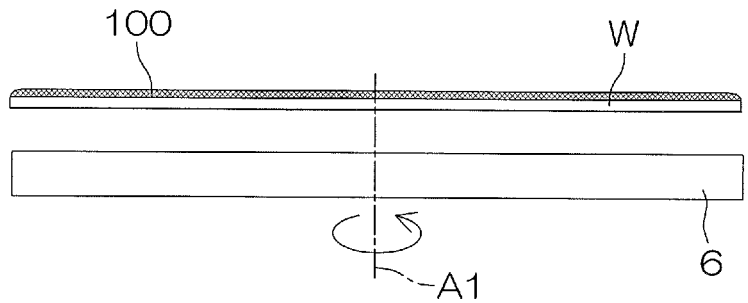
FIG. 7E is a schematic view for describing conditions of an etching reducing step (Step S5) of the substrate processing.

Specifically, the heater raising/lowering unit 65 positions the heater unit 6 at the non-heating position. Thereby, as shown in FIG. 7E, heating of the processing film 100 by the heater unit 6 is stopped (processing film heating stopping step). Thereby, the temperature-responsive polymer is decreased in etching function to reduce the etching at the upper surface of the substrate W which is covered with the processing film 100 (etching reducing step). Specifically, the temperature-responsive polymer receives protons from the liquid component in the processing film 100 to reduce the etching. For example, the pH value becomes larger than 4, by which etching is made at the surface layer portion of the substrate W. Thus, the heater raising/lowering unit 65 is an example of a heating adjusting unit which adjusts the extent of heating of the processing film 100 by the heater unit 6 (processing film heating unit).

Where the heating of the processing film 100 is stopped and the temperature-responsive polymer has completely lost the etching function to result in complete stop of the etching, the etching reducing step is also referred to as an etching stopping step.

Where the etching processing in which the etching facilitating step and the etching reducing step are given as one cycle is executed only once, the processing film removing step (Step S6) is then executed.

On the other hand, where the etching processing is executed in a plural number of times, the etching facilitating step (Step S4) and the etching reducing step (Step S5) are again executed after the etching reducing step (Step S5). The etching facilitating step (Step S4) and the etching reducing step (Step S5) are repeated in a predetermined number of times and, thereafter, the processing film removing step (Step S6) is executed.

Where the etching facilitating step and the etching reducing step are executed in a plural number of times, a first etching facilitating step (Step S4) may be the etching starting step, and a last etching reducing step (Step S5) may be the etching stopping step. That is, before execution of the first etching facilitating step (Step S4) and after execution of the last etching stopping step (Step S5), the etching may be completely stopped.

In the processing film removing step (Step S6), the peeling/removing liquid is supplied to the upper surface (strictly, front surface of processing film 100) of the substrate W, by which the processing film 100 is peeled from the upper surface of the substrate W and removed.

Specifically, the second nozzle moving unit 36 moves the second moving nozzle 10 to the processing position. The processing position of the second moving nozzle 10 is, for example, the central position.

Figure 7F:
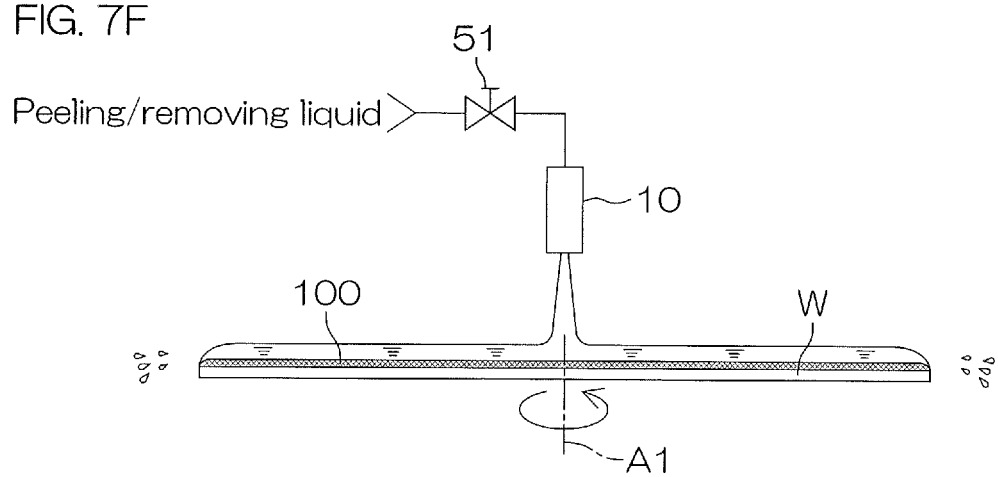
FIG. 7F is a schematic view for describing conditions of a processing film removing step (Step S6) of the substrate processing.
Figure 7G:
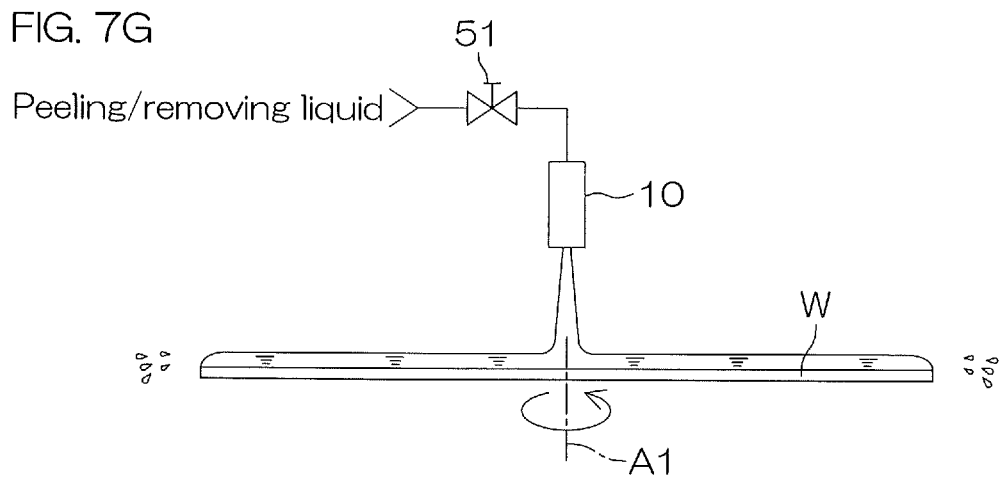
FIG. 7G is a schematic view for describing conditions of the processing film removing step (Step S6).

In a state that the second moving nozzle 10 is positioned at the processing position, the peeling/removing liquid valve 51 is opened. Thereby, as shown in FIG. 7F, the peeling/removing liquid is supplied (discharged) from the second moving nozzle 10 to the central region of the upper surface of the substrate W in a rotating state (peeling/removing liquid supplying step, peeling/removing liquid discharging step). The peeling/removing liquid supplied to the upper surface of the substrate W spreads across the entire substrate W by a centrifugal force. While dissolving the high solubility component in the processing film 100, the peeling/removing liquid supplied to the upper surface of the substrate W reaches an interface between the upper surface of the substrate W and the processing film 100 and enters between the processing film 100 and the upper surface of the substrate W. As shown in FIG. 7G, the peeling/removing liquid is supplied continuously, by which the processing film 100 is peeled from the upper surface of the substrate W and removed (processing film removing step). The second moving nozzle 10 is an example of a processing film removing unit.

In the processing film removing step (Step S6), the substrate W is rotated at a predetermined removing rotational speed of, for example, 800 rpm.

Next, the rinsing step (Step S7) which washes away the peeling/removing liquid from the upper surface of the substrate W is executed. Specifically, the second nozzle moving unit 36 moves the second moving nozzle 10 to the retreat position. Then, the third nozzle moving unit 37 moves the third moving nozzle 11 to the processing position. The processing position of the third moving nozzle 11 is, for example, the central position.

Figure 7H:
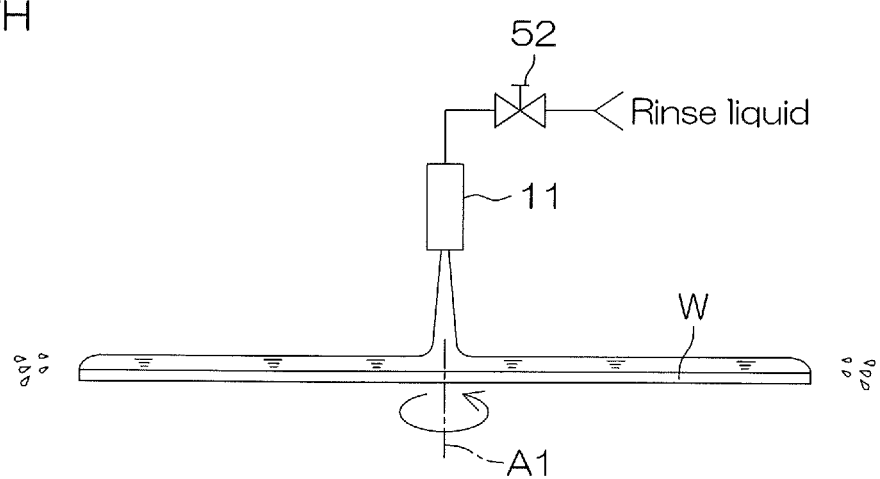
FIG. 7H is a schematic view for describing conditions of a rinsing step (Step S7) of the substrate processing.
Figure 7:
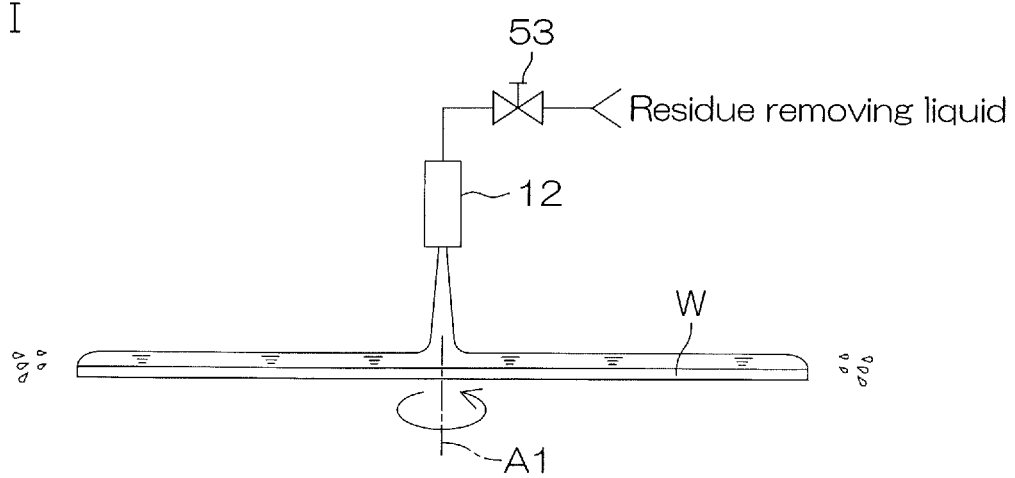
FIG. 7I is a schematic view for describing conditions of a residue removing step (Step S8) of the substrate processing.

Then, in a state that the third moving nozzle 11 is positioned at the processing position, the rinse liquid valve 52 is opened. Thereby, as shown in FIG. 7H, the rinse liquid is supplied (discharged) from the third moving nozzle 11 to the central region of the upper surface of the substrate W in a rotating state (rinse liquid supplying step, rinse liquid discharging step). The rinse liquid supplied to the upper surface of the substrate W spreads across the entire upper surface of the substrate W by a centrifugal force. Thereby, the peeling/removing liquid adhering to the upper surface of the substrate W is expelled to the outside of the substrate W together with the rinse liquid and replaced by the rinse liquid (rinsing step, peeling/removing liquid expelling step).

Supply of the rinse liquid to the upper surface and the lower surface of the substrate W continues for a predetermined time of, for example, 30 seconds. In the rinsing step (Step S7), the substrate W is rotated at a predetermined rinsing rotational speed of, for example, 800 rpm.

Next, the residue removing step (Step S8) is executed in which the residue removing liquid such as an organic solvent is supplied to remove residue of the processing film 100 from the upper surface of the substrate W.

Specifically, the third nozzle moving unit 37 moves the third moving nozzle 11 to the retreat position. Then, the fourth nozzle moving unit 38 moves the fourth moving nozzle 12 to the processing position. The processing position of the fourth moving nozzle 12 is, for example, the central position.

Then, in a state that the fourth moving nozzle 12 is positioned at the processing position, the residue removing liquid valve 53 is opened. Thereby, as shown in FIG. 7I, the residue removing liquid is supplied (discharged) from the fourth moving nozzle 12 to the central region of the upper surface of the substrate W in a rotating state (residue removing liquid supplying step, residue removing liquid discharging step).

The residue removing liquid supplied from the fourth moving nozzle 12 to the upper surface of the substrate W spreads radially by receiving a centrifugal force and spreads across the entire upper surface of the substrate W. Even after the processing film 100 has been peeled from the substrate W by the peeling/removing liquid and removed from the substrate W, residue of the processing film 100 may remain on the upper surface of the substrate W. The residue removing liquid supplied to the upper surface of the substrate W dissolves the above-described residue of the processing film 100 (residue dissolving step). The residue removing liquid which dissolves the residue of the processing film 100 is expelled by a centrifugal force from a peripheral edge of the upper surface of the substrate W. Thereby, the residue of the processing film 100 on the substrate W is removed (residue removing step).

In the residue removing liquid supplying step, discharge of the residue removing liquid from the fourth moving nozzle 12 continues for a predetermined time of, for example, 30 seconds. In the residue removing step (Step S8), the substrate W is rotated at a predetermined residue removing rotational speed of, for example, 300 rpm.

Next, the spin drying step (Step S9) to rotate the substrate W at a high speed so as to dry the upper surface of the substrate W is executed. Specifically, the residue removing liquid valve 53 is closed. Thereby, supply of the residue removing liquid to the upper surface of the substrate W is stopped. Then, the fourth nozzle moving unit 38 moves the fourth moving nozzle 12 to the home position.

Then, the spin motor 23 accelerates the rotation of the substrate W to rotate the substrate W at a high speed. In the spin drying step, the substrate W is rotated at a drying speed of, for example, 1500 rpm. The spin drying step is executed for a predetermined time of, for example, seconds. Thereby, a large centrifugal force is applied to the residue removing liquid on the substrate W, and the residue removing liquid on the substrate W is spun off around the substrate W.

Then, the spin motor 23 stops the rotation of the substrate W. The guard raising/lowering unit 74 moves the first guard 71A and the second guard 71B to the lower position.

The transfer robot CR enters the processing unit 2, lifts up the processed substrate W from the chuck pin 20 of the spin chuck 5, and carries it to the outside of the processing unit 2 (Step S10). The substrate W is transferred from the transfer robot CR to the transfer robot IR and housed in the carrier C by the transfer robot IR.

Next, with reference to FIG. 8A to FIG. 8F, a detailed description will be given of conditions of an upper surface 151 of the substrate W during the substrate processing. FIG. 8A to FIG. 8F are each a schematic view for describing conditions near the upper surface 151 of the substrate W during the substrate processing. In FIG. 8B and FIG. 8C, for the sake of convenience of description, a dimensional relationship between the heater unit 6 and the substrate W is changed from that shown in FIG. 2 (the same shall apply to FIG. 15B and FIG. 15C to be described later).

Figure 8A:
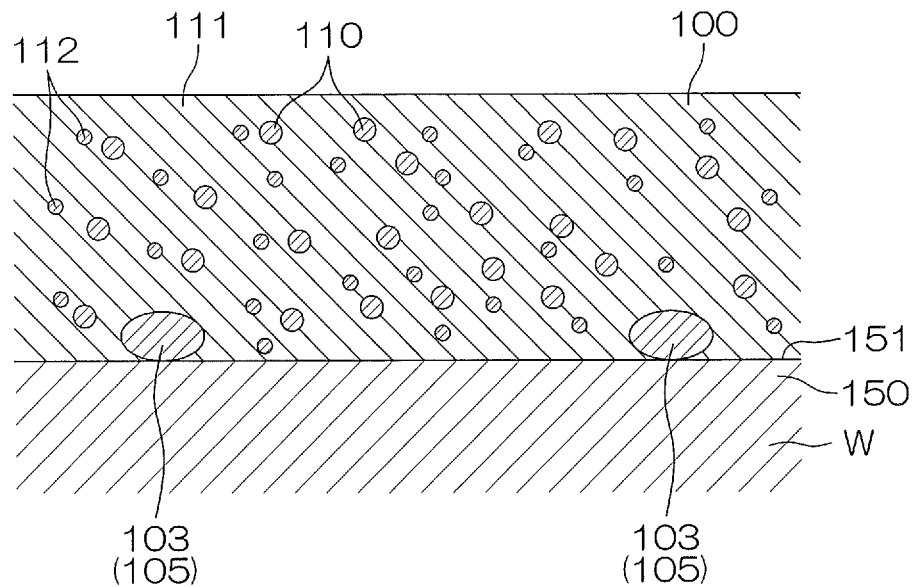
FIG. 8A is a schematic view for describing conditions near a front surface of a substrate during the substrate processing.
Figure 8B:
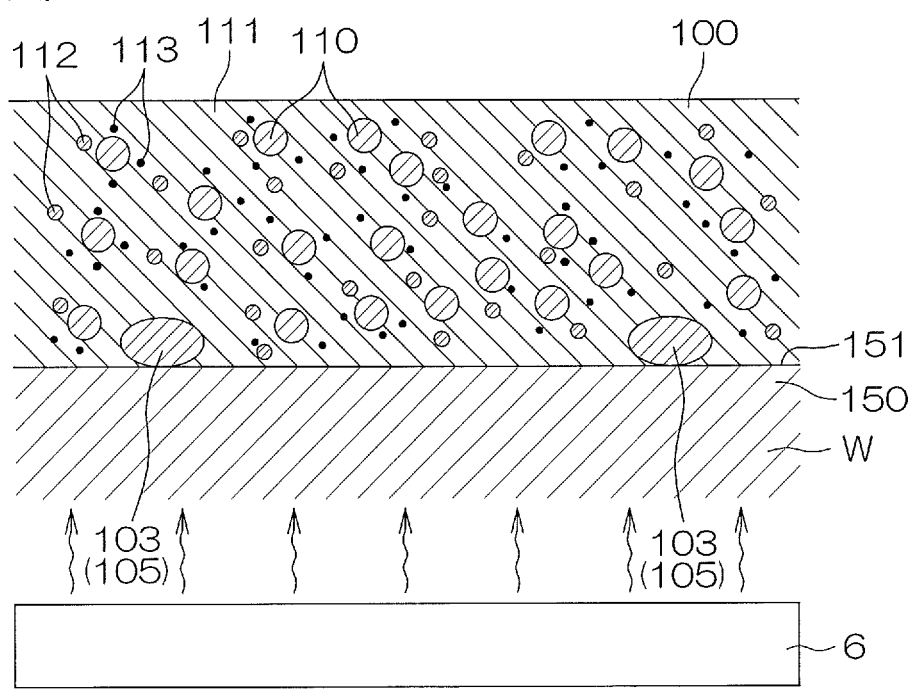
FIG. 8B is a schematic view for describing conditions near the front surface of the substrate during the substrate processing.
Figure 8C:
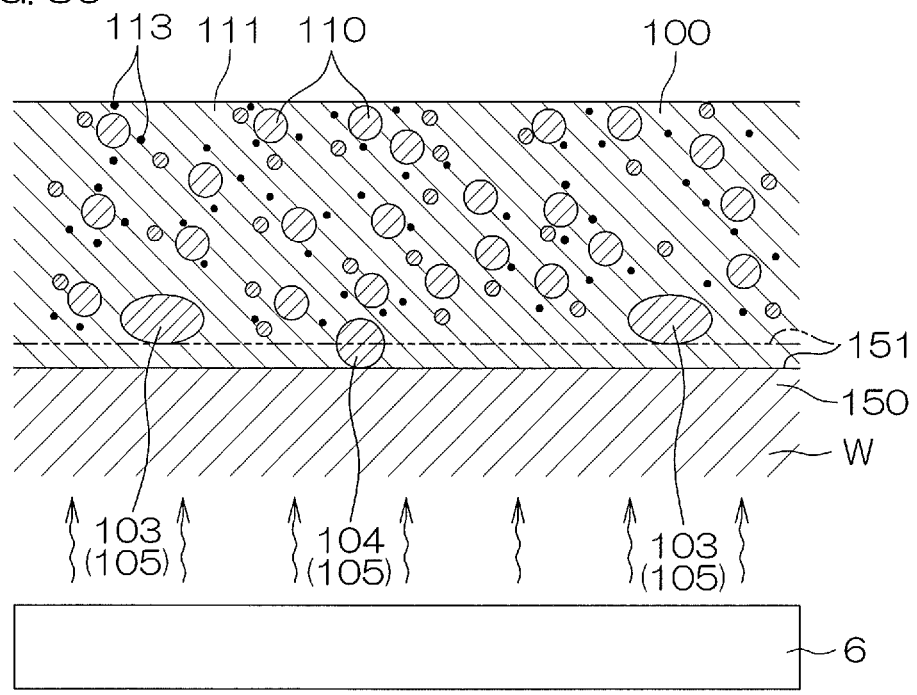
FIG. 8C is a schematic view for describing conditions near the front surface of the substrate during the substrate processing.

As shown in FIG. 8A, the processing film 100 formed in the processing film forming step (Step S3) holds particles 103 adhering to a surface layer portion 150 of the substrate W. Before the etching function developing processing is performed, the processing film 100 contains a temperature-responsive polymer 110, a low solubility component 111, and a high solubility component 112. The temperature-responsive polymer 110, the low solubility component 111, and the high solubility component 112 are made in a solid state by at least partial evaporation of the solvent which is contained in the processing liquid.

The temperature-responsive polymer 110, the low solubility component 111, and the high solubility component 112 are present in a mixed state in the processing film 100. Specifically, the processing film 100 does not have the temperature-responsive polymer 110, the low solubility component 111, and the high solubility component 112 uniformly distributed across the entire processing film 100. The processing film 100 has a portion where the temperature-responsive polymer 110 is locally present, a portion where the low solubility component 111 is locally present and a portion where the high solubility component 112 is locally present.

Next, with reference to FIG. 8B, protons 113 are released from the temperature-responsive polymer 110 by the heating strengthening processing. In detail, etching at the surface layer portion 150 of the substrate W is facilitated by the protons 113 released in the processing film 100 (etching facilitating step). Due to the occurrence (increase) of the protons 113, the liquid component in the processing film 100 is increased in acidity, by which the etching at the surface layer portion 150 of the substrate W proceeds. As the etching proceeds, the upper surface 151 of the substrate W recedes.

As shown in FIG. 8C, the upper surface 151 of the substrate W recedes (etching of surface layer portion 150 of substrate W), by which the particles 103 rise up from the upper surface 151 of the substrate W. Thereby, the particles 103 are wrapped by the processing film 100 (in particular, low solubility component 111) and held more firmly. Etching is made at the surface layer portion 150 of the substrate W to form etching residue 104. The processing film 100 (in particular, low solubility component 111) holds the etching residue 104 together with the particles 103 that have been adhering to the upper surface 151 of the substrate W since before the etching step. The particles 103 and the etching residue 104 are collectively referred to as objects 105 to be removed.

Figure 8D:
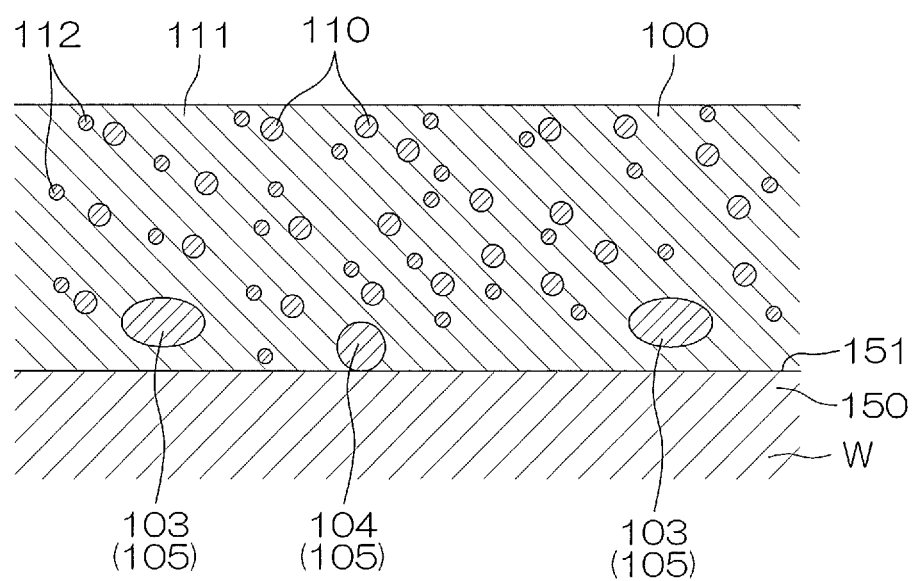
FIG. 8D is a schematic view for describing conditions near the front surface of the substrate during the substrate processing.

Next, with reference to FIG. 8D, by the heating weakening processing, the temperature-responsive polymer 110 receives the protons 113 present in the liquid component in the processing film 100. The protons 113 in the processing film 100 are decreased to weaken the acidity of the liquid component in the processing film 100. That is, the pH of the liquid component in the processing film 100 comes close to neutral. Thereby, the etching at the surface layer portion 150 of the substrate W is reduced (etching reducing step). The etching is reduced, by which receding of the upper surface of the substrate W is reduced or stopped.

Figure 8E:
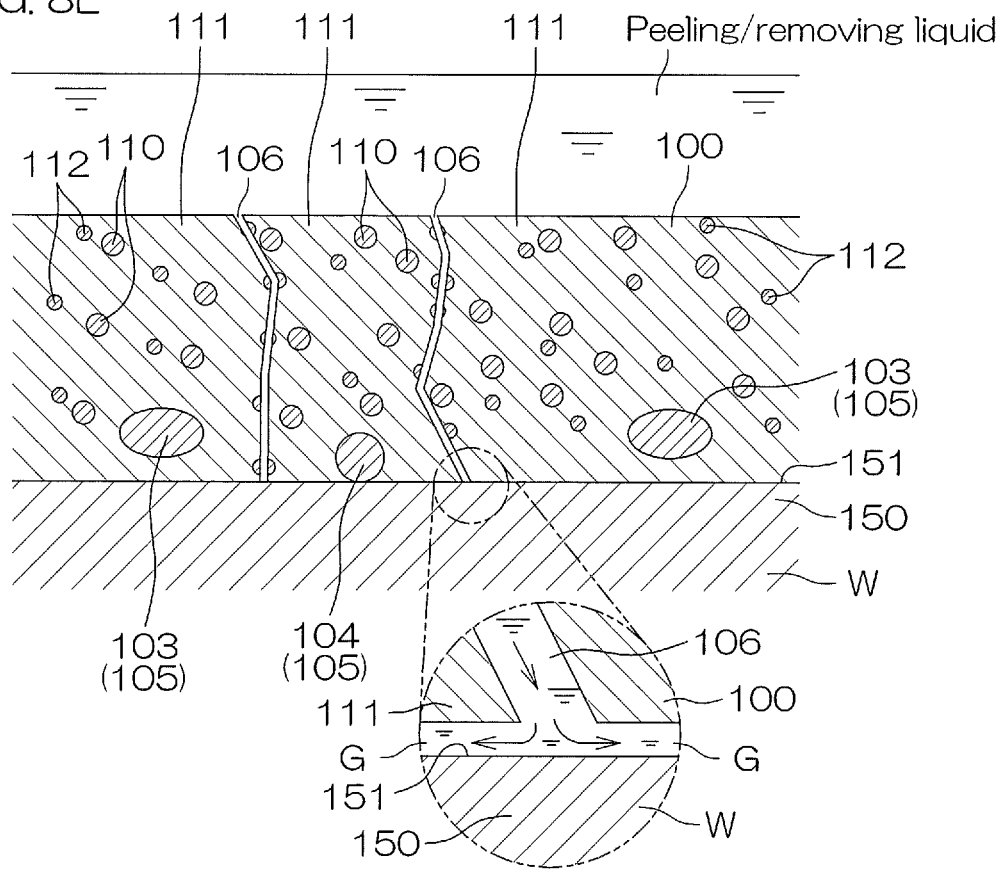
FIG. 8E is a schematic view for describing conditions near the front surface of the substrate during the substrate processing.

Next, with reference to FIG. 8E, the high solubility component 112 is selectively dissolved by the peeling/removing liquid. That is, the processing film 100 is partially dissolved (dissolution step, partial dissolution step).

"The high solubility component 112 in a solid state is selectively dissolved" does not mean that only the high solubility component 112 in a solid state is dissolved. "The high solubility component 112 in a solid state is selectively dissolved" means that although the low solubility component 111 in a solid state is also slightly dissolved, the high solubility component 112 in a solid state is mostly dissolved.

In response to the selective dissolution of the high solubility component 112, a through hole 106 is formed at a portion of the processing film 100 where the high solubility component 112 is locally present (through hole forming step).

At the proton where the high solubility component 112 is locally present, not only is the high solubility component 112 present but also the low solubility component 111 is present. The peeling/removing liquid not only dissolves the high solubility component 112 but also dissolves the low solubility component 111 around the high solubility component 112, thereby forming the through hole 106. The through hole 106 has a size that is, for example, several nanometers in diameter in a plan view.

The through hole 106 does not have to be formed clearly so as to be observable. That is, the through hole 106 is such that a channel for moving the peeling/removing liquid from an upper surface of the processing film 100 to the upper surface 151 of the substrate may be formed in the processing film 100 and the channel may penetrate through the processing film 100, as a whole.

Here, where the solvent remains appropriately in the processing film 100, the peeling/removing liquid partially dissolves the processing film 100, while being dissolved into the solvent that remains in the processing film 100. In detail, the peeling/removing liquid dissolves the high solubility component 112 in the processing film 100, while being dissolved in the solvent remaining in the processing film 100, thereby forming the through hole 106. Therefore, the peeling/removing liquid easily enters into the processing film 100 (dissolution entry step).

The peeling/removing liquid which has reached the upper surface of the substrate W acts on an interface between the processing film 100 and the substrate W, thereby peeling the processing film 100 and removing the thus-peeled processing film 100 from the upper surface of the substrate W (peeling/removing step).

In detail, the low solubility component 111 is low in solubility with respect to the peeling/removing liquid and the low solubility component 111 is mostly kept in a solid state. Therefore, the peeling/removing liquid which has reached the vicinity of the upper surface 151 of the substrate W via the through hole 106 slightly dissolves a portion of the low solubility component 111 near the upper surface 151 of the substrate W. Thereby, as shown in an enlarged view of FIG. 8E, the peeling/removing liquid enters a gap G between the processing film 100 and the upper surface of the substrate W, while gradually dissolving the low solubility component 111 in a solid state near the upper surface of the substrate W (peeling/removing liquid entry step).

Figure 8F:
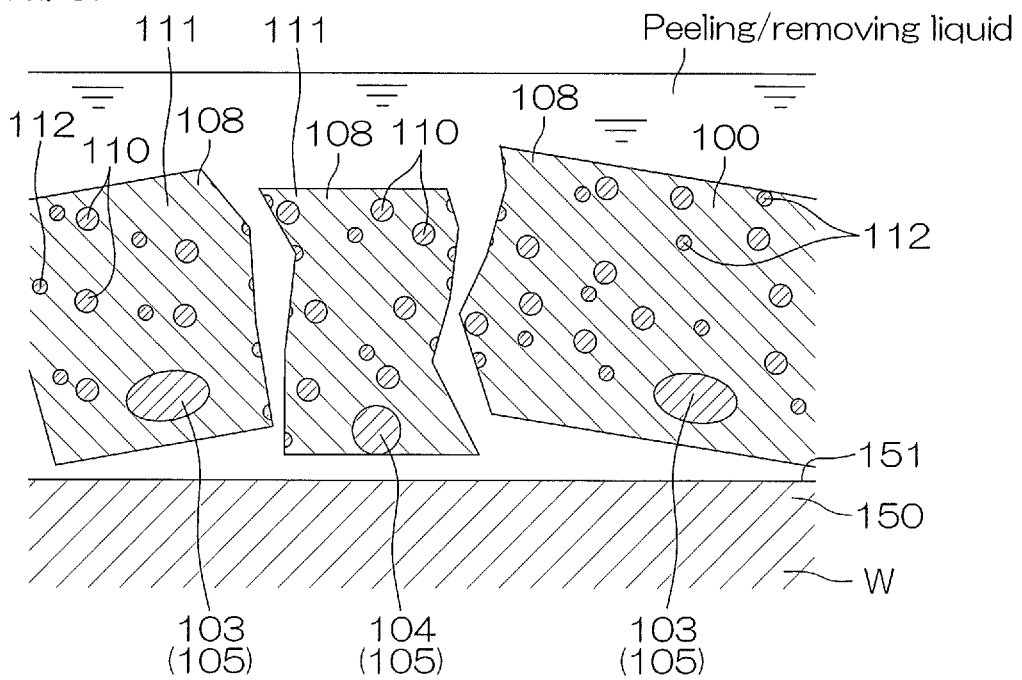
FIG. 8F is a schematic view for describing conditions near the front surface of the substrate during the substrate processing.

Then, for example, cracks are formed in the processing film 100, with a peripheral edge of the through hole 106 as a starting point. Therefore, the high solubility component 112 is also referred to as a crack occurring component. The processing film 100 is split by formation of cracks and made into film fragments 108. As shown in FIG. 8F, the film fragments 108 of the processing film 100 are peeled from the substrate W in a state that the objects 105 to be removed are held (processing film splitting step, processing film peeling step).

Then, the peeling/removing liquid is continuously supplied, by which the processing film 100 made into the film fragments 108 is washed away by the peeling/removing liquid in a state that the objects 105 to be removed are held. In other words, the film fragments 108 which hold the objects 105 to be removed are pushed outside the substrate W and removed from the upper surface 151 of the substrate W (processing film removing step, removal objects removing step). Thereby, it is possible to favorably clean the upper surface of the substrate W.

The low solubility component 111 functions as a solid-state keeping component which keeps a solid state in the processing film 100 for a period of time from formation of the processing film 100 to supply of the peeling/removing liquid.

The first preferred embodiment provides the following effects.

According to the first preferred embodiment, the processing film 100 is subjected to the heating strengthening processing (etching function developing processing), thereby facilitating the etching at the surface layer portion 150 of the substrate W by the processing film 100. Then, the processing film 100 is subjected to the heating weakening processing (etching function eliminating processing), thereby reducing the etching at the surface layer portion 150 of the substrate W by the processing film 100 in a state that the processing film 100 is kept on the substrate W.

The etching at the surface layer portion 150 of the substrate W by the processing film 100 is not started at the time of formation of the processing film 100, but is facilitated in response to the heating strengthening processing applied to the processing film 100. Then, it is not necessary to remove the processing film 100 for reducing the etching, and in response to the heating weakening processing applied to the processing film 100 in a state that the processing film 100 is kept on the substrate W, etching is reduced. Since the start and stop of etching are in response to active processing that changes the strength of the heating, it is easy to control the timing of facilitating the etching and the timing of reducing the etching. That is, according to the processing applied to the processing film 100, it is possible to switch between a state in which the etching is facilitated and that in which the etching is reduced. Therefore, it is easy to control the timing of facilitating the etching and the timing of reducing the etching. Consequently, it is possible to improve controllability of the etching at the surface layer portion 150 of the substrate W.

Unlike this method, according to a method in which the etching liquid such as fluoric acid is continuously supplied to the upper surface 151 of the substrate W while etching is made at the surface layer portion 150 of the substrate W, the etching liquid is expelled one after another to the outside of the substrate W. By contrast thereto, in the first preferred embodiment, etching is made at the surface layer portion 150 of the substrate W by the processing film 100, with the processing film 100 kept on the substrate W. Therefore, it is possible to decrease the amount of a functioning component to be consumed.

Further, according to the first preferred embodiment, in the processing film forming step, formed is the processing film 100 which contains a function developing component to develop the etching function by the heating strengthening processing. Therefore, etching is made at the surface layer portion 150 of the substrate W by the processing film 100 having the function developing component in an adjusted amount thereof, which makes it possible to control the amount of etching at the surface layer portion 150 of the substrate W.

Further, according to the first preferred embodiment, the temperature-responsive polymer 110 which is a function developing component strengthens heating applied to the processing film 100, thereby releasing protons and weakens the heating applied to the processing film 100, thereby receiving the protons. The temperature-responsive polymer 110 releases the protons by the heating strengthening processing, thereby facilitating the etching at the surface layer portion 150 of the substrate W. Protons are imparted to the temperature-responsive polymer 110 by the heating weakening processing, thereby reducing the etching at the surface layer portion 150 of the substrate W.

The protons 113 released from the temperature-responsive polymer 110 increase the acidity of the processing film 100. Therefore, the protons 113 that are released from and received by the temperature-responsive polymer 110 make it possible to control that the etching at the surface layer portion 150 of the substrate W is facilitated and reduced.

Further, according to the first preferred embodiment, the peeling/removing liquid is supplied to the front surface of the processing film 100 to remove the processing film 100 from the upper surface 151 of the substrate W. The processing film 100 is removed by the peeling/removing liquid, and the upper surface 151 of the substrate W can be, thereby, cleaned.

Further, according to the first preferred embodiment, the processing film 100 is not removed by being dissolved but removed by being peeled. Therefore, where the objects 105 to be removed adhere to the upper surface 151 of the substrate W, the processing film 100 is peeled from the upper surface of the substrate W in a state that the objects 105 to be removed are held. As a result, it is possible to detach the objects 105 from the upper surface 151 of the substrate W and remove them.

Still further, according to the first preferred embodiment, the processing film 100 contains the low solubility component 111 in a solid state, and the high solubility component 112 in a solid state which is higher in solubility with respect to the peeling/removing liquid than the low solubility component 111. Then, the high solubility component 112 is selectively dissolved in the peeling/removing liquid, with the low solubility component 111 kept in a solid state, by which the processing film 100 is peeled from the upper surface 151 of the substrate W.

Therefore, the high solubility component 112 in a solid state is dissolved in the peeling/removing liquid, thereby allowing the peeling/removing liquid to act on a contact interface between the processing film 100 and the substrate W. On the other hand, most of the low solubility component 111 in the processing film 100 is not dissolved but kept in a solid state. Consequently, where the objects 105 to be removed are present on the upper surface 151 of the substrate W, while the objects 105 are held by the low solubility component 111 in a solid state, the peeling/removing liquid is allowed to act on a contact interface between the low solubility component 111 in a solid state and the substrate W. As a result, it is possible to quickly remove the processing film 100 from the upper surface 151 of substrate W and efficiently remove the objects 105 together with the processing film 100 from the upper surface 151 of the substrate W.

Since the low solubility component 111 is kept in a solid state, it is possible to hold the objects 105 to be removed by the low solubility component 111 even after the high solubility component 112 is dissolved. Also, when the processing film 100 is removed from the upper surface 151 of the substrate W by the peeling/removing liquid, it is possible to keep a state that the objects 105 to be removed are held by the processing film 100. Therefore, as compared with a case where the objects 105 to be removed are not held by the low solubility component 111, it is possible to increase an energy (physical force) that the objects 105 to be removed receive from a flow of the peeling/removing liquid. As a result, it is possible to effectively remove the objects 105 from the upper surface 151 of the substrate W by the peeling/removing liquid.

Further, according to the first preferred embodiment, etching is made at the surface layer portion 150 of the substrate W to form the etching residue 104 that is held by the processing film 100. In a state that the etching residue 104 generated by the etching is held by the processing film 100, the etching residue 104 is removed together with the processing film 100. Therefore, there is no need to separately perform processing to remove the etching residue 104 after removal of the processing film 100.

Where the etching processing in which the etching facilitating step and the etching reducing step are given as one cycle is executed in a plural number of cycles, it is possible to accurately control the etching amount at the surface layer portion 150 of the substrate W by the number of cycles of the etching processing that is executed.

Figure 9:
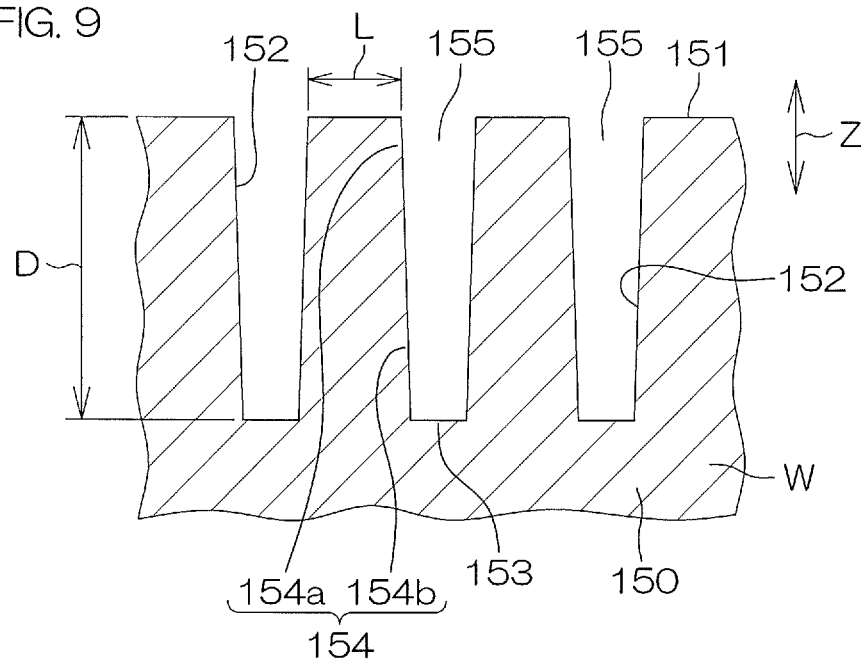
FIG. 9 is a schematic view for describing a structure of the substrate having a trench on the front surface thereof.

As shown in FIG. 9, a plurality of trenches 152 may be formed on the upper surface 151 of the substrate W that is used in the substrate processing according to the first preferred embodiment. Each of the trenches 152 is formed in a circular shape, for example, as viewed in a plan view in a normal direction Z of the upper surface 151 of the substrate W (hereinafter, simply referred to as "in a plan view"). The trenches 152 are disposed at an equal interval, and a distance L between the trenches 152 adjacent to each other is, for example, 2 μm. A depth D of each of the trenches 152 is, for example, 5 μm.

Each of the trenches 152 has a bottom wall 153 and a cylindrical side wall 154 which is connected to the bottom wall 153 and extends in a depth direction (normal direction Z) of the trench 15. The plurality of trenches 152 are formed, for example, by a dry etching. Therefore, each of the trenches 152 is formed in a tapered shape which is narrowed toward the bottom wall 153. The side wall 154 includes an opening side portion 154a which demarcates an opening 155 of the trench 152 and a bottom wall side portion 154b which is connected to the opening side portion 154a and the bottom wall 153.

Next, with reference to FIG. 10A to FIG. 10C, a description will be given of conditions of the surface layer portion 150 of the substrate W near the trench 152 during the substrate processing.

Figure 10A:
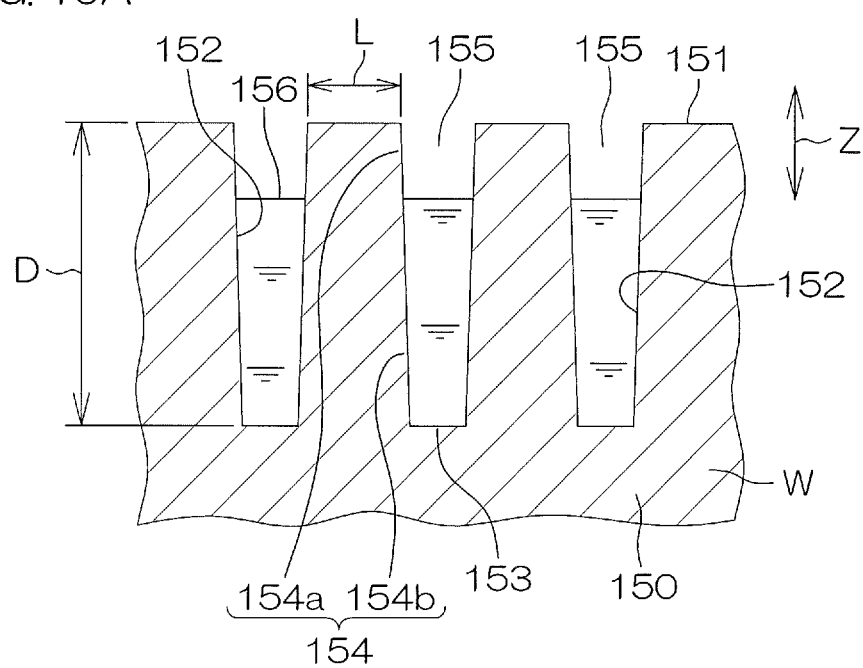
FIG. 10A is a schematic view for describing conditions of a surface layer portion of the substrate near the trench of the substrate during the processing film forming step (Step S3).

As show in FIG. 10A, in the processing film forming step (Step S3), a liquid level 156 of the processing liquid moves toward the bottom wall 153 of the trench 152 along with evaporation of the solvent in the processing liquid. When the solvent in the processing liquid is further evaporated, as shown in FIG. 10B, the processing film 100 is formed so as to cover the bottom wall 153 and the bottom wall side portion 154b inside each of the trenches 152. In order to form the processing film 100 which covers the bottom wall 153 and the bottom wall side portion 154b of the trench 152, a rotational speed (processing film forming speed) of the substrate W in the processing film forming step is preferably 1500 rpm, and a viscosity of the processing liquid is preferably lower than 3.4 mm$^2$/s.

When the processing film 100 which covers the bottom wall 153 and the bottom wall side portion 154b is formed, etching is made at the surface layer portion 150 of the substrate W in the bottom wall 153 and the bottom wall side portion 154b of the trench 152 by the subsequent etching processing. Thereby, as shown by a solid line in FIG. 10C, the trench 152 can be increased in width only in the vicinity of the bottom wall 153 inside the trench 152. Where the trench 152 is formed in a tapered shape, the trench 152 is increased in width in the vicinity of the bottom wall 153, by which the trench 152 can be made closer to a circular cylindrical shape. FIG. 10C shows a state after removal of the processing film 100. The etching at the surface layer portion 150 of the substrate W by the processing film 100 and details of removal of the processing film 100 are the same as those shown in FIG. 8A to FIG. 8F.

As described above, the processing film 100 is formed only on the bottom wall 153 inside the trench 152 and in the vicinity thereof, which makes it possible to control a size of the region to be etched (etching region) inside the trench 152.

Second Preferred Embodiment

Figure 11:
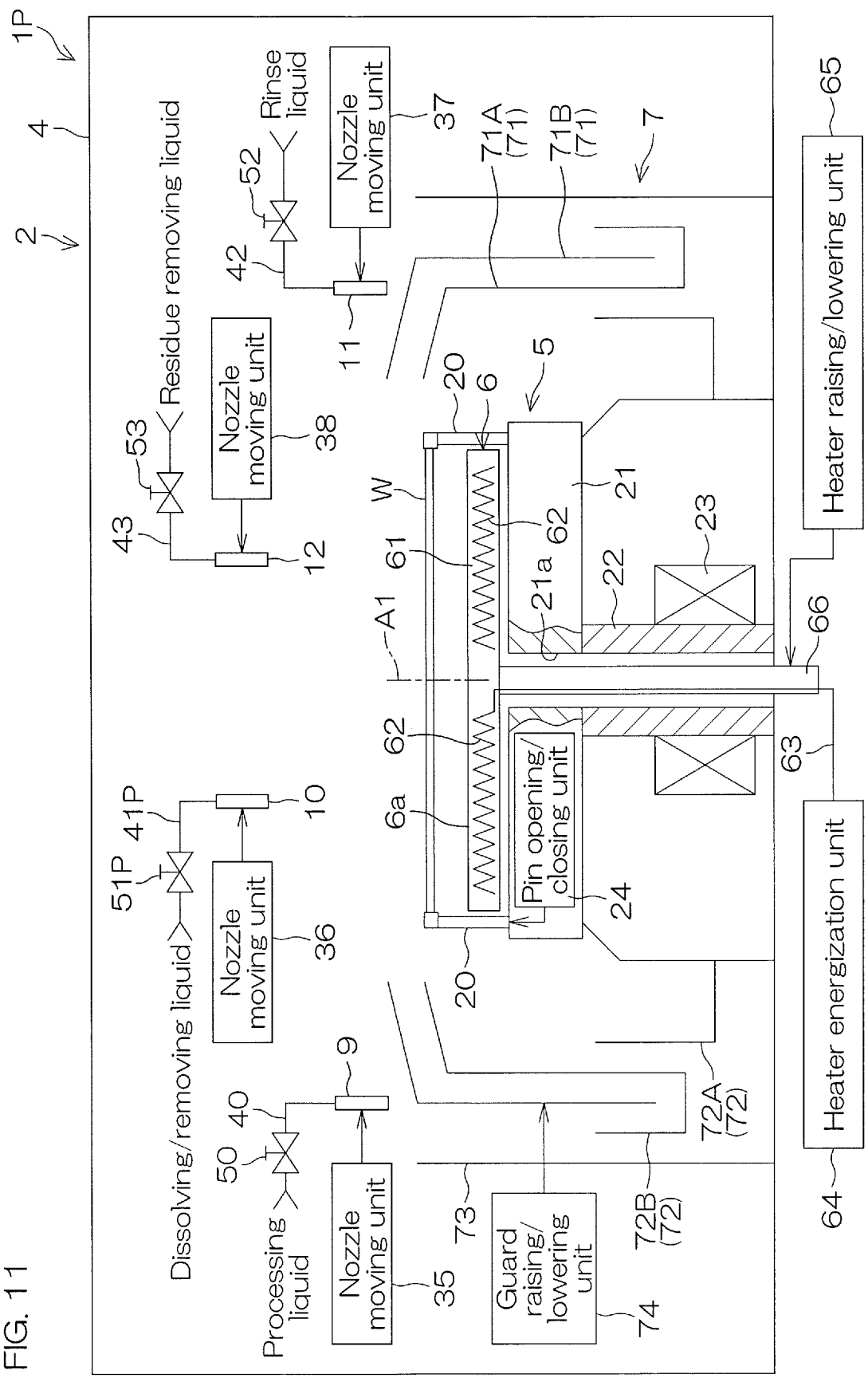
FIG. 11 is a schematic partial cross-sectional view which shows a general arrangement of a processing unit included in a substrate processing apparatus according to a second preferred embodiment.

FIG. 11 is a schematic partial cross-sectional view which shows a general arrangement of a processing unit 2 included in a substrate processing apparatus 1P according to the second preferred embodiment. The substrate processing apparatus 1P according to the second preferred embodiment is different from the substrate processing apparatus 1 (refer to FIG. 2) according to the first preferred embodiment mainly in that a processing liquid does not contain a high solubility component as a solute, and a second moving nozzle 10 is arranged so as to discharge a dissolving/removing liquid for dissolving a processing film in place of a peeling/removing liquid.

Figure 12:
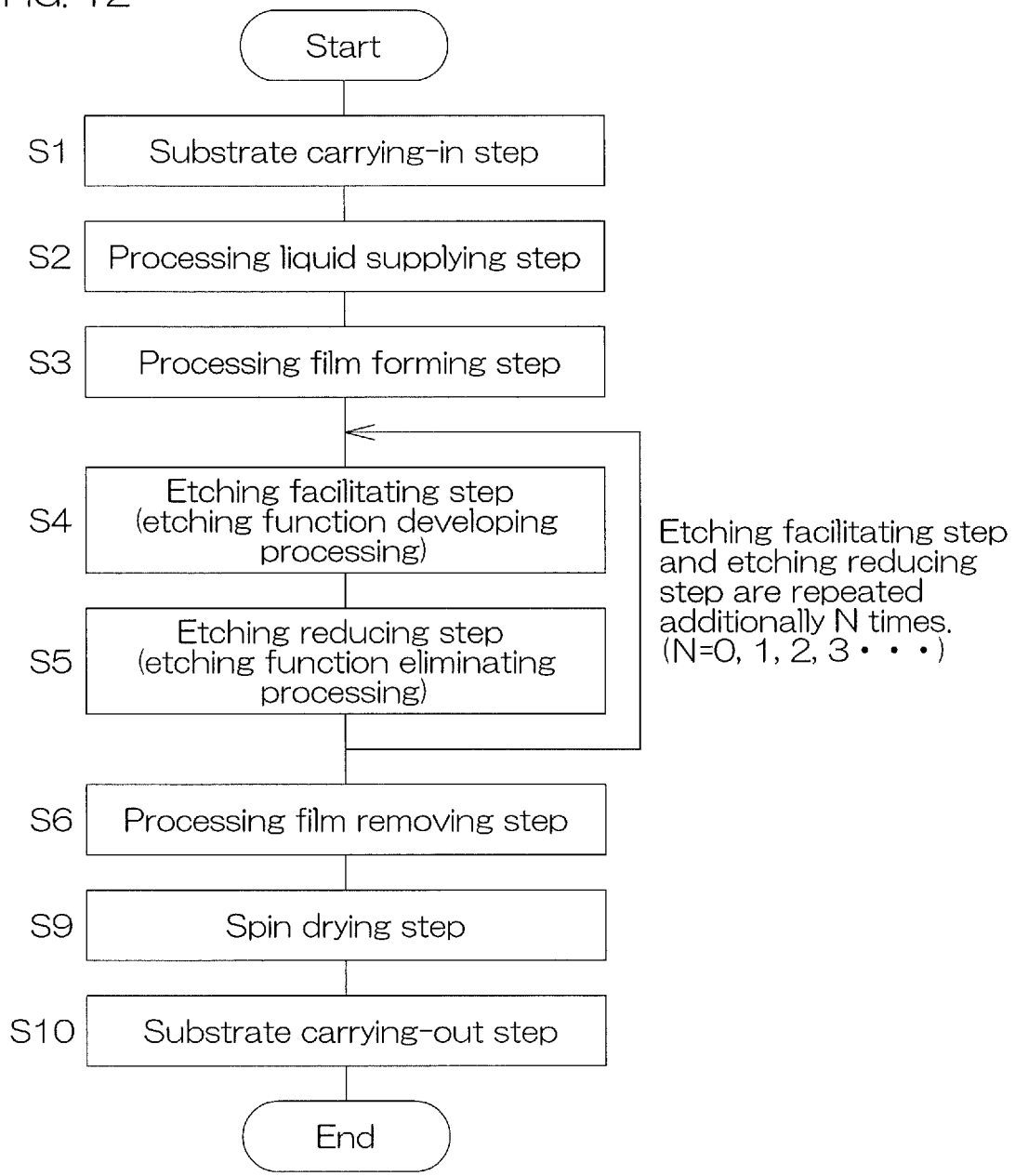
FIG. 12 is a flowchart for describing an example of substrate processing by a substrate processing apparatus according to the second preferred embodiment.

In FIG. 11, an arrangement equivalent to that shown in FIG. 1 to FIG. 10C described previously shall be given the same reference sign as that of FIG. 1, with a description thereof omitted (the same shall apply to FIG. 12 to FIG. 13E which will be described later).

Like the first preferred embodiment, the processing liquid contains a solute and a solvent. The processing liquid is solidified or cured by at least partial volatilization (evaporation) of the solvent contained in the processing liquid. The processing liquid is solidified or cured on a substrate W to form the processing film in a solid-state. When the processing liquid is solidified or cured, the processing film incorporates therein objects to be removed present on the substrate W and holds them.

The processing liquid contains a function developing component and a low solubility component as the solute. Also in the second preferred embodiment, as with the first preferred embodiment, the function developing component is a temperature-responsive polymer which has plural types of constituent units. The low solubility component is, for example, novolak.

The dissolving/removing liquid discharged from the second moving nozzle 10 is, for example, an organic solvent such as IPA. The dissolving/removing liquid is not limited to IPA. As the dissolving/removing liquid, a liquid given as the solvent that is contained in the processing liquid may be used.

The second moving nozzle 10 is connected to a dissolution removing liquid piping 41P to guide the dissolving/removing liquid into the second moving nozzle 10. When a dissolution removing liquid valve 51P interposed in the dissolution removing liquid piping 41P is opened, the dissolution removing liquid is continuously discharged downward from a discharge port of the second moving nozzle 10. When the second moving nozzle 10 is positioned at a central position and the dissolution removing liquid valve 51P is opened, the dissolving/removing liquid is supplied to a central region of an upper surface of the substrate W.

The substrate processing apparatus 1P according to the second preferred embodiment can also execute the same substrate processing as the substrate processing (refer to FIG. 6) according to the first preferred embodiment. In the second preferred embodiment, a processing film 100 is dissolved and removed by the dissolution removing liquid. And, therefore, as shown in FIG. 12, it is also possible to omit the rinsing step (Step S7) and the residue removing step (Step S8).

Next, with reference to FIG. 13A to FIG. 13E, a detailed description will be given of conditions of an upper surface 151 of the substrate W during the substrate processing according to the second preferred embodiment. FIG. 13A to FIG. 13E are each a schematic view for describing conditions near the upper surface 151 of the substrate W during the substrate processing.

Figure 13A:
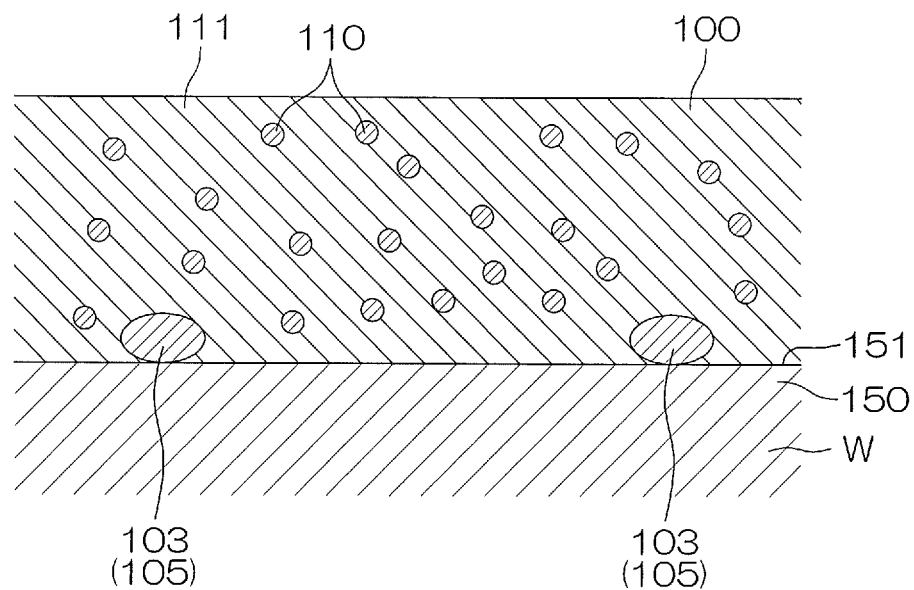
FIG. 13A is a schematic view for describing conditions in which a processing film is removed from a front surface of a substrate in the substrate processing according to the second preferred embodiment.

As show in FIG. 13A, the processing film 100 which formed in the processing film forming step (Step S3) holds particles 103 adhering to a surface layer portion 150 of the substrate W. Before the etching function developing processing is performed, the processing film 100 contains a temperature-responsive polymer 110 and a low solubility component 111. The temperature-responsive polymer 110 and the low solubility component 111 are made in a solid state by at least partial evaporation of the solvent contained in the processing liquid.

The processing film 100 has the temperature-responsive polymer 110 and the low solubility component 111 in a mixed state. Specifically, the processing film 100 does not have the temperature-responsive polymer 110 and the low solubility component 111 uniformly distributed across the entire processing film 100. The processing film 100 has a portion where the temperature-responsive polymer 110 is locally present and a portion where the low solubility component 111 is locally present.

Figure 13B:
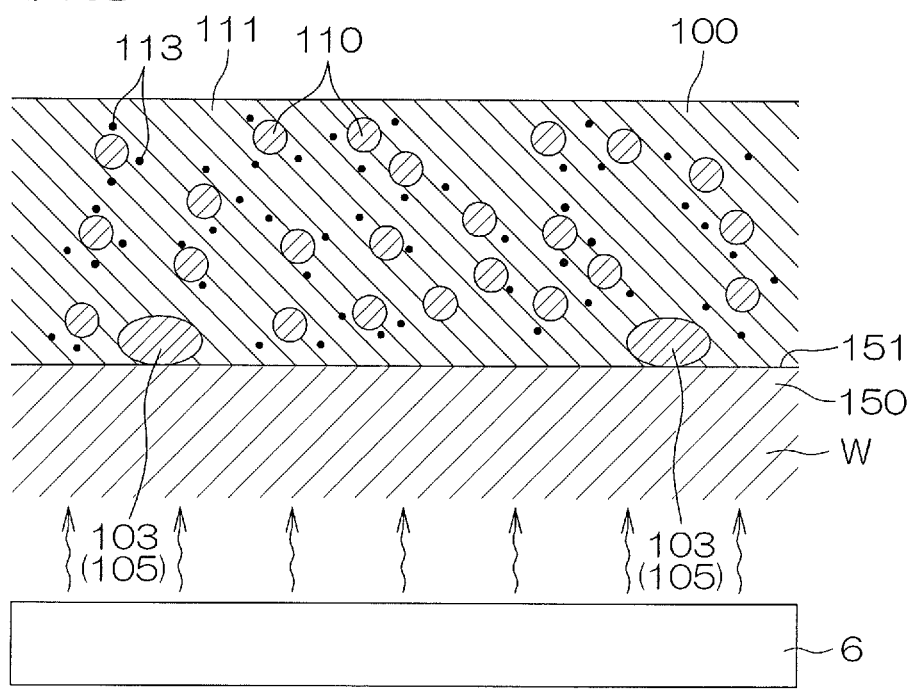
FIG. 13B is a schematic view for describing conditions near the front surface of the substrate during the substrate processing according to the second preferred embodiment.

Next, with reference to FIG. 13B, protons 113 are released from the temperature-responsive polymer 110 by heating strengthening processing. In detail, etching at the surface layer portion 150 of the substrate W is facilitated by the protons 113 released in the processing film 100 (etching facilitating step). Due to the occurrence (increase) of the protons 113, the liquid component in the processing film 100 is increased in acidity, by which the etching at the surface layer portion 150 of the substrate W proceeds. As the etching proceeds, the upper surface 151 of the substrate W recedes.

Figure 13C:
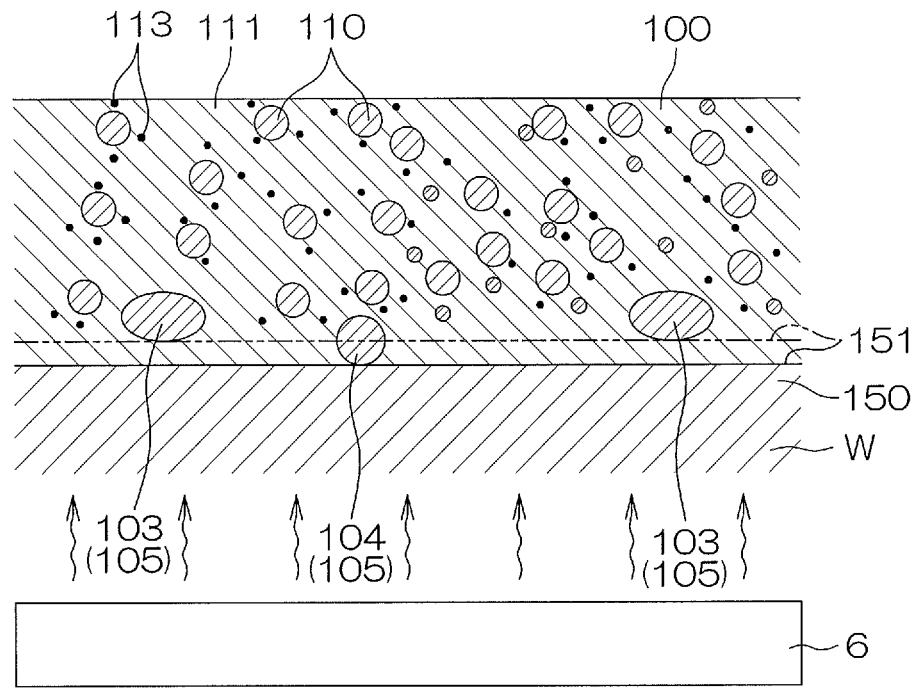
FIG. 13C is a schematic view for describing conditions near the front surface of the substrate during the substrate processing according to the second preferred embodiment.

As shown in FIG. 13C, the upper surface 151 of the substrate W recedes (etching of surface layer portion 150 of substrate W). Thereby, the particles 103 are held more firmly by the processing film 100 (in particular, low solubility component 111) by which the particles 103 rise up from the upper surface 151 of the substrate W. Etching is made at the surface layer portion 150 of the substrate W to form etching residue 104. The processing film 100 (in particular, low solubility component 111) holds the etching residue 104 together with the particles 103 that have been adhering to the upper surface of the substrate W since before the etching step.

Figure 13D:
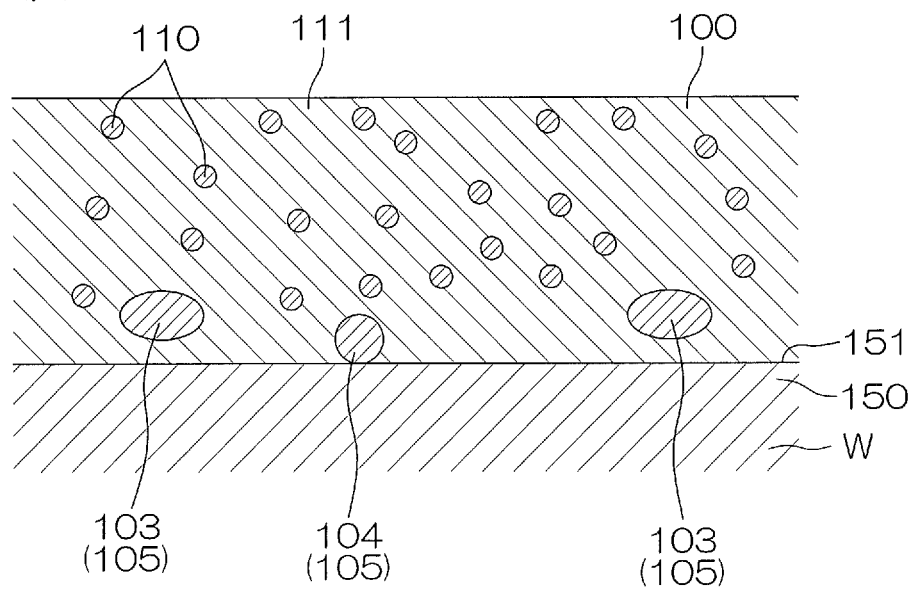
FIG. 13D is a schematic view for describing conditions near the front surface of the substrate during the substrate processing according to the second preferred embodiment.

Next, with reference to FIG. 13D, the temperature-responsive polymer 110 receives the protons 113 present in the liquid component in the processing film 100 by heating weakening processing. The protons 113 in the processing film 100 are decreased to weaken the acidity of the liquid component in the processing film 100. That is, the pH of the liquid component in the processing film 100 comes close to neutral. Thereby, the etching at the surface layer portion 150 of the substrate W is stopped (etching stopping step). The etching is stopped, by which receding of the upper surface of the substrate W is stopped.

The low solubility component 111 functions as a solid-state keeping component which keeps a solid state in the processing film 100 while the etching function developing processing and the etching function eliminating processing are performed.

Figure 13E:
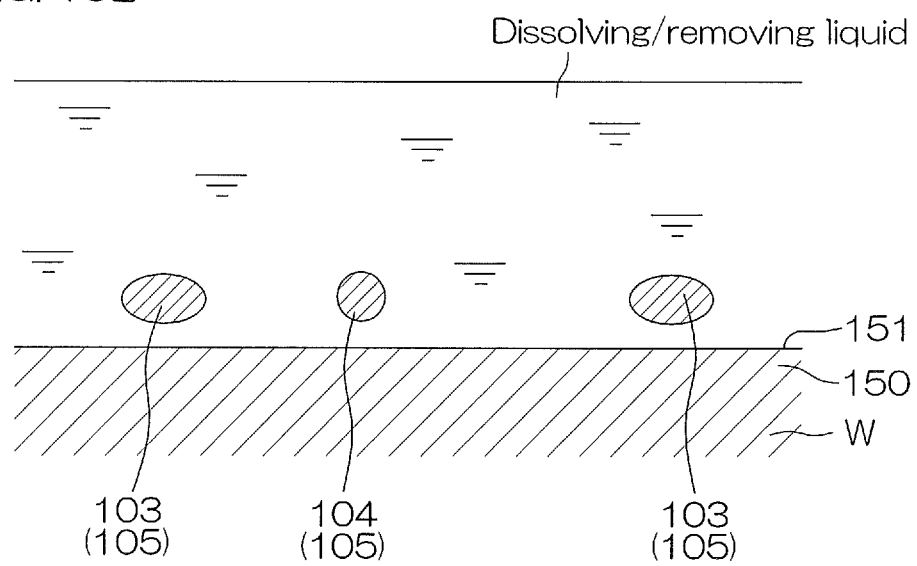
FIG. 13E is a schematic view for describing conditions near the front surface of the substrate during the substrate processing according to the second preferred embodiment.

Next, with reference to FIG. 13E, the processing film 100 is dissolved by the dissolving/removing liquid and removed from the substrate W (dissolution/removing step). In detail, the low solubility component 111 and the temperature-responsive polymer 110 are dissolved (dissolution step). The dissolving/removing liquid is continuously supplied, by which the low solubility component 111 and the temperature-responsive polymer 110 which have dissolved in the dissolving/removing liquid are removed to the outside of the substrate W together with the dissolving/removing liquid.

The objects 105 to be removed held by the low solubility component 111 have already been detached from the upper surface 151 of the substrate W and, therefore, are removed to the outside of the substrate W by the dissolving/removing liquid that flows over the upper surface 151 of the substrate W.

According to the second preferred embodiment, the processing film 100 is dissolved in the dissolving/removing liquid, thus making it possible to quickly remove the processing film 100 from the upper surface 151 of the substrate W. It is, thereby, possible to favorably clean the upper surface 151 of the substrate W.

The second preferred embodiment provides the same effects as the first preferred embodiment in addition to the above-described effects. However, the effects based on the peeling/removing liquid and the high solubility component are excluded.

Third Preferred Embodiment

Figure 14:
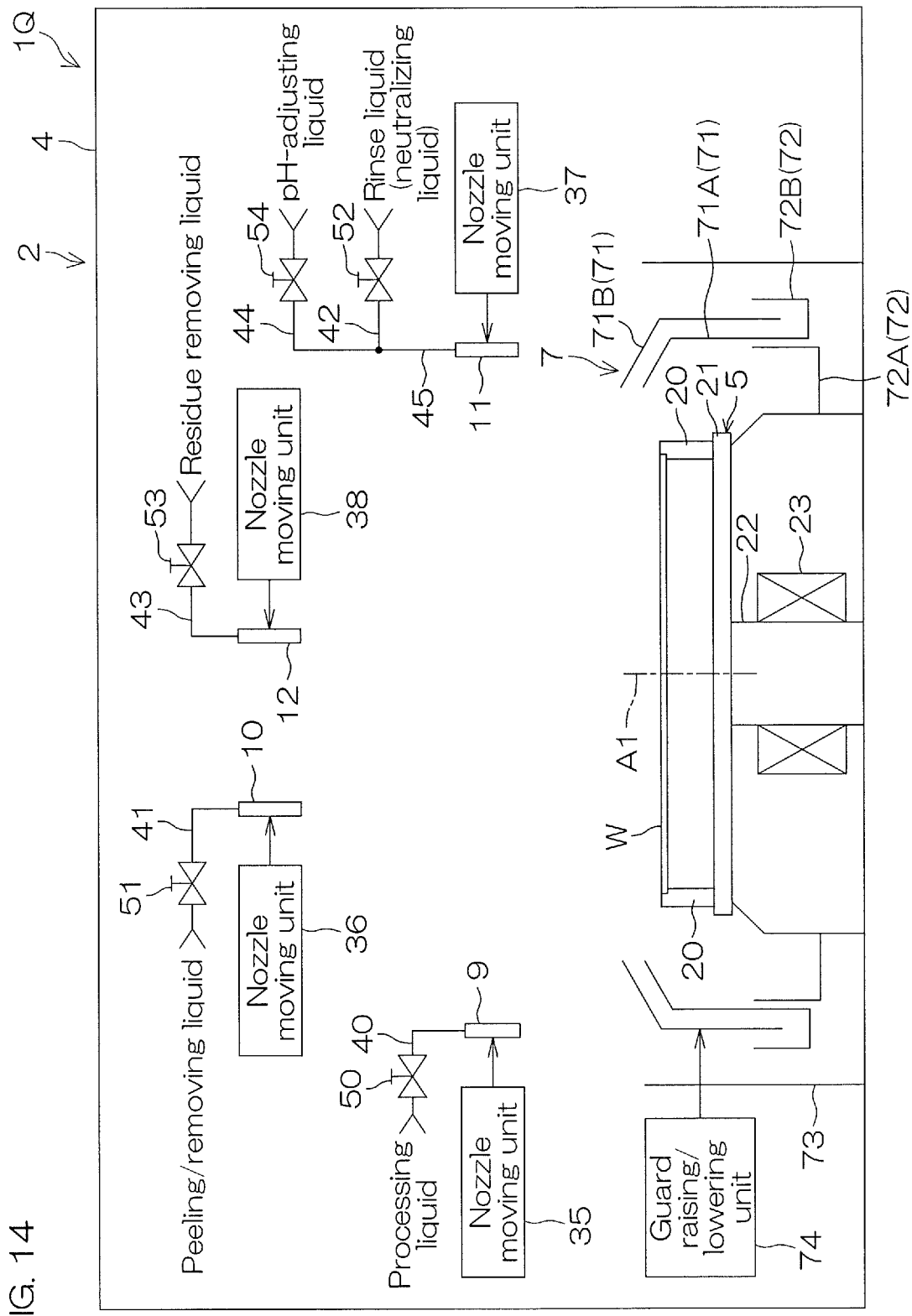
FIG. 14 is a schematic view for showing a general arrangement of a processing unit included in a substrate processing apparatus according to a third preferred embodiment.

FIG. 14 is a schematic view for showing a general arrangement of a processing unit 2 included in a substrate processing apparatus 1Q according to the third preferred embodiment. The substrate processing apparatus 1Q according to the third preferred embodiment is different from the substrate processing apparatus 1 (refer to FIG. 2) according to the first preferred embodiment mainly in that a processing liquid contains a pH-responsive polymer as a function developing component and a heater unit 6 is not disposed.

The pH-responsive polymer is decomposed by adjusting the pH in a processing film so as to be acidic or basic, thereby developing (strengthening) an etching function. Decomposed products of the pH-responsive polymer undergo polymerization by bringing the pH close to neutral to form the pH-responsive polymer, thereby losing (weakening) the etching function.

A third moving nozzle 11 according to the third preferred embodiment discharges a rinse liquid and a pH-adjusting liquid. The pH-adjusting liquid is a liquid which is weak in etching capacity with respect to a surface layer portion of a substrate W. In addition, the pH-adjusting liquid is preferably a liquid which does not etch the surface layer portion of the substrate W, that is, a liquid which does not function as an oxidizing agent. The pH-adjusting liquid is, for example, an acidic solution such as carbonated water or a basic solution such as an ammonia solution. The third moving nozzle 11 is an example of a pH-adjusting liquid supplying unit.

The acidic solution is an aqueous solution which is supplied to the processing film to change the pH of a liquid component contained in the processing film to be acidic. The acidic solution is not limited to carbonated water but may include phosphoric acid, citric acid, fumaric acid, succinic acid, etc.

The basic solution is an aqueous solution which is supplied to the processing film to change the pH of a liquid component contained in the processing film to basic. The basic solution is not limited to an ammonia solution but may include pyridine, diethylamine, ethylenediamine, diethylethanolamine, diisopropylamine, etc.

The liquid component in the processing film is replaced to the pH-adjusting liquid by supplying the pH-adjusting liquid and replaced to the rinse liquid by supplying the rinse liquid. Therefore, the liquid component in the processing film is substantially an aqueous solution.

The third moving nozzle 11 is connected to a common piping 45 which guides the rinse liquid and the pH-adjusting liquid to the third moving nozzle 11. A pH-adjusting liquid piping 44 for guiding the pH-adjusting liquid to the common piping 45 and a rinse liquid piping 42 for guiding the rinse liquid to the common piping 45 are connected to the common piping 45. When a pH-adjusting liquid valve 54 interposed in the pH-adjusting liquid piping 44 is opened, the pH-adjusting liquid is continuously discharged downward from a discharge port of the third moving nozzle 11. When a rinse liquid valve 52 interposed in the rinse liquid piping 42 is opened, the rinse liquid is continuously discharged downward from the discharge port of the third moving nozzle 11.

The rinse liquid according to the third preferred embodiment is a neutralizing liquid which brings the pH of the liquid component contained in the processing film to neutral. The neutralizing liquid is, for example, a neutral liquid such as pure water. As the pure water, DIW, etc., may be used. The third moving nozzle 11 is also an example of a neutralizing liquid supplying unit.

In the third preferred embodiment, the etching function developing processing is pH-adjusting processing in which the pH-adjusting liquid is supplied to the processing film 100 on the substrate W, thereby adjusting the pH of the liquid component in the processing film 100 so as to be acidic or basic. Adjusting the pH to be acidic means changing the pH so that it becomes close to 1. Adjusting the pH to be basic means changing the pH so that it becomes close to 14.

In the third preferred embodiment, the etching function eliminating processing is neutralization processing in which the neutralizing liquid is supplied to the processing film 100 on the substrate W, thereby bringing the pH in the processing film 100 closer to neutral than the pH in the processing film 100 which has been adjusted by the pH-adjusting processing. In this preferred embodiment, the function developing component is a component which is decomposed by the etching function developing processing to develop (strengthen) an etching function. The etching function thereof is lost (weakened) until the function developing component is formed again by polymerization.

The pH-responsive polymer is decomposed by the liquid component in the processing film, the pH of which is adjusted so as to be acidic or basic. Thereby, plural types of monomers including an organic acid of a monomer are formed. The organic acid is formed to develop (strengthen) the etching function. The plural types of monomers undergo polymerization when the pH of the liquid component in the processing film becomes close to neutral. Thereby, the organic acid is lost and the etching function is lost (weakened).

It is noted that the organic acid which is contained as a constituent unit in the pH-responsive polymer is lower in acidity than an organic acid of a monomer. Therefore, the pH-responsive polymer does not develop the etching function, although it contains the organic acid as a constituent unit.

A change in pH of the liquid component in the processing film develops or loses the etching function. Consequently, where etching is made at the surface layer portion of the substrate W by the pH-responsive polymer, the processing film is preferably formed in a semi-solid state (gel state) in which a liquid component is mixed with a solid component, and water is preferably contained in the liquid component in the processing film.

For example, where an acidic solution is used as the pH-adjusting liquid, the pH of the liquid component in the processing film is made 4 or less by the pH-adjusting processing, thereby facilitating the etching. On the other hand, the pH of the liquid component in the processing film is made larger than 4 by neutralization processing, thereby reducing the etching.

Where a basic liquid is used as the pH-adjusting liquid, the pH of the liquid component in the processing film is made 9 or more by the pH-adjusting processing, thereby facilitating the etching. On the other hand, the pH of the liquid component in the processing film is made less than 9 by the neutralization processing, thereby reducing the etching.

FIG. 15 is a schematic view for describing an example of the pH-responsive polymer. As the pH-responsive polymer, a copolymer (second copolymer) of N-isopropylacrylamide and acrylic acid may be used. The second copolymer is a hydrogel which contains water as a liquid component. N-isopropylacrylamide and acrylic acid are constituent units which constitute the second copolymer. Acrylic acid is an organic acid which is contained in the second copolymer as one type of the constituent unit.

The second copolymer is decomposed by a change in pH of the liquid component in the processing film to be acidic. A monomer of acrylic acid and a monomer of N-isopropylacrylamide are, thereby, formed. That is, plural types of monomers are formed. The monomer of acrylic acid is formed to develop (strengthen) the etching function. The pH of the liquid component in the processing film is changed so as to be neutral, by which the monomer of acrylic acid and the monomer of N-isopropylacrylamide undergo polymerization. Thereby, the monomer of acrylic acid as an organic acid is lost and the etching function is lost (weakened).

The substrate processing according to the third preferred embodiment is different in the content of an etching facilitating step (Step S4) and an etching reducing step (Step S5) from the substrate processing according to the first preferred embodiment.

Figure 16A:
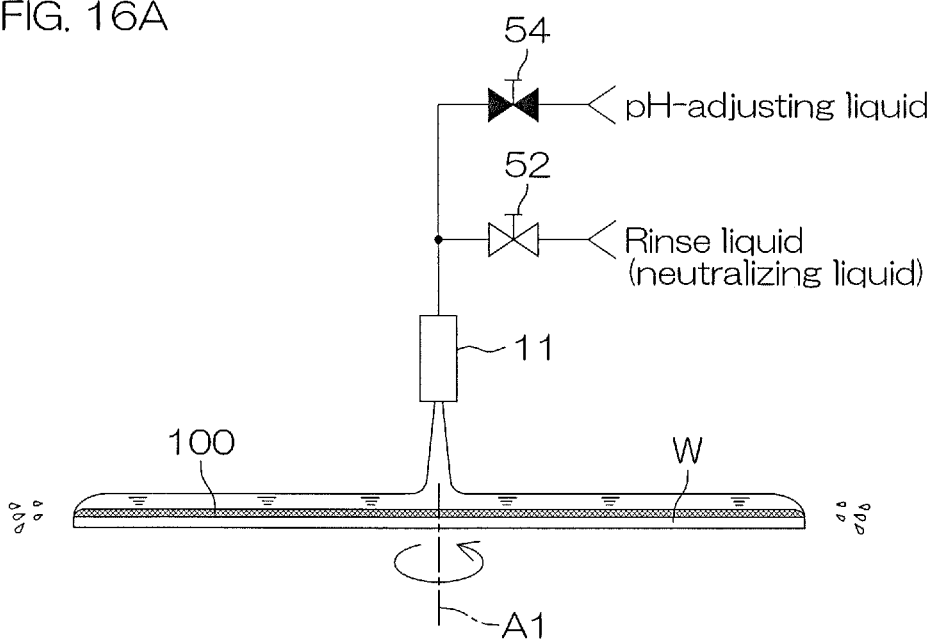
FIG. 16A is a schematic view for describing an example of an etching facilitating step (Step S4) in substrate processing by the substrate processing apparatus according to the third preferred embodiment.
Figure 16B:
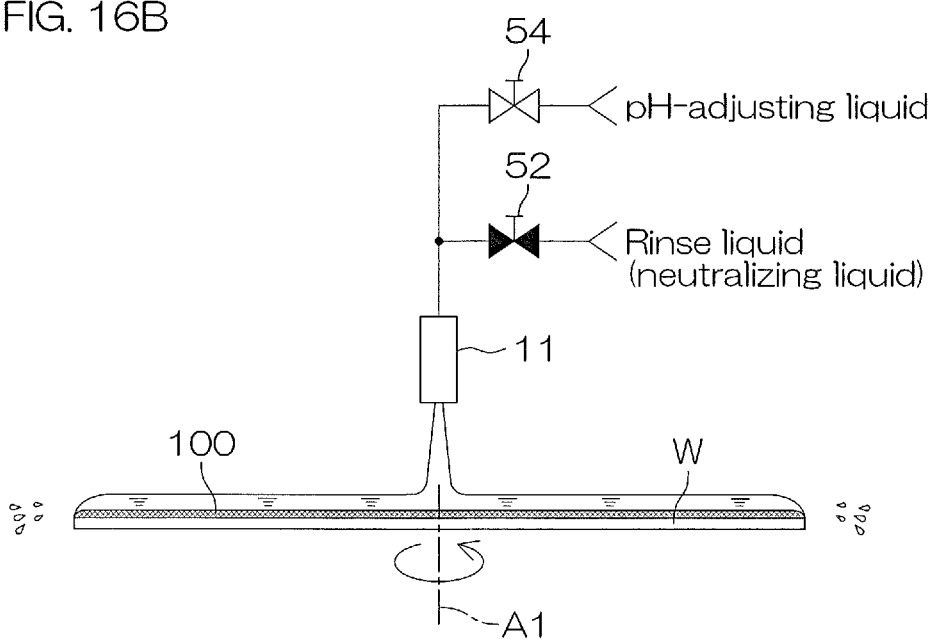
FIG. 16B is a schematic view for describing an example of an etching reducing step (Step S5) in the substrate processing by the substrate processing apparatus according to the third preferred embodiment.

FIG. 16A is a schematic view for describing an example of the etching facilitating step (Step S4) in the substrate processing by the substrate processing apparatus 1Q. FIG. 16B is a schematic view for describing an example of the etching reducing step (Step S5) in the substrate processing by the substrate processing apparatus 1Q.

In the etching facilitating step (Step S4) of the substrate processing according to the third preferred embodiment, when the third moving nozzle 11 is positioned at the processing position, the pH-adjusting liquid valve 54 is opened. Thereby, the pH-adjusting liquid is supplied from the third moving nozzle 11 to the processing film 100 on the substrate W (pH-adjusting liquid supplying step, pH-adjusting liquid discharging step). The pH-adjusting liquid is supplied, by which the pH of the liquid component in the processing film 100 on the substrate W is adjusted to be acidic or basic. Thereby, the pH-responsive polymer in the processing film 100 is decomposed to form an organic acid of a monomer, thereby facilitating the etching at the surface layer portion of the substrate W (etching facilitating step).

Then, with the third moving nozzle 11 being positioned at the processing position, the pH-adjusting liquid valve 54 is closed and, instead, the rinse liquid valve 52 is opened. Thereby, supply of the pH-adjusting liquid from the third moving nozzle 11 is stopped, and supply of the rinse liquid (neutralizing liquid) from the third moving nozzle 11 is started (neutralizing liquid supplying step, neutralizing liquid discharging step). Supply of the neutralizing liquid brings the pH of the liquid component in the processing film 100 on the substrate W close to neutral. Thereby, plural types of monomers in the processing film 100 undergo polymerization to lose an organic acid of a monomer, thereby reducing the etching at the surface layer portion of the substrate W (etching reducing step).

Next, with reference to FIG. 17A to FIG. 17F, a detailed description will be given of conditions of an upper surface 151 of the substrate W during the substrate processing. FIG.

Figure 17A:
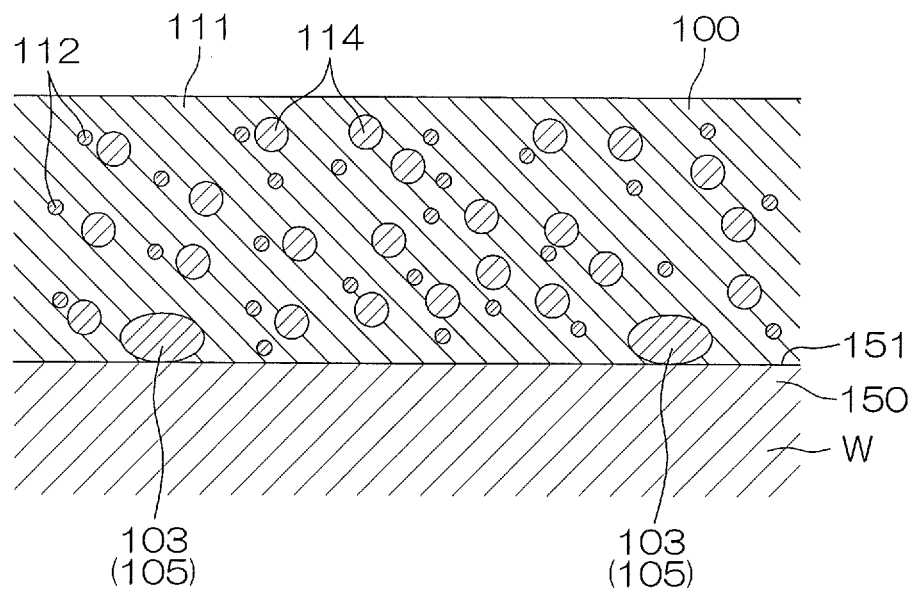
FIG. 17A is a schematic view for describing conditions near the front surface of the substrate during the substrate processing according to the third preferred embodiment.
Figure 17B:
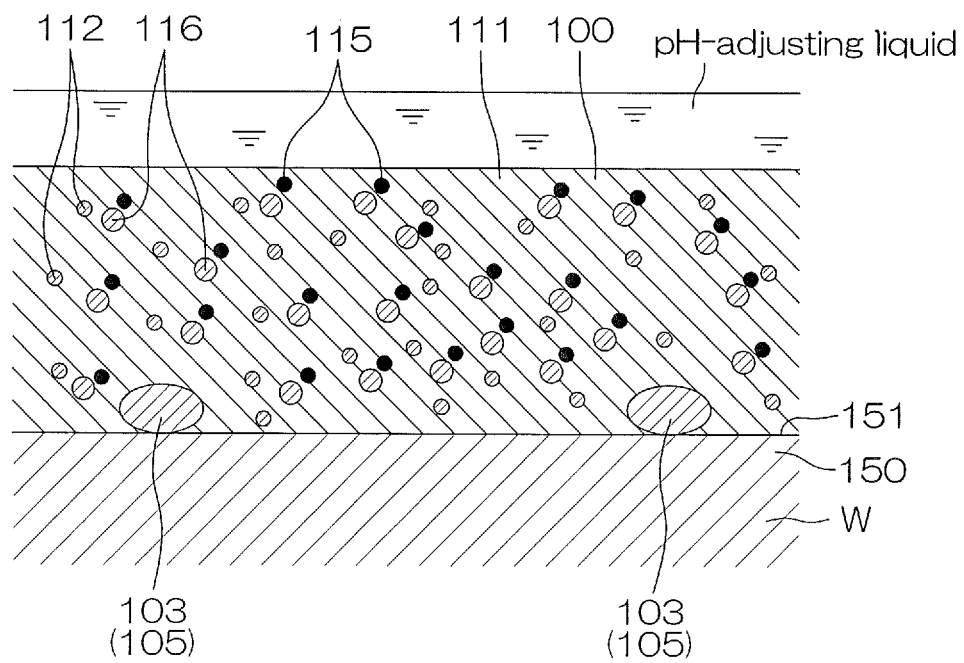
FIG. 17B is a schematic view for describing conditions near the front surface of the substrate during the substrate processing according to the third preferred embodiment.
Figure 17C:
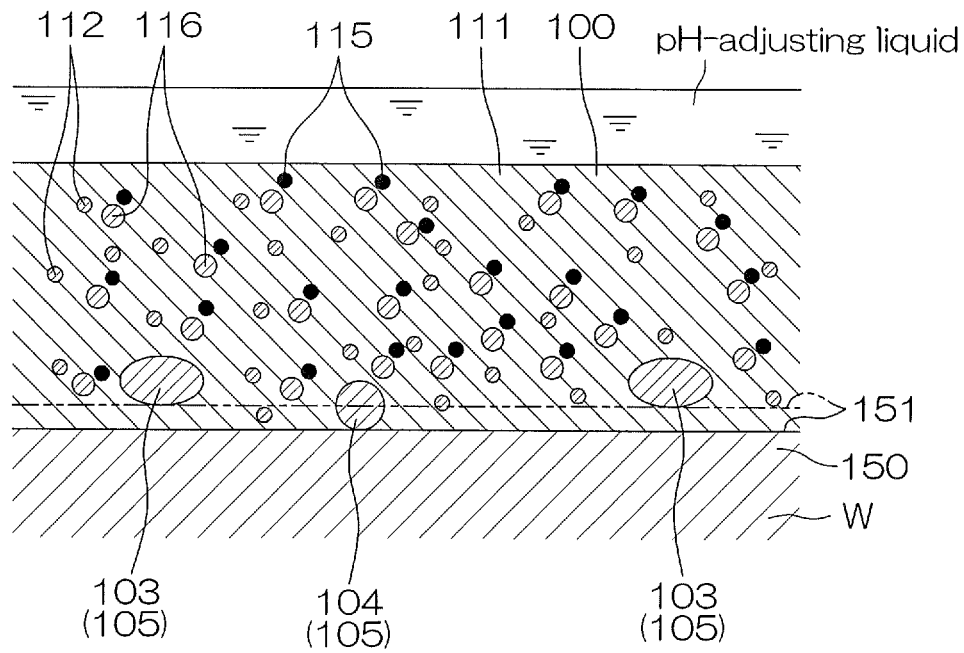
FIG. 17C is a schematic view for describing conditions near the front surface of the substrate during the substrate processing according to the third preferred embodiment.
Figure 17D:
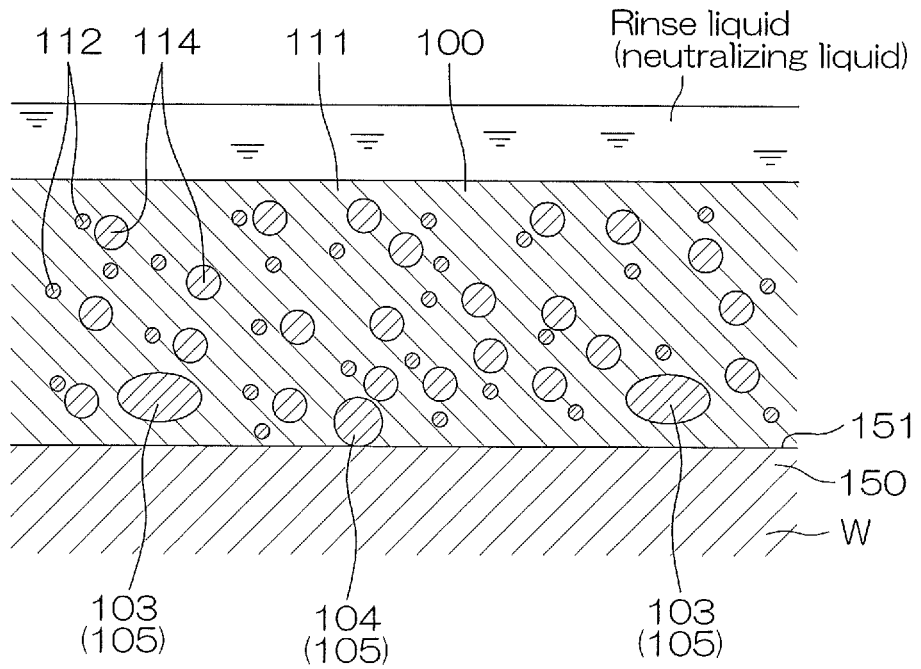
FIG. 17D is a schematic view for describing conditions near the front surface of the substrate during the substrate processing according to the third preferred embodiment.
Figure 17E:
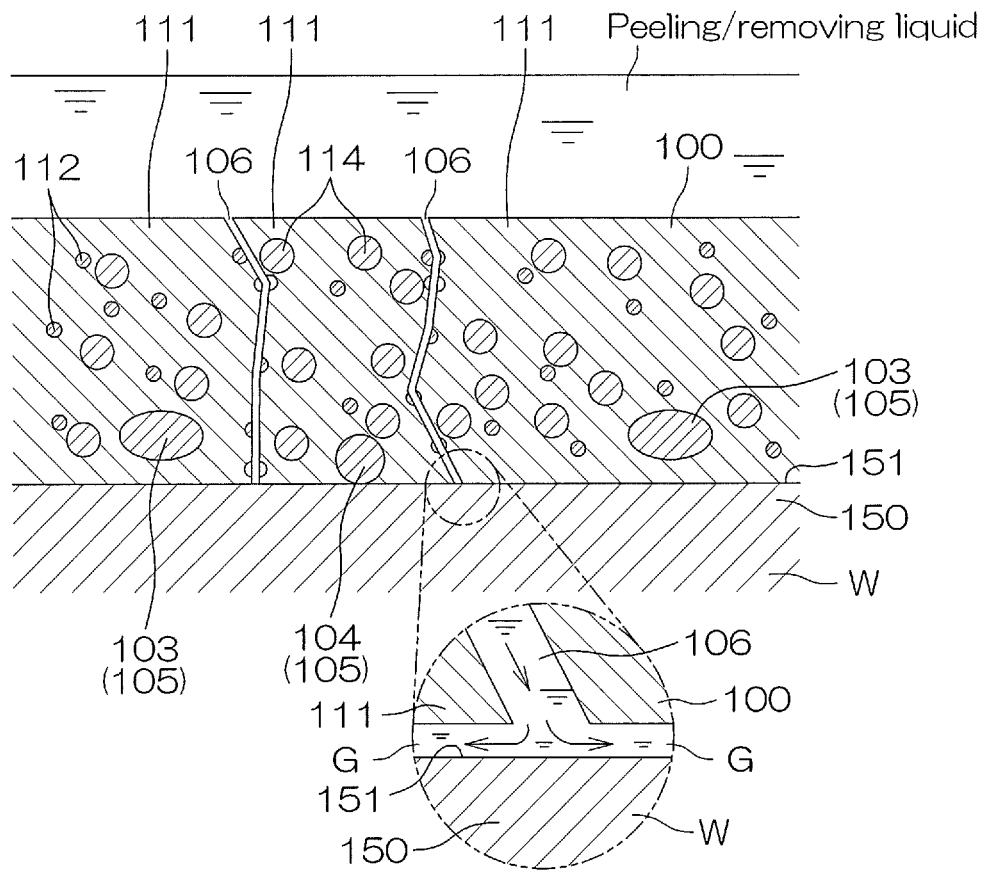
FIG. 17E is a schematic view for describing conditions near the front surface of the substrate during the substrate processing according to the third preferred embodiment.
Figure 17F:
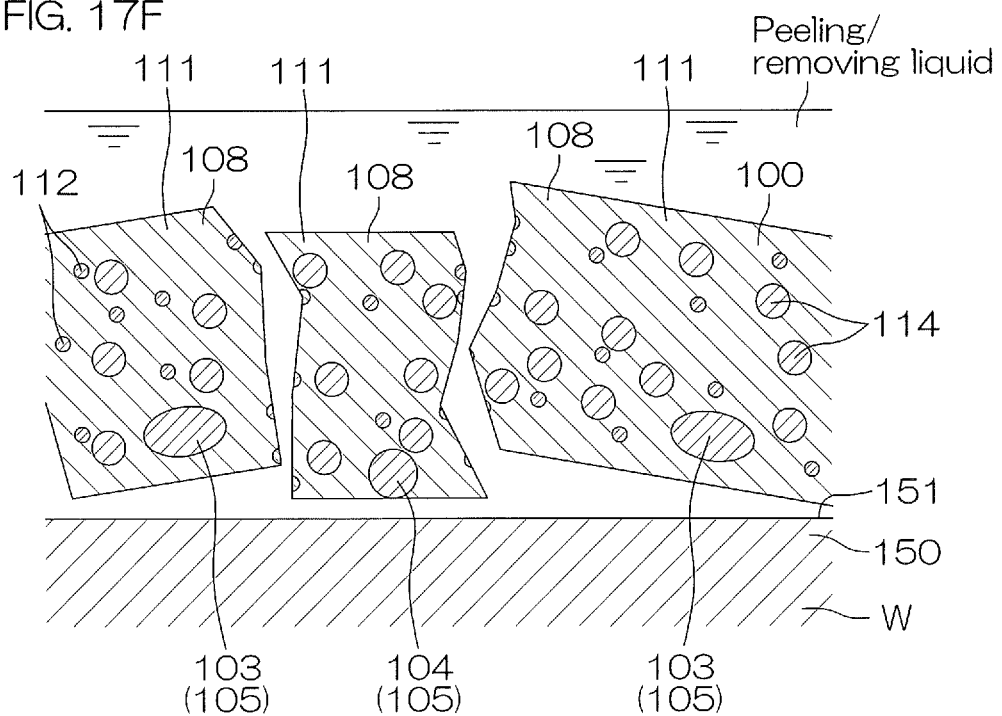
FIG. 17F is a schematic view for describing conditions near the front surface of the substrate during the substrate processing according to the third preferred embodiment.

17A to FIG. 17F are each a schematic view for describing conditions near the upper surface 151 of the substrate W during the substrate processing.

As shown in FIG. 17A, the processing film 100 which is formed in the processing film forming step (Step S3) holds particles 103 adhering to the surface layer portion 150 of the substrate W. Before the etching function developing processing is performed, the processing film 100 contains a pH-responsive polymer 114, a low solubility component 111, and a high solubility component 112. The pH-responsive polymer 114, the low solubility component 111, and the high solubility component 112 are made in a solid state by at least partial evaporation of the solvent contained in the processing liquid.

In the processing film 100, the pH-responsive polymer 114, the low solubility component 111, and the high solubility component 112 are present in a mixed state. Specifically, the processing film 100 does not have the pH-responsive polymer 114, the low solubility component 111, and the high solubility component 112 uniformly distributed across the entire processing film 100. The processing film 100 has a portion where the pH-responsive polymer 114 is locally present, a portion where the low solubility component 111 is locally present, and a portion where the high solubility component 112 is locally present.

Next, with reference to FIG. 17B, the pH-responsive polymer 114 is decomposed by the pH-adjusting processing. In detail, the pH-responsive polymer 114 is dissolved to form an organic acid 115 and a monomer 116 that is not an organic acid in the processing film 100. Where the pH-responsive polymer 114 is a second polymer, the monomer 116 is an N-isopropylacrylamide monomer, and the organic acid 115 is an acrylic acid monomer. An increase in the organic acid 115 in the processing film 100 facilitates the etching at the surface layer portion 150 of the substrate W (etching facilitating step). The organic acid 115 is formed, by which the etching at the surface layer portion 150 of the substrate W proceeds. As the etching proceeds, the upper surface 151 of the substrate W recedes.

As shown in FIG. 17C, the upper surface 151 of the substrate W recedes (etching of surface layer portion 150 of substrate W), by which the particles 103 rise up from the upper surface 151 of the substrate W. Thereby, the particles 103 are held more firmly by the processing film 100 (in particular, low solubility component 111). Etching is made at the surface layer portion 150 of the substrate W to form etching residue 104. The processing film 100 (in particular, low solubility component 111) holds the etching residue 104 together with the particles 103 that have been adhering to the upper surface 151 of the substrate W since before the etching step.

Next, with reference to FIG. 17D, the plural types of monomers including the organic acid 115 undergo polymerization by the neutralization processing to form the pH-responsive polymer 114. The organic acid 115 in the processing film 100 is decreased to weaken the acidity of the liquid component in the processing film 100. Thereby, the etching at the surface layer portion 150 of the substrate W is stopped (etching stopping step). The etching is stopped, by which receding of the upper surface of the substrate W is stopped.

Next, with reference to FIG. 17E, the high solubility component 112 is selectively dissolved by the peeling/removing liquid. That is, the processing film 100 is partially dissolved (dissolution step, partial dissolution step).

In response to the selective dissolution of the high solubility component 112, a through hole 106 is formed at a portion where the high solubility component 112 is locally present in the processing film 100 (through hole forming step).

At the portion where the high solubility component 112 is locally present, not only is the high solubility component 112 present but also the low solubility component 111 is present. The peeling/removing liquid not only dissolves the high solubility component 112 but also dissolves the low solubility component 111 around the high solubility component 112, thereby forming the through hole 106.

Here, where the neutralizing liquid remains appropriately in the processing film 100, the peeling/removing liquid partially dissolves the processing film 100, while being dissolved into the neutralizing liquid that remains in the processing film 100. In detail, the peeling/removing liquid dissolves the high solubility component 112 in the processing film 100, while being dissolved into the neutralizing liquid that remains in the processing film 100, thereby forming the through hole 106. Therefore, the peeling/removing liquid easily enters into the processing film 100 (dissolution entry step).

The peeling/removing liquid which has reached the upper surface 151 of the substrate W acts on an interface between the processing film 100 and the substrate W, thereby peeling the processing film 100 and removing the thus-peeled processing film 100 from the upper surface 151 of the substrate W (peeling/removing step).

In detail, the low solubility component 111 is low in solubility with respect to the peeling/removing liquid and the low solubility component 111 is mostly kept in a solid state. Therefore, the low solubility component 111 is slightly dissolved only in the vicinity of the front surface thereof by the peeling/removing liquid. Therefore, the peeling/removing liquid which has reached near the upper surface 151 of the substrate W via the through hole 106 slightly dissolves a portion of the low solubility component 111 near the upper surface 151 of the substrate W. Thereby, as shown in an enlarged view of FIG. 17E, the peeling/removing liquid enters a gap G between the processing film 100 and the upper surface of the substrate W, while gradually dissolving the low solubility component 111 in a solid state near the upper surface 151 of the substrate W (peeling/removing liquid entry step).

Then, cracks are formed in the processing film 100, for example, with a peripheral edge of the through hole 106 as a starting point. Therefore, the high solubility component 112 is also referred to as a crack occurring component. The processing film 100 is split by formation of cracks and made into film fragments 108. As shown in FIG. 17F, the film fragments 108 of the processing film 100 are peeled from the substrate W in a state that the objects 105 to be removed are held (processing film splitting step, processing film peeling step).

Then, the peeling/removing liquid is continuously supplied, by which the processing film 100 made into the film fragments 108 is washed away by the peeling/removing liquid in a state that the objects 105 to be removed are held. In other words, the film fragments 108 which hold the objects 105 to be removed are pushed outside the substrate W and removed from the upper surface 151 of the substrate W (processing film removing step, removal objects removing step). Thereby, it is possible to favorably clean the upper surface 151 of the substrate W.

The low solubility component 111 functions as a solid-state keeping component which keeps a solid state in the processing film 100 for a period of time from formation of the processing film 100 to supply of the peeling/removing liquid.

The third preferred embodiment provides the following effects. Etching at the surface layer portion 150 of the substrate W by the processing film 100 is not started at the time of formation of the processing film 100, but is facilitated in response to the pH-adjusting processing applied to the processing film 100. Then, it is not necessary to remove the processing film 100 for stopping the etching, and in response to the neutralization processing applied to the processing film 100 in a state that the processing film 100 is kept on the substrate W, etching is reduced. Since the facilitation and reduction of etching are in response to active processing that changes the pH in the processing film 100, it is easy to control the timing of facilitating the etching and the timing of reducing the etching. That is, according to the processing applied to the processing film 100, it is possible to switch between a state in which the etching is facilitated and that in which the etching is reduced. Therefore, it is easy to control the timing of facilitating the etching and the timing of reducing the etching. Consequently, it is possible to improve controllability of the etching at the surface layer portion 150 of the substrate W.

Since an organic acid of a monomer is higher in acidity than an organic acid as a constituent unit of the pH-responsive polymer, etching can be made at the surface layer portion 150 of the substrate W. Therefore, it is possible to control whether the etching at the surface layer portion 150 of the substrate W is facilitated or reduced by decomposition or formation of the pH-responsive polymer 114 in the processing film 100.

Further, where the etching processing in which the etching reducing step and the etching facilitating step are given as one cycle is executed in a plural number of cycles, every time the pH-adjusting liquid or the rinse liquid is supplied to the processing film 100, the liquid component in the processing film 100 is replaced by the pH-adjusting liquid or by the rinse liquid. Therefore, the etching residue 104 formed on the upper surface 151 of the substrate W by the etching is removed by a flow of the pH-adjusting liquid or that of the rinse liquid. It is, thereby, possible to suppress a decrease in etching speed due to formation of the etching residue 104.

In addition to the above-described effects, the third preferred embodiment further provides the same effects as the first preferred embodiment excluding the effects relating to the temperature-responsive polymer.

<Details of Components in Processing Liquid>

Hereinafter, a detailed description will be given of the components (solvent, low solubility component, high solubility component) in the processing liquid which are used in the aforementioned preferred embodiments.

Hereinafter, expressions of "$C_{x-y}$," "$C_x$ to $C_y$," and "$C_x$" mean the number of carbons in a molecule or in a substituent. For example, $C_{1-6}$ alkyl means an alkyl chain (methyl, ethyl, propyl, butyl, pentyl, hexyl, etc.) having carbon atoms of not less than 1 and not more than 6.

Where a polymer has plural types of repeating units, these repeating units undergo copolymerization. Unless otherwise specified in a limited manner, the copolymerization may be alternating copolymerization, random copolymerization, block copolymerization, graft copolymerization, or a mixture of them. Where a polymer and a resin are indicated by a structural formula, n, m, etc., written together in parentheses indicate the number of repetitions.

<Low Solubility Component>

(A) The low solubility component contains at least one of novolak, polyhydroxystyrene, polystyrene, a polyacrylic acid derivative, a polymaleic acid derivative, polycarbonate, a polyvinyl alcohol derivative, a polymethacrylic acid derivative, and a copolymer of their combination. Preferably, (A) the low solubility component may contain at least one of novolak, polyhydroxystyrene, a polyacrylic acid derivative, polycarbonate, a polymethacrylic acid derivative, and a copolymer of their combination. More preferably, (A) the low solubility component may contain at least one of novolak, polyhydroxystyrene, polycarbonate, and a copolymer of their combination. Novolak may be phenol novolak.

The processing liquid may contain a combination of one or two or more of the above-described favorable examples as (A) the low solubility component. For example, (A) the low solubility component may contain both novolak and polyhydroxystyrene.

Such a mode is preferable that (A) the low solubility component is made into a film by drying and the film is not largely dissolved by the peeling/removing liquid but peeled, with objects to be removed being held. It is noted that such a mode is permissible that only a small part of (A) the low solubility component is dissolved by the peeling/removing liquid.

Preferably, (A) the low solubility component does not contain fluorine and/or silicon, and more preferably it contains neither of them.

The aforementioned copolymerization is preferably random copolymerization or block copolymerization.

With no intention to limit the scope of claims, specific examples of (A) the low solubility component include the following compounds expressed by Chemical Formula 1 to Chemical Formula 7 given below.

[Chemical Formula 1]

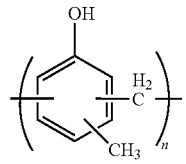

[化1]

[Chemical Formula 2]

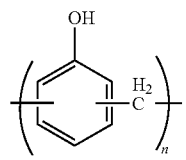

[化2]

[Chemical Formula 3]

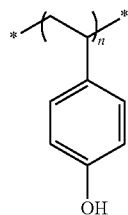

[化3]

(Asterisk * indicates a bonding to an adjacent constituent unit.)

[Chemical Formula 4]

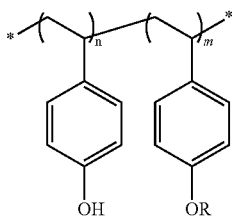

(R represents a substituent such as $C_{1-4}$ alkyl. Asterisk* indicates a bonding to an adjacent constituent unit.)

[Chemical Formula 5]

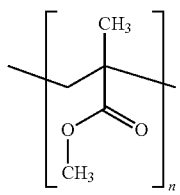

[Chemical Formula 6]

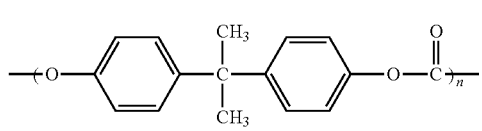

[Chemical Formula 7]

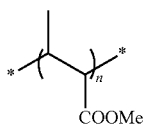

(Me represents a methyl group. Asterisk* indicates a bonding to an adjacent constituent unit.)

A weight average molecular weight (Mw) of (A) the low solubility component is preferably 150 to 500,000, more preferably 300 to 300,000, further more preferably 500 to 100,000, and still further more preferably 1,000 to 50,000.

(A) The low solubility component can be obtained by synthesis. It can also be purchased. In the case of purchase, the following are suppliers. It is also possible for suppliers to synthesize (A) polymers. Novolak: Showa Chemical Industry Co., Ltd., Asahi Yukizai Corporation, Gun Ei Chemical Industry Co., Ltd., Sumitomo Bakelite Co., Ltd. Polyhydroxystyrene: Nippon Soda Co., Ltd., Maruzen Petrochemical Co., Ltd., Toho Chemical Industry Co., Ltd. Polyacrylic acid derivative: Nippon Shokubai Co., Ltd. Polycarbonate: Sigma-Aldrich Polymethacrylic acid derivative: Sigma-Aldrich <High Solubility Component>

(B) The high solubility component is (B') a crack promoting component. (B') The crack promoting component contains hydrocarbon and also contains a hydroxy group (—OH) and/or a carbonyl group (—C(=O)—). (B') Where the crack promoting component is a polymer, one type of constituent unit contains hydrocarbon for each unit and also has a hydroxy group and/or a carbonyl group. Examples of the carbonyl group include carboxylic acid (—COOH), aldehyde, ketone, ester, amide, and enone, and carboxylic acid is preferable.

With no intention to limit the scope of claims or without being constrained by theory, when a processing liquid is dried to form a processing film on a substrate and a peeling/removing liquid peels the processing film, (B) the high solubility component is thought to yield a portion which responds by peeling the processing film. Therefore, (B) the high solubility component is preferably higher in solubility with respect to the peeling/removing liquid than (A) the low solubility component. Examples of a mode that (B') the crack promoting component contains ketone as a carbonyl group include a cyclic hydrocarbon. Specific examples include 1,2-cyclohexanedione and 1,3-cyclohexanedione.

As a more specific mode, (B) the high solubility component is represented by at least any one of the following (B-1), (B-2), and (B-3).

(B-1) is a compound which contains 1 to 6 (preferably 1 to 4) of Chemical Formula 8 given below as a constituent unit and in which each constituent unit is bonded by a linking group (linker $L_1$). Here, the linker $L_1$ may be a single bond or may be $C_{1-6}$ alkylene. The $C_{1-6}$ alkylene links a constituent unit as a linker and is not limited to a divalent group. Divalent to tetravalent groups are preferable. The $C_{1-6}$ alkylene may be either a linear chain or a branched chain.

[Chemical Formula 8]

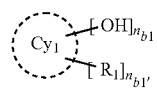

$Cy_1$ is a hydrocarbon ring of $C_{5-30}$ and preferably phenyl, cyclohexane or naphthyl and more preferably phenyl. As a favorable mode, the linker $L_1$ links a plurality of $Cy_1$.

$R_1$ is each independently $C_{1-5}$ alkyl and preferably methyl, ethyl, propyl or butyl. The $C_{1-5}$ alkyl may be either a linear chain or a branched chain.

$n_{b1}$ is 1, 2 or 3, preferably 1 or 2 and more preferably 1. $n_{b1'}$ is 0, 1, 2, 3 or 4 and preferably 0, 1 or 2.

Chemical Formula 9 below is a chemical formula of the constituent unit of Chemical Formula 8 expressed by using a linker $L_9$. The linker $L_9$ is preferably a single bond, methylene, ethylene or propylene.

[Chemical Formula 9]

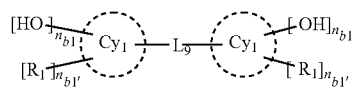

With no intention to limit the scope of claims, favorable examples of (B-1) include 2,2-bis(4-hydroxyphenyl)propane, 2,2'-methylenebis(4-methylphenol), 2,6-bis[(2-hydroxy-5-methylphenyl)methyl]-4-methylphenol, 1,3-cyclohexanediol, 4,4'-dihydroxybiphenyl, 2,6-naphthalenediol, 2,5-di-tert-butylhydroquinone, and 1,1,2,2-tetrakis(4-hydroxyphenyl)ethane. These may be obtained by polymerization or condensation.

As an example, 2,6-bis [(2-hydroxy-5-methylphenyl) methyl]-4-methylphenol shown in Chemical Formula 10 below will be described. This compound has three constituent units of Chemical Formula 8 in (B-1), and the constituent units are linked by the linker $L_1$ (methylene). $n_{b1}=n_{b1'}=1$ and $R_1$ is methyl.

[Chemical Formula 10]

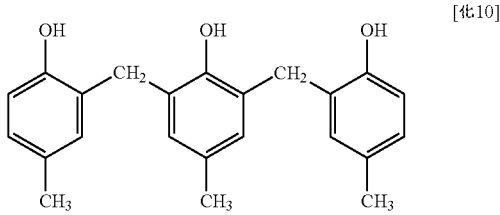

(B-2) is expressed by Chemical Formula 11 below.

[Chemical Formula 11]

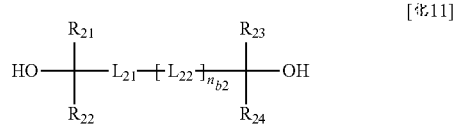

$R_{21}$, $R_{22}$, $R_{23}$ and $R_{24}$ are each independently hydrogen or $C_{1-5}$ alkyl, preferably hydrogen, methyl, ethyl, t-butyl or isopropyl, more preferably hydrogen, methyl or ethyl, and further more preferably methyl or ethyl.

Linker $L_{21}$ and linker $L_{22}$ are each independently $C_{1-20}$ alkylene, $C_{1-20}$ cycloalkylene, $C_{2-4}$ alkenylene, $C_{2-4}$ alkynylene or $C_{6-20}$ arylene. These groups may be substituted by $C_{1-5}$ alkyl or hydroxyl. Here, alkenylene means divalent hydrocarbon having one or more double bonds, and alkynylene means a divalent hydrocarbon group having one or more triple bonds. Linker $L_{21}$ and linker $L_{22}$ are favorably $C_{2-4}$ alkylene, acetylene ($C_2$ alkynylene) or phenylene, more preferably $C_{2-4}$ alkylene or acetylene, and further more preferably acetylene.

$n_{b2}$ is 0, 1 or 2, preferably 0 or 1, and more preferably 0.

With no intention to limit the scope of claims, favorable examples of (B-2) include 3,6-dimethyl-4-octyne-3,6-diol, and 2,5-dimethyl-3-hexane-2,5-diol. Favorable examples of (B-2) in another form include 3-hexene-2,5-diol, 1,4-butynediol, 2,4-hexadiene-1,6-diol, 1,4-butanediol, cis-1,4-dihydroxy-2-butane, and 1,4-benzenedimethanol.

(B-3) is a polymer which contains the constituent unit expressed by Chemical Formula 12 below and has a weight average molecular weight (Mw) of 500 to 10,000. Mw is preferably 600 to 5,000 and more preferably 700 to 3,000.

[Chemical Formula 12]

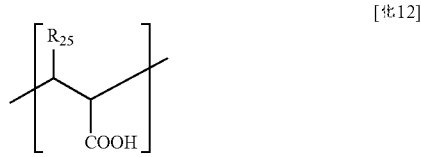

Here, $R_{25}$ is —H, —$CH_3$, or —COOH and preferably —H or —COOH. One (B-3) polymer may contain two or more constituent units, each of which is expressed by Chemical Formula 12.

With no intention to limit the scope of claims, favorable examples of (B-3) polymer include acrylic acid, maleic acid, and a polymer of their combination. More favorable examples are polyacrylic acid and a maleic acid/acrylic acid copolymer.

In the case of copolymerization, random copolymerization and block copolymerization are preferable, and random copolymerization is more preferable.

As an example, the maleic acid/acrylic acid copolymer shown in Chemical Formula 13 below will be described. The copolymer is included in (B-3) and has two types of constituent units expressed by Chemical Formula 12 in which $R_{25}$ is —H in one constituent unit and $R_{25}$ is —COOH in the other constituent unit.

[Chemical Formula 13]

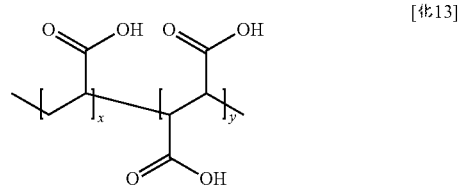

As a matter of course, the processing liquid may contain a combination of one or two or more of the above-described favorable examples as (B) the high solubility component. For example, (B) the high solubility component may contain both 2,2-bis(4-hydroxyphenyl)propane and 3,6-dimethyl-4-octyne-3,6-diol.

(B) The high solubility component may be 80 to 10,000 in molecular weight. The high solubility component is preferably 90 to 5000 in molecular weight and more preferably 100 to 3000. Where (B) the high solubility component is a resin, a polymeride or a polymer, the molecular weight is expressed by a weight average molecular weight (Mw).

(B) The high solubility component can be obtained by synthesis or purchase. Suppliers include Sigma-Aldrich, Tokyo Chemical Industry Co., Ltd., and Nippon Shokubai Co., Ltd.

<Solvent>

(C) The solvent preferably contains an organic solvent. (C) The solvent may have volatility. To have volatility means that it is higher in volatility than water. For example, (C) a boiling point of the solvent at one atmospheric pressure is preferably 50 to 250° C. The boiling point of the solvent at one atmospheric pressure is more preferably 50 to 200° C. and further more preferably 60 to 170° C. The boiling point of the solvent at one atmospheric pressure is still further more preferably 70 to 150° C. Where the function developing component is the temperature-responsive polymer, the solvent preferably contains pure water. Pure water is preferably DIW. Where the function developing component is the pH-responsive polymer, the solvent is not required to contain pure water if having compatibility with the pH-adjusting liquid.

Examples of the organic solvent include alcohols such as isopropanol (IPA); ethylene glycol monoalkyl ethers such as ethylene glycol monomethyl ether, ethylene glycol monoethyl ether; ethylene glycol monoalkyl ether acetates such as ethylene glycol monomethyl ether acetate, ethylene glycol monoethyl ether acetate; propylene glycol monoalkyl ethers such as propylene glycol monomethyl ether (PGME), propylene glycol monoethyl ether (PGEE); propylene glycol monoalkyl ether acetates such as propylene glycol monomethyl ether acetate (PGMEA), propylene glycol monoethyl ether acetate; esters of lactic acid such as methyl lactate, ethyl lactate (EL); aromatic hydrocarbons such as toluene, xylene; ketones such as methyl ethyl ketone, 2-heptanone, cyclohexane; amides such as N,N-dimethyl acetamide, N-methylpyrrolidone; and lactones such as γ-butyrolactone. These organic solvents may be used solely or in a mixture of two or more of them.

Other Preferred Embodiments

The present invention is not limited to the above preferred embodiments and can be carried out in still other embodiments.

For example, the spin chuck 5 is not limited to a clamping type chuck by which the plurality of chuck pins are brought into contact with a peripheral surface of the substrate W but may be a vacuum-suction type chuck by which a lower surface of the substrate W is suctioned to an upper surface of the spin base 21, thereby holding the substrate W horizontally.

Further, in the aforementioned preferred embodiments, the processing film 100 is heated by the heater unit 6 which heats the processing film 100 via the substrate W. The processing film 100 may be heated by a heater which directly heats the processing film 100 from above.

Further, a heating fluid such as warm water may be supplied to the lower surface of the substrate W to strengthen heating of the processing film 100. Supply of the heating fluid may be stopped to weaken the heating of the processing film 100. The heating of the processing film 100 may be weakened by a cooling fluid such as cooling water.

Further, unlike the aforementioned preferred embodiments, the etching function developing processing may include the heating strengthening processing and the pH-adjusting processing. That is, with the processing film being heated, the pH of the liquid component in the processing film may be made acidic or basic, thereby facilitating etching at the surface layer portion of the substrate W. In this case, at least one of the heating weakening processing and the neutralization processing is applied to the processing film, thereby reducing the etching at the surface layer portion of the substrate W.

It is also possible to combine the second preferred embodiment with the third preferred embodiment.

Specifically, in the third preferred embodiment, the processing liquid which contains the low solubility component and the pH-responsive polymer as the solute can be used, and the dissolving/removing liquid can be used in place of the peeling/removing liquid.

In this specification, where "to" or "-" is used to indicate a numerical range, each of them includes both ends thereof and a unit is applied commonly, unless otherwise specified in a limited manner. While the preferred embodiments of the present invention have been described in detail, these are merely specific examples used to clarify the technical content of the present invention and the present invention should not be interpreted as being limited to these specific examples, and the scope of the present invention shall be limited only by the appended claims.

This application corresponds to Japanese Patent Application No. 2020-126876 filed on Jul. 27, 2020, with the Japan Patent Office, and the entire disclosure of this application is incorporated herein by reference.

REFERENCE SIGNS LIST

1: substrate processing apparatus
1P: substrate processing apparatus
1Q: substrate processing apparatus
3: controller
6: heater unit (processing film heating unit)
9: first moving nozzle (processing liquid supplying unit)
11: third moving nozzle (pH-adjusting liquid supplying unit, neutralizing liquid supplying unit)
23: spin motor (processing film forming unit)
65: heater raising/lowering unit (heating adjusting unit)
110: temperature-responsive polymer
111: low solubility component
112: high solubility component
113: protons
114: pH-responsive polymer
115: organic acid
150: surface layer portion
151: upper surface (front surface of substrate)
152: trench
153: bottom wall
154: side wall
154a: opening side portion
154b: bottom wall side portion
155: opening
W: substrate

The invention claimed is:
1. A substrate processing method comprising:
a processing film forming step in which a processing liquid is supplied to a front surface of a substrate and the processing liquid on the front surface of the substrate is solidified or cured to form a processing film on the front surface of the substrate;
an etching facilitating step in which the processing film is subjected to etching function developing processing to facilitate etching at a surface layer portion of the substrate by the processing film; and
an etching reducing step in which the processing film is subjected to etching function eliminating processing to reduce the etching at the surface layer portion of the substrate by the processing film in a state that the processing film is kept on the substrate; wherein
the etching function developing processing includes pH-adjusting processing in which a pH-adjusting liquid is supplied to the processing film on the substrate, thereby adjusting the pH in the processing film so as to be acidic or basic, and
the etching function eliminating processing includes neutralization processing in which a neutralizing liquid is supplied to the processing film on the substrate, thereby bringing the pH in the processing film closer to neutral than the pH in the processing film which has been adjusted by the pH-adjusting processing.
2. The substrate processing method according to claim 1, wherein
the etching function developing processing includes heating strengthening processing of strengthening heating applied to the processing film, and
the etching function eliminating processing includes heating weakening processing of weakening the heating applied to the processing film.

3. The substrate processing method according to claim 1, wherein
in the processing film forming step, the processing film is formed which contains a function developing component to develop an etching function by the etching function developing processing.

4. The substrate processing method according to claim 1, wherein
etching processing in which the etching facilitating step and the etching reducing step are given as one cycle is executed in a plural number of cycles.

5. The substrate processing method according to claim 1, further comprising a processing film removing step in which a removing liquid is supplied to the front surface of the processing film, thereby removing the processing film from the front surface of the substrate.

6. The substrate processing method according to claim 5, wherein
the processing film removing step includes a dissolution removing step in which the processing film is dissolved in the removing liquid to remove the processing film from the front surface of the substrate.

7. A substrate processing method comprising:
a processing film forming step in which a processing liquid is supplied to a front surface of a substrate and the processing liquid on the front surface of the substrate is solidified or cured to form a processing film on the front surface of the substrate;
an etching facilitating step in which the processing film is subjected to etching function developing processing to facilitate etching at a surface layer portion of the substrate by the processing film; and
an etching reducing step in which the processing film is subjected to etching function eliminating processing to reduce the etching at the surface layer portion of the substrate by the processing film in a state that the processing film is kept on the substrate; wherein
in the processing film forming step, the processing film is formed which contains a function developing component to develop an etching function by the etching function developing processing,
the function developing component is a polymer which releases protons in the processing film by the etching function developing processing and receives protons from the processing film by the etching function eliminating processing,
the etching facilitating step includes a step in which the protons are released from the polymer by the etching function developing processing to facilitate etching at the surface layer portion of the substrate, and
the etching reducing step includes a step in which the protons are imparted to the polymer by the etching function eliminating processing to reduce the etching at the surface layer portion of the substrate.

8. The substrate processing method according to claim 7, wherein
the polymer is a copolymer of N-isopropylacrylamide, N,N'-methylenebisacrylamide, and acrylic acid.

9. A substrate processing method comprising:
a processing film forming step in which a processing liquid is supplied to a front surface of a substrate and the processing liquid on the front surface of the substrate is solidified or cured to form a processing film on the front surface of the substrate;
an etching facilitating step in which the processing film is subjected to etching function developing processing to facilitate etching at a surface layer portion of the substrate by the processing film; and
an etching reducing step in which the processing film is subjected to etching function eliminating processing to reduce the etching at the surface layer portion of the substrate by the processing film in a state that the processing film is kept on the substrate; wherein
in the processing film forming step, the processing film is formed which contains a function developing component to develop an etching function by the etching function developing processing,
the function developing component is a polymer which has plural types of constituent units and contains an organic acid as one type of the constituent unit,
the etching facilitating step includes a step in which the polymer is decomposed by the etching function developing processing to form plural types of monomers including an organic acid of a monomer, thereby facilitating etching at the surface layer portion of the substrate, and
the etching reducing step includes a step in which the plural types of monomers in the processing film are polymerized by the etching function eliminating processing to form the polymer, thereby reducing the etching at the surface layer portion of the substrate.

10. The substrate processing method according to claim 9, wherein
the polymer is a copolymer of N-isopropylacrylamide and acrylic acid, and
the organic acid is acrylic acid.

11. A substrate processing method comprising:
a processing film forming step in which a processing liquid is supplied to a front surface of a substrate and the processing liquid on the front surface of the substrate is solidified or cured to form a processing film on the front surface of the substrate;
an etching facilitating step in which the processing film is subjected to etching function developing processing to facilitate etching at a surface layer portion of the substrate by the processing film;
an etching reducing step in which the processing film is subjected to etching function eliminating processing to reduce the etching at the surface layer portion of the substrate by the processing film in a state that the processing film is kept on the substrate; and
a processing film removing step in which a removing liquid is supplied to the front surface of the processing film, thereby removing the processing film from the front surface of the substrate; wherein
the processing film removing step includes a peeling/removing step in which the processing film is peeled from the front surface of the substrate by the removing liquid to remove the processing film from the front surface of the substrate.

12. The substrate processing method according to claim 11, wherein
in the processing film forming step, the processing film is formed which contains a low solubility component in a solid state and a high solubility component in a solid state which is higher in solubility with respect to the removing liquid than the low solubility component, and
the peeling/removing step includes a step in which the high solubility component is selectively dissolved in the removing liquid, with the low solubility component kept in a solid state, thereby peeling the processing film from the front surface of the substrate.

13. The substrate processing method according to claim 11, wherein
  etching is made at the surface layer portion of the substrate to form etching residue which is held by the processing film, and
  the processing film removing step includes a step in which the etching residue is removed together with the processing film in a state that the etching residue is held by the processing film.

14. A substrate processing method comprising:
  a processing film forming step in which a processing liquid is supplied to a front surface of a substrate and the processing liquid on the front surface of the substrate is solidified or cured to form a processing film on the front surface of the substrate;
  an etching facilitating step in which the processing film is subjected to etching function developing processing to facilitate etching at a surface layer portion of the substrate by the processing film; and
  an etching reducing step in which the processing film is subjected to etching function eliminating processing to reduce the etching at the surface layer portion of the substrate by the processing film in a state that the processing film is kept on the substrate; wherein
  a trench in a circular shape in a plan view which depresses the front surface of the substrate is formed in the substrate,
  the trench has a bottom wall and a side wall which is connected to the bottom wall and extends in a depth direction of the trench,
  the side wall has a bottom wall side portion which is connected to the bottom wall and an opening side portion which demarcates an opening of the trench, and
  the processing film forming step includes a step of forming the processing film that covers the bottom wall side portion of the side wall and the bottom wall.

15. A substrate processing apparatus comprising:
  a processing liquid supplying unit that includes a processing liquid nozzle which supplies a processing liquid to a front surface of a substrate;
  a processing film forming unit by which the processing liquid on the front surface of the substrate is solidified or cured to form a processing film on the front surface of the substrate;
  a pH-adjusting liquid supplying unit that includes a pH-adjusting liquid nozzle which supplies to the front surface of the substrate a pH-adjusting liquid to adjust the pH in the processing film so as to be acidic or basic;
  a neutralizing liquid supplying unit that includes a neutralizing liquid nozzle which supplies to the front surface of the substrate a neutralizing liquid to bring the pH in the processing film close to neutral; and
  a controller which controls the processing liquid supplying unit, the processing film forming unit, the pH-adjusting liquid supplying unit, and the neutralizing liquid supplying unit; wherein
  the controller is programmed so as to execute a processing film forming step in which the processing liquid is supplied from the processing liquid supplying unit to the front surface of the substrate, and the processing liquid on the front surface of the substrate is solidified or cured by the processing film forming unit to form a processing film on the front surface of the substrate,
  an etching facilitating step in which the pH-adjusting liquid is supplied from the pH-adjusting liquid supplying unit to the front surface of the substrate to adjust the pH in the processing film so as to be acidic or basic, thereby facilitating etching at a surface layer portion of the substrate by the processing film, and an etching reducing step in which the neutralizing liquid is supplied from the neutralizing liquid supplying unit to the front surface of the substrate to bring the pH in the processing film closer to neutral than the pH in the processing film which has been adjusted by the pH-adjusting liquid, thereby reducing the etching at the surface layer portion of the substrate in a state that the processing film is kept on the substrate.

* * * * *